United States Patent
Yamaguchi et al.

(10) Patent No.: US 8,243,556 B2
(45) Date of Patent: Aug. 14, 2012

(54) DISPLAY PLATE FOR SOLAR CELL APPARATUS AND METHOD OF PRODUCING DISPLAY PLATE FOR SOLAR CELL APPARATUS

(75) Inventors: Katsuyuki Yamaguchi, Tokyo (JP); Seiichi Hiroe, Saitama (JP); Masaaki Satou, Yamanishi (JP); Motoyoshi Itou, Yamanashi (JP)

(73) Assignee: Citizen Holdings Co., Ltd., Tokyo (JP)

( * ) Notice: Subject to any disclaimer, the term of this patent is extended or adjusted under 35 U.S.C. 154(b) by 945 days.

(21) Appl. No.: 11/815,801

(22) PCT Filed: Jun. 24, 2005

(86) PCT No.: PCT/JP2005/011654
§ 371 (c)(1),
(2), (4) Date: Oct. 14, 2008

(87) PCT Pub. No.: WO2006/085397
PCT Pub. Date: Aug. 17, 2006

(65) Prior Publication Data
US 2009/0129210 A1   May 21, 2009

(30) Foreign Application Priority Data

Feb. 9, 2005 (JP) ................. 2005-033692
Mar. 29, 2005 (JP) ................. 2005-093626

(51) Int. Cl.
*G04B 1/00* (2006.01)
*G04B 19/06* (2006.01)

(52) U.S. Cl. ........................ 368/205; 368/232

(58) Field of Classification Search .......... 368/205, 368/228, 232; 136/243, 244, 246, 257
See application file for complete search history.

(56) References Cited

U.S. PATENT DOCUMENTS

| 5,703,837 | A | | 12/1997 | Umemoto et al. |
| 5,841,738 | A | * | 11/1998 | Kamei et al. ................. 368/205 |
| 5,880,796 | A | * | 3/1999 | Sonoda et al. ................. 349/61 |
| 5,912,064 | A | * | 6/1999 | Azuma et al. ................. 428/141 |

(Continued)

FOREIGN PATENT DOCUMENTS

JP 2-165093 A 6/1990
(Continued)

OTHER PUBLICATIONS

Abstract, WO 98/53373 published Nov. 26, 1998, entitled "Display Plate for Timepieces and Method for Fabricating the Same", applicants: Citizen Watch Co., Ltd. et al., equivalent to U.S. Pat. 6,538,959.

(Continued)

*Primary Examiner* — Vit Miska
(74) *Attorney, Agent, or Firm* — The Webb Law Firm

(57) ABSTRACT

A display plate for a solar cell device provided with a solar cell on the bottom surface side includes a light transmission substrate, a light transmission reflecting plate that is disposed on the bottom surface side of the light transmission substrate, and a decorative member that is disposed on the top surface side of the display plate. The light transmission substrate is provided with a reflecting surface on the bottom surface side or on the top and bottom surface sides of the light transmission substrate. The reflecting surface of the light transmission substrate is made of a prism reflecting surface.

56 Claims, 20 Drawing Sheets

U.S. PATENT DOCUMENTS

| | | | |
|---|---|---|---|
| 5,966,344 A | 10/1999 | Umemoto et al. | |
| 6,020,943 A * | 2/2000 | Sonoda et al. | 349/61 |
| 6,067,277 A * | 5/2000 | Dinger et al. | 368/205 |
| 6,466,522 B1 | 10/2002 | Yoshioka et al. | |
| 6,518,493 B1 * | 2/2003 | Murakami et al. | 136/257 |
| 6,538,959 B1 | 3/2003 | Yamaguchi et al. | |
| 6,753,068 B2 * | 6/2004 | Nakamura et al. | 428/172 |
| 2001/0004900 A1 * | 6/2001 | Ziegler et al. | 136/256 |
| 2002/0068148 A1 * | 6/2002 | Nakamura et al. | 428/131 |
| 2004/0032797 A1 * | 2/2004 | Sato et al. | 368/232 |

FOREIGN PATENT DOCUMENTS

| | | |
|---|---|---|
| JP | 7-244174 A | 9/1995 |
| JP | 9-243759 A | 9/1997 |
| JP | 9-269382 A | 10/1997 |
| JP | 10-213677 A | 8/1998 |
| JP | 11-326549 A | 11/1999 |
| JP | 2000-155181 A | 6/2000 |
| JP | 2000-329864 A | 11/2000 |
| JP | 2001-091669 A | 4/2001 |
| JP | 2002-148359 A | 5/2002 |
| JP | 2002-148368 A | 5/2002 |
| JP | 2002-267771 A | 9/2002 |
| JP | 2002-357673 A | 12/2002 |
| JP | 2003-110129 A | 4/2003 |
| JP | 2003-114285 A | 4/2003 |
| JP | 2003-287580 A | 10/2003 |
| JP | 2004-012405 A | 1/2004 |
| JP | 2004-198112 A | 7/2004 |

OTHER PUBLICATIONS

Abstract, WO 95/27234 published Oct. 12, 1995, entitled "Timepiece Having Light Transmission Type Display Plate", applicants: Citizen Watch Co., Ltd. et al., equivalent to U.S. Pat. No. 5,703,837.

Abstract, JP 63-140979 published Jun. 13, 1988, entitled "Manufacture of Dial for Timepiece", applicant: Seiko Epson Corp.

* cited by examiner (a)

(b)

(a)

(b)

(a)

(b)

(a)   (b)

(a)

(b)

(c)

(d)

Prior Art

DISPLAY PLATE FOR SOLAR CELL APPARATUS AND METHOD OF PRODUCING DISPLAY PLATE FOR SOLAR CELL APPARATUS

TECHNICAL FIELD

The present invention relates to, for instance, a display plate for a solar watch provided with a solar cell, a display plate for a solar cell device to be used for an electronic desk calculator provided with a solar cell, and a method of manufacturing the display plate for a solar cell device.

BACKGROUND ART

Conventionally, for a display plate for a solar cell device, for instance, a display plate (dial plate) for a solar watch provided with a solar cell, a light that has been received is transmitted, thereby inducing an electric power generation in a solar cell (solar battery) disposed on the bottom surface side of the display plate.

In many cases, a plastic material is conventionally used for a display plate for a solar watch requiring a transmission property of a light. More specifically, a plastic material has advantages such as obtaining a transmission property of a light, reducing a cost, and simplifying a decoration such as a painting and a printing.

In general, as shown in a plan view of FIG. 36, a solar cell that is used for a portable watch such as a wrist watch as a solar watch is formed in each of four faces (A1, A2, A3, and A4) that have been equally segmented and is disposed under a dial plate. A transmission light that has been transmitted to the dial plate is uniformly irradiated to each of the four faces (A1, A2, A3, and A4), thereby resulting in the highest electric power generation efficiency.

Consequently, it is necessary to design the dial plate that is disposed on the solar cells in such a manner that a uniform amount of lights are transmitted to each of sections corresponding to the four faces (A1, A2, A3, and A4) of the solar cells, that is to say, four faces that have been equally segmented by the 12-6 o'clock line and the 9-3 o'clock line.

In recent years, a photoelectric conversion efficiency of such a solar cell has been extremely high. There is provided a solar cell that can efficiently drive a portable watch even in the case in which a transmittance is 15% or 20%. Moreover, a solar cell can be miniaturized. A miniaturized solar cell of 10 mm×10 mm has been put on the market to obtain an electric power generation amount capable of driving the portable watch satisfactorily.

However, the solar cell has a generic deep violet color, and the cross lines for the segmentation into four equal divisions are extremely conspicuous due to a difference in materials. Consequently, the solar cell spoils the beauty of the portable watch. To soften the deep violet color or make the deep violet color invisible, many ideas have been carried out for the dial plate.

More specifically, the display plate must be at least semipermeable to enable the sunlight to be transmitted. Consequently, the material of the display plate is restricted. In addition, a color tone of deep violet that is intrinsic to the solar battery is visible through the display plate, thereby disadvantageously spoiling the appearance quality of the portable watch.

Therefore, Patent document 1 (WO98-53373) proposes a display plate in which a metal thin film is formed on the surface of a resin substrate to which a light can be transmitted as a display plate for a solar watch, thereby preventing a solar cell disposed under the display plate from being visible from the outside. The display plate has a light transmittance enabling an electric power generation in the solar cell.

Moreover, Patent document 2 (WO95-27234) proposes a display plate that displays a metal quality higher than that of the display plate for the solar watch in accordance with Patent document 1. For the display plate in accordance with Patent document 2, a metal plate in which a hole is formed in a decorative section such as a number is laminated on a light transmission display plate made of a resin or the like, and a solar cell disposed under the display plate is prevented from being visible from the outside. The display plate has a light transmittance enabling an electric power generation in the solar cell and displays a metal quality sense.

Furthermore, Patent document 3 (Japanese Patent Application Laid-Open Publication No. 9-243759) proposes a display plate for a solar watch in which a solar cell is prevented from being visible from the outside. The display plate has a light transmittance enabling an electric power generation in the solar cell and has an enlarged design variation.

FIG. 37 is a partially enlarged cross-sectional view showing the structure of a display plate for a watch provided with a solar cell in accordance with an embodiment disclosed in Patent document 3.

As shown in FIG. 37, a display plate B is disposed on the surface of a solar cell 311 in an integrating manner.

In this case, the display plate B is composed of a display substrate 312, a light storage fluorescent material layer 313, and a surface protection coating layer 314 in a laminating manner. Time characters 315 are then disposed on the display plate B.

The display substrate 312 is made of a transparent resin plate such as an acrylic resin and a polycarbonate resin. The light storage fluorescent material layer 313 is made of a paint film in which a light diffusing agent and a light storage fluorescent material of a light persistent type functioning as the coloring and light diffusing agent are mixed to a binder made of a transparent resin.

In this case, silicic acid powder, calcium carbonate powder, calcium phosphate powder, or the like is used as the light diffusing agent. The light diffusing agent with a particle diameter in the range of 5 to 15 μm to be mixed is in the range of 3 to 18 weight % to the powder of the light storage fluorescent material.

The light storage fluorescent material is a long light persistent type. The light storage fluorescent material to be compounded is 100 parts by weight to the range of 35 to 65 parts by weight of the binder.

Moreover, the surface protection coating layer 314 is formed using a transparent resin such as an acrylic resin, a urethane resin, and an epoxy resin by a method such as a printing to prevent the light storage fluorescent material from being deteriorated. The time characters 315 are formed by a printing or a mounting.

By such a configuration, by an operation of the light diffusing agent and the light storage fluorescent material of a light persistent type functioning as the coloring and light diffusing agent, a reflected light from the solar cell is absorbed by the light storage fluorescent material and diffused and dispersed by the light diffusing agent. Consequently, a deep violet color of the solar cell is extinguished to prevent a color tone of the solar cell from being visible.

Moreover, by such a configuration, a color tone (white color tone) of the light storage fluorescent material can be visible from an observer.

FIG. 38 is a partially enlarged cross-sectional view showing a display plate for a watch provided with a solar cell in accordance with another embodiment disclosed in Patent document 3 (Japanese Patent Application Laid-Open Publication No. 9-243759).

In this case, a display plate B is composed of a display substrate 322 made of a transparent resin containing a light diffusing agent, a reflecting layer 323 formed on the rear face of the display substrate 322, and a minute concave and convex portion 324 formed on a surface 322a of the display substrate 322.

The display substrate 322 is palletized by compounding the light diffusing agent in the range of 0.5 to 10 weight % to a transparent resin such as an acrylic resin and a polycarbonate resin and is formed by an injection molding method.

In this case, powder such as silicic acid powder, calcium carbonate powder, and calcium phosphate powder with a particle diameter in the range of 5 to 15 μm is used as the light diffusing agent.

The minute concave and convex portion 324 is formed by a transcription from a metal mold in a molding process, a machining, or a chemical processing. The reflecting layer 323 is a thin film layer having a semi-permeable reflecting function and is formed by a method such as an evaporation using a metal having a high reflectance.

By such a configuration, a part of incident lights from the upper face is transmitted to the display substrate 322 and the reflecting layer 323 and is irradiated to the solar cell 321. A part of lights reflected from the solar cell 321 is transmitted to the reflecting layer 323. However, a deep violet color of the solar cell 321 is extinguished by a light diffusing operation of the display substrate 322.

The diffusing agent and the reflecting layer 323 function as a coloring agent. Consequently, an opaque white tone and a color tone of the reflecting layer 323 are mixed, and a subtle color shade is visible from an observer.

For a display plate of a portable watch, a decorative member such as a seashell, a sapphire glass, and a ceramic is extensively used to improve a decorative effect and to create sophistication. Moreover, a pattern of concaves and convexes is formed on the decorative member to impart a stereoscopic sense to the decoration. Such a decorative display plate is used for not only a portable watch but also a decorative name plate, a decorative panel, and an electronic display apparatus.

Conventionally, a manufacturing method shown in FIG. 39 is adopted in general as a method of forming a stereoscopic concave and convex pattern on a brittle material such as a seashell, a glass, and a ceramic, since a machining such as a cutting processing and a press processing is difficult.

FIG. 39 is a flow sheet illustrating a conventional process for forming a stereoscopic concave and convex pattern on a decorative member.

As shown in FIG. 39, a numeral 401 represents a decorative member such as a seashell, a glass, and a ceramic.

First, as shown in FIG. 39(a), a resist film 402 is formed on the surface of the decorative member 401 by a method such as a printing.

Next, as shown in FIG. 39(b), the resist film 402 is partially removed by an exposure and a development using a photo mask to form a removed portion 402a.

The removed portion 402a is a portion for forming a concave portion of the concave and convex pattern. A surface 401b of the decorative member 401 is exposed to the removed portion 402a.

Next, as shown in FIG. 39(c), the exposed surface 401b of the decorative member 401 is etched by an etchant to a predetermined depth to form a concave portion 401c. The concave portion 401c configures the concave portion pattern of the concave and convex pattern.

Next, as shown in FIG. 39(d), the residual resist film 402 is separated. In the case in which the residual resist film 402 is separated, a surface of the decorative member 401 is exposed. The exposed surface 401d configures a convex portion pattern of the concave and convex pattern.

By the above manufacturing method, the stereoscopic concave and convex pattern can be formed.

Patent document 4 (Japanese Patent Application Laid-Open Publication No. 2-165093) discloses another forming method as a method of forming a concave and convex pattern.

The method of forming the concave and convex pattern disclosed in Patent document 4 is a method of forming the concave and convex pattern on a surface of a resin layer by making a metal mask in which a pattern has been formed to come into contact with the surface of the resin layer formed on a substrate and by blasting an organic solvent to the surface of the metal mask.

Problems to be Solved by the Invention

The display plate for a solar watch disclosed in the above Patent document 1 (WO98-53373) prevents the solar cell disposed under the display plate from being visible from the outside. However, the display plate displays a display decoration by a metal thin film, thereby resulting in no stereoscopic sense to the display decoration and resulting in an insufficient metal quality sense.

The display plate for a solar watch disclosed in the above Patent document 2 (WO95-27234) is provided with a stereoscopic sense and a metal quality sense. However, a solar cell disposed under the display plate cannot be completely prevented from being visible from the outside, thereby deteriorating the appearance quality as compared with a normal metal dial plate.

Moreover, the display plate for a solar watch disclosed in the above Patent documents 1 and 2 cannot enlarge a design variation due to such problems.

As shown in FIG. 37, as disclosed in Patent document 3 (Japanese Patent Application Laid-Open Publication No. 9-243759), the display plate for a solar watch in which the light storage fluorescent material layer 313 containing a diffusing agent and a light storage fluorescent material that have been both dispersed is formed on the transparent display substrate 312 can display a white color tone caused by the fluorescent material. However, the surface is not naturally white and not bright, thereby resulting in an insufficient white color and an insufficient vividness.

Moreover, in the display plate for a solar watch as shown in FIG. 33, the diffusing agent is dispersed in the display substrate 322, the minute concave and convex portion 324 is formed on the surface 322a of the display substrate 322, and the reflecting layer 323 is formed on the bottom surface of the display substrate 322. However, a thickness of the reflecting layer 323 to be formed is restricted since a desired transmittance must be ensured. Consequently, a color of the display plate is light, and the brightness and vividness of the surface of the display plate is not satisfactory.

Moreover, as shown in FIG. 39, in the case of a method of forming a stereoscopic concave and convex pattern on a decorative member such as a seashell, a glass, and a ceramic, the number of processes is enlarged and a fabrication time is lengthened. In addition, a quality yield is degraded and a manufacturing cost is increased disadvantageously.

Furthermore, a photograph exposure apparatus, separating apparatuses of many kinds, and separating solutions of many kinds are required, thereby increasing a facility cost disadvantageously.

Moreover, in the case of a method of forming a concave and convex pattern disclosed in Patent document 4 (Japanese Patent Application Laid-Open Publication No. 2-165093), a sharp concave and convex pattern cannot be displayed, thereby spoiling the appearance quality. In addition, an organic solvent is used, thereby degrading a working property.

The present invention was made in consideration of such conditions, and an object of the present invention is to provide, for instance, a display plate for a solar watch provided with a solar cell, a display plate for a solar cell device used for an electronic desk calculator provided with a solar cell, and a method of manufacturing the display plate for a solar cell device. Such a display plate can prevent the solar cell disposed under the display plate from being visible from the outside, and has a light transmittance enabling an electric power generation in the solar cell, a stereoscopic sense, and a metal quality sense. In addition, a design variation can be enlarged by freely combining patterns and colors, etc.

Another object of the present invention is to provide a display plate for a solar cell device and a method of manufacturing the display plate for a solar cell device, in which the surface of the display plate is made bright and vivid or is made vivid by increasing a white degree, or an exterior appearance beauty and a sense of values can be improved by increasing a degree of a color shade.

Another object of the present invention is to provide a display plate for a solar cell device and a method of manufacturing the display plate for a solar cell device. Such a display plate can prevent the solar cell disposed under the display plate from being visible from the outsider can effectively introduce a part of lights to the solar cell, and has a stereoscopic sense and a metal quality sense. In addition, a design variation can be enlarged by freely combining patterns and colors, etc.

Another object of the present invention is to provide a display plate for a solar cell device and a method of manufacturing the display plate for a solar cell device, in which a sharp and stereoscopic concave and convex pattern can be formed on a decorative member such as a seashell, a glass, and a ceramic by a simple method, and a design representation that has sophistication is enabled.

SUMMARY OF THE INVENTION

The present invention was made in order to solve the above problems of the conventional art and to achieve the object of the present invention. A display plate for a solar cell device in accordance with the present invention is a display plate for a solar cell device provided with a solar cell on the bottom surface side, comprising:
  a light transmission substrate;
  a light transmission reflecting plate that is disposed on the bottom surface side of the light transmission substrate; and
  a decorative member that is disposed on the top surface side of the display plate.

By such a configuration, a decorative member such as a colored film, an index (including a numeric character, a composition, a stone, an electroformed time character, a time character print, and a demarcation print), a name print, a luminous paint layer, a pattern (including a satin pattern), and a concave and a convex are formed on the top surface of a light transmission substrate made of a material such as a resin (including a molded plastic material), a glass, a sapphire glass, and a ceramic. Moreover, a light transmission reflecting plate made of a light semi-permeable reflecting plate or a reflection polarizing plate is formed on the bottom surface of the light transmission substrate. Consequently, a transmission light can be transmitted to the light transmission substrate and the light transmission reflecting plate. Therefore, a transmittance by which an electric power generation of a solar cell can be enabled can be obtained. Moreover, a light reflected from the light transmission reflecting plate is visible via the light transmission substrate and the decorative member from an observer by an operation of the reflecting plate. As a result, the observer can see a display plate for a solar cell device that has a stereoscopic sense and a metal quality sense and that is capable of enlarging a design variation by a free combination of patterns and colors, etc.

In this case, a material such as a resin (including a molded plastic material), a glass, a sapphire glass, and a ceramic can be used for the light transmission substrate.

Moreover, a colored film (such as a plating film, a printing film, and a coating film), a time character (such as a bonding composition, a print, and a stone), a name print, a luminous paint layer, a pattern (including a satin pattern), and a concave and a convex can be used for the decorative member.

Furthermore, a reflection polarizing plate or a light semi-permeable reflecting plate in which a metal evaporated film, a printing film, or a coating film has been formed on the surface of a substrate can be used for the light transmission reflecting plate.

The display plate for a solar cell device in accordance with the present invention is characterized in that a decorative member is disposed on the bottom surface side of the light transmission substrate.

That is to say, the decorative member as described above can be disposed on the bottom surface side of the light transmission substrate.

The display plate for a solar cell device in accordance with the present invention is characterized in that the light transmission substrate is provided with a reflecting surface on the bottom surface side or on the top and bottom surface sides of the light transmission substrate.

By such a configuration, in the case in which the light transmission substrate provided with a reflecting surface on the bottom surface side or on the top and bottom surface sides of the light transmission substrate is used, the reflecting surface has a function to scatter a light that has been irradiated to the light transmission substrate from the top surface side or the bottom surface side of the light transmission substrate. Consequently, the surface of the display plate is visible brightly and vividly.

Moreover, the reflecting surface can also be formed on the top surface side of the light transmission substrate as a manner of course.

The display plate for a solar cell device in accordance with the present invention is characterized in that the reflecting surface of the light transmission substrate is made of a prism reflecting surface.

The display plate for a solar cell device in accordance with the present invention is characterized in that the prism reflecting surface of the light transmission substrate is composed of at least one prism reflecting surface having a shape selected from a circle shape, a spiral shape, a linear shape, an intersecting shape, and a geometric shape.

By such a configuration, in the case in which the light transmission substrate provided with the prism reflecting surface is used, the prism reflecting surface has a function to refract, disperse, and scatter a light that has been irradiated to the light transmission substrate from the lower side of the prism surface.

In particular, in the case in which the prism surface is formed in a circle shape, a spiral shape, a linear shape, an intersecting shape, or a geometric shape, lights are dispersed in four ways, thereby causing a remarkable scattering.

For lights that have been irradiated to the light transmission reflecting plate, lights of approximately 50% are transmitted and lights of another 50% are reflected. Lights that have been transmitted to the light transmission substrate and the light transmission reflecting plate are irradiated to a solar cell. At this time, the incident lights are reduced in half by the light transmission reflecting plate. Some lights that have been irradiated to a solar cell are then absorbed, thereby further reducing lights to be reflected from the solar cell.

Moreover, approximately 50% of the reduced reflected lights are transmitted to the light transmission reflecting plate. Consequently, an amount of lights that return to the light transmission substrate side is extremely reduced. A small amount of lights that return to the light transmission substrate side is scattered via the prism surface. Therefore, a deep violet color of the solar cell is hardly visible.

Moreover, a reflected light with a high brightness can be obtained from the light transmission reflecting plate. Consequently, the surface of a dial plate is visible brightly and vividly.

Furthermore, for lights that have been irradiated to the light semi-permeable reflecting plate, lights of approximately 50% are transmitted to the light semi-permeable reflecting plate. Consequently, lights of an amount required for an electric power generation in the solar cell can be obtained, and the solar cell can generate an electric power by the lights of an amount required for an electric power generation, thereby reliably operating the solar cell device.

The display plate for a solar cell device in accordance with the present invention is characterized in that the reflecting surface of the light transmission substrate is made of a pattern in a concave and convex shape.

By such a configuration, the reflecting surface of the light transmission substrate is made of a pattern in a concave and convex shape, thereby improving a decorative effect of the display plate.

Moreover, various patterns such as a satin pattern, a lattice pattern, a stripe pattern, a pyramid form cut pattern, a stitch pattern, and a radial pattern can be selected as the concave and convex pattern, thereby enlarging a design variation.

Furthermore, a reflected light from the solar cell is scattered by the concave and convex pattern, thereby extinguishing a color tone of the solar cell to prevent the solar cell from being visible.

The display plate for a solar cell device in accordance with the present invention is characterized in that a pattern member provided with a convex and a concave that are composed of a convex portion and a concave portion formed by digging is disposed on the top surface of the light transmission substrate.

By such a configuration, a pattern member provided with a convex and a concave that are composed of a convex portion and a concave portion formed using a digging method such as an etching, a machining, and a laser beam machining is disposed on the top surface of the light transmission substrate. Consequently, a concave portion is chipped to be formed by partially digging the pattern member using a mask member, and a portion that is not dug is protruded to form a convex portion. The concave portion and the convex portion configure concaves and convexes.

Consequently, the concave and convex of the pattern member in accordance with the present invention can be formed in only two processes composed of a printing process of the mask member and a digging process such as an etching, a machining, and a laser beam machining of the pattern member, thereby reducing manufacturing processes. In addition, the concave and convex can be fabricated by an easy operating method, thereby extremely reducing a manufacturing cost and a facility cost.

Moreover, such concaves and convexes are formed, thereby obtaining a decoration having different quality senses and thereby obtaining abundant design variations.

The display plate for a solar cell device in accordance with the present invention is characterized in that a convex portion forming layer is disposed on the surface of the convex portion of the pattern member.

The display plate for a solar cell device in accordance with the present invention is characterized in that the convex portion forming layer is made of at least one convex portion forming layer that is selected from a transparent film and a colored film.

The display plate for a solar cell device in accordance with the present invention is characterized in that the convex portion forming layer has a thickness of at least 8 μm.

By such a configuration, for instance, a transparent film or a colored film is formed partially on the pattern member as a mask member, and a decorative member of a section in which a transparent film or a colored film is not formed is dug and chipped by a method such as an etching, a machining, and a laser beam machining. As a result, a section in which a transparent film or a colored film has been formed is protruded to form a convex portion, and a section other than a transparent film or a colored film is chipped by an etching to form a concave portion. The concave portion and the convex portion configure concaves and convexes.

Consequently, the concave and convex of the pattern member in accordance with the present invention can be formed in only two processes composed of a printing process of a transparent film or a colored film as a mask member and a digging process such as an etching, a machining, and a laser beam machining of the pattern member, thereby reducing manufacturing processes. In addition, the concave and convex can be fabricated by an easy operating method, thereby extremely reducing a manufacturing cost and a facility cost.

Moreover, the concave and convex are formed as described above, and a convex portion forming layer is disposed on the surface of the convex portion of the pattern member. Therefore, a depth (a difference of elevation) of the concave portion and the convex portion is further increased, thereby obtaining a decoration having different quality senses and thereby obtaining abundant design variations.

For the display plate, in the case in which the convex portion is formed by using a transparent film or a colored film, the quality senses of a color and a gloss property of the surface of the pattern member appear via the transparent film or the colored film.

In the case in which the transparent film is used, the quality sense of the identical color appears for the concave portion and the convex portion. In the case in which the colored film that has a light transmission property is used, two kinds of colors subtly different can be obtained, and a subtle quality sense appears. In the case in which the colored film that does not have a light transmission property is used, a decoration having different quality senses in which a color of the colored film and a color of the pattern member are mixed can be obtained, thereby obtaining abundant design variations.

In the case in which the convex portion forming layer, that is, the transparent film or the colored film is formed to have a thickness of at least 8 μm, an edge portion of a paint film (an end of a rising portion of a paint film) is rounded, thereby obtaining a paint film in a round helmet shape. In the case in which such a round helmet shape appears, the convex portion forming layer can be in a hemispherical lens shape. By the lens effect, the convex portion forming layer is visually thick, and has a great stereoscopic sense.

Consequently, by the above lens effect of the convex portion forming layer, the convex portion is visually thicker than the actual size, and has a greater stereoscopic sense visually. Even in the case in which a depth of a concave portion formed by the digging process such as an etching, a machining, and a laser beam machining is small, the concave and convex portion can have a great stereoscopic sense visually.

The display plate for a solar cell device in accordance with the present invention is characterized in that the pattern member is a pattern member provided with a convex and a concave that are composed of a convex portion and a concave portion formed by digging a seashell, a glass, or a ceramic.

In the case in which the pattern member is a pattern member provided with a convex and a concave that are composed of a convex portion and a concave portion formed by digging a seashell, a glass, or a ceramic using a digging process such as an etching, a machining, and a laser beam machining, the concave and convex resulted by the members display a subtle stereoscopic sense, and abundant design variations can be obtained.

The display plate for a solar cell device in accordance with the present invention is characterized in that the concave and convex of the pattern member form a pattern.

In the case in which the concave and convex of the pattern member form a pattern as described above, the display plate becomes more gorgeous and has an improved decorative effect by the concave and convex pattern of the pattern member, thereby obtaining abundant design variations.

The display plate for a solar cell device in accordance with the present invention is characterized in that the concave portion of the pattern member is formed by penetrating through the pattern member.

In the case in which the concave portion of the pattern member is formed by penetrating through the pattern member as described above, a base color of the light transmission substrate is visible through the penetrated section. Consequently, a combination of a color of the pattern member, the concave and convex pattern, and a base color of the light transmission substrate (a reflecting film) can create a new design, thereby enlarging a design variation.

The display plate for a solar cell device in accordance with the present invention is characterized in that the pattern of the concave and convex portions of the pattern member is a concave and convex pattern containing at least two kinds of concave portions having a different depth.

By such a configuration, in the case in which a shallow concave portion and a deep concave portion have a depth different from each other in the concave and convex pattern, the concave and convex pattern subtly change by an operation of a shadow and the strong and weak reflected lights, thereby further enlarging a design variation.

The display plate for a solar cell device in accordance with the present invention is characterized in that the pattern member has a light transmission property.

In the case in which the pattern member has a light transmission property as described above, a new decoration and a new design variation can be created by a combination with a base color of the light transmission substrate.

The display plate for a solar cell device in accordance with the present invention is characterized in that the pattern member is provided with a convex and a concave that are composed of a convex portion and a concave portion formed by digging on the bottom surface side.

The display plate for a solar cell device in accordance with the present invention is characterized in that the concave and convex on the bottom surface side of the pattern member form a pattern.

As described above, the concave and convex pattern formed on the bottom surface (rear face) of the pattern member is visible by the light transmission reflecting plate formed on the bottom surface of the light transmission substrate. A combination of the pattern of the concave portion and the convex portion on the top surface side and the concave and convex pattern on the rear face side can improve a decorative effect and a stereoscopic sense (like watermark engraving), thereby obtaining a new design variation.

Moreover, in the case in which both the pattern member and the light transmission substrate have a light transmission property, a solar cell can be disposed on the bottom surface side of the display plate, and the display plate can be used as a display plate for a solar cell. Consequently, as a display plate for a solar cell device, in particular, as a display plate for a solar watch, a decorative effect can be improved and sophistication can appear.

The display plate for a solar cell device in accordance with the present invention is characterized in that the pattern member is disposed in a concave portion formed on a part of the surface of the light transmission substrate.

In the case in which the pattern member is disposed in a concave portion formed on a part of the surface of the light transmission substrate as described above, the light transmission substrate and the pattern member that are made of a material different from each other are simultaneously visible, causing a new design and a new decoration. As a result, a design variation can be enlarged.

The display plate for a solar cell device in accordance with the present invention is characterized in that a reflecting film is disposed in the concave portion formed on a part of the surface of the light transmission substrate.

In the case in which the reflecting film is disposed in the concave portion formed on a part of the surface of the light transmission substrate as described above, a color and a gorgeousness of the pattern member and the concave and convex pattern are accentuated by a light reflected from the reflecting film, thereby improving a decorative effect and thereby enlarging a design variation.

The display plate for a solar cell device in accordance with the present invention is characterized in that a metal plate that is provided with an opening portion is disposed on the top or bottom surface of the light transmission substrate.

By such a configuration, the display plate has a three layer structure in which the light transmission substrate, the metal plate that is provided with an opening portion (having a light transmission property), and the light transmission reflecting plate are laminated. Consequently, lights of an amount required for an electric power generation in the solar cell can be obtained through the opening portion of the metal plate, and the solar cell can generate an electric power by the lights of an amount required for an electric power generation, thereby reliably operating the solar cell device.

Moreover, since the light transmission reflecting plate is disposed in the lowest layer, reflected lights from the solar cell is less, and a deep violet color of the solar cell is hardly visible from the comparatively small opening portion of the metal plate.

Furthermore, the metal plate enables the display plate to display a satisfactory metal sense.

In the case in which the light transmission substrate is disposed on the metal plate and a decoration is applied to the surface of the metal plate, a dignity accompanied by a sinking sense appears in the decoration, thereby imparting sophistication. Moreover, a design variation can be enlarged by applying many kinds of decorations to the metal plate.

The display plate for a solar cell device in accordance with the present invention is characterized in that the opening portion of the metal plate is composed of at least one kind of an opening portion made of one selected from a pattern, a numeral, a character, and a mark.

Since the opening portion of the metal plate is made of a pattern, a numeral, a character, or a mark as described above, a display decoration involving an improved decorative effect and an improved functional property can be obtained.

The display plate for a solar cell device in accordance with the present invention is characterized in that at least one kind of a decoration made of one selected from a pattern, a numeral, a character, and a mark is formed on the surface of the metal plate.

Since a decoration made of a pattern, a numeral, a character, or a mark is applied to the surface of the metal plate as described above, a decorative effect and a functional property can be further improved, and a design variation can be enlarged.

The display plate for a solar cell device in accordance with the present invention is characterized in that a light diffusing layer is disposed on the top or bottom surface side or both the top and bottom surface sides of the metal plate.

In the case in which the light diffusing layer is disposed on the top or bottom surface side or both the top and bottom surface sides of the metal plate as described above, a light reflected from the solar cell is diffused to make a deep violet color of the solar cell to be not conspicuous. In addition, the light reflected from the solar cell is diffused again to reflect the light toward the solar cell, and an incident light to the solar cell is diffused to enlarge an incidence area, thereby effectively introducing the light to the solar cell and thereby reliably operating the solar cell device.

The display plate for a solar cell device in accordance with the present invention is characterized in that at least one kind of a processing layer made of one selected from a printing film, a coating film, and a metal film is disposed on the top or bottom surface side or both the top and bottom surface sides of the metal plate.

In the case in which a processing layer made of a printing film formed by a printing method such as a screen printing using an ink, a coating film formed by a coating method using a coating material, or a metal film is disposed on the top or bottom surface side or both the top and bottom surface sides of the metal plate as described above, a decorative effect and a functional property can be further improved by such a finishing processing layer, and a design variation can be enlarged.

The display plate for a solar cell device in accordance with the present invention is characterized in that
  a concave and a convex are formed on the top or bottom surface or both the top and bottom surfaces of the light transmission substrate,
  a covering layer is formed on the surface of the concave portion of the concave and convex, and
  the convex portion is formed to be almost flat.

By such a configuration, a concave and a convex are formed on the light transmission substrate, a covering layer is formed on the surface of the concave portion, and the convex portion is formed to be almost flat. Consequently, a subtle pattern and a shadow caused by a depth are generated by the covering layer formed on the concave portion and the convex portion, thereby displaying a new decorative effect, a new gorgeousness, and new sophistication, and thereby enlarging a design variation.

Moreover, even in the case in which the covering layer formed on the surface of the concave portion is made of a material having a low light transmission property or having no light transmission property, the covering layer is not formed on the almost flat section of the convex portion. Consequently, lights of an amount required for an electric power generation in the solar cell can be obtained through the convex portion, and the solar cell can generate an electric power by the lights of an amount required for an electric power generation, thereby reliably operating the solar cell device.

Moreover, since the light transmission reflecting plate is disposed in the lowest layer, reflected lights from the solar cell is less, and a deep violet color tone of the solar cell is hardly visible from the comparatively small convex portion of the light transmission substrate.

The display plate for a solar cell device in accordance with the present invention is characterized in that the covering layer is made of at least one kind of a covering layer selected from a printing film, a coating film, and a metal film.

In the case in which the covering layer formed on the surface of the concave portion of the light transmission substrate is made of a printing film formed by a printing method such as a screen printing using an ink, a coating film formed by a coating method using a coating material, or a metal film as described above, a decorative effect and a functional property can be further improved by such a covering layer, and a design variation can be enlarged.

The display plate for a solar cell device in accordance with the present invention is characterized in that the concave and convex of the light transmission substrate form a pattern.

As described above, the concave and convex of the light transmission substrate form a pattern, and a decoration is formed by the concave and convex pattern. As a result, a decorative effect and a functional property can be further improved, and a design variation can be enlarged.

The display plate for a solar cell device in accordance with the present invention is characterized in that the covering layer is a covering layer that remains only on the surface of the concave portion by removing a covering layer formed on the surface of the convex portion from the surface of the convex portion of the concave and convex of the light transmission substrate after forming at least one kind of a covering layer selected from a printing film, a coating film, and a metal film on the concave and convex surface of the light transmission substrate.

Consequently, the concave and convex of the light transmission substrate in accordance with the present invention can be formed in only two processes composed of a forming process of a printing film, a coating film, or a metal film by an evaporation, a sputtering, a coating formation, or a coating, and a removing process of the covering layer from on the surface of the convex portion by a polishing or the like, thereby reducing manufacturing processes. In addition, the concave and convex can be fabricated by an easy operating method, thereby extremely reducing a manufacturing cost and a facility cost.

Moreover, the convex portion of the light transmission substrate and the covering layer formed on the concave portion are made of a material different from each other, thereby obtaining decorations having different quality senses for the concave portion and the convex portion and thereby obtaining abundant design variations.

The display plate for a solar cell device in accordance with the present invention is characterized in that the decorative member is made of at least one kind of a decorative member selected from a colored film, an index, a name print, a luminous paint layer, a pattern, and a concave and a convex.

By such a configuration, since the decorative member is made of a colored film, an index (including a numeric character, a composition, a stone, an electroformed time character, a time character print, and a demarcation print), a name print, a luminous paint layer, a pattern (including a satin pattern), and a concave and a convex, a decorative effect and a functional property can be further improved, and a design variation can be enlarged.

Moreover, a colored film (such as a plating film, a printing film, and a coating film), a time character (such as a bonding composition, a print, and a stone), a name print, a luminous paint layer, a pattern (including a satin pattern), and a concave and a convex can be used for the decorative member.

The display plate for a solar cell device in accordance with the present invention is characterized in that at least one kind of a decoration made of one selected from a pattern, a numeral, a character, and a mark is formed on the top surface of the light transmission substrate.

In the case in which a decoration made of a pattern, a numeral, a character, or a mark is formed on the top surface of the light transmission substrate as described above, a decorative effect and a functional property can be further improved by the decoration of the light transmission substrate, and a design variation can be enlarged.

The display plate for a solar cell device in accordance with the present invention is characterized in that the light transmission substrate is a light transmission substrate that has been colored.

In the case in which the light transmission substrate is a light transmission substrate that has been colored as described above, the display plate for a solar cell device can be colored. As a result, a display decoration involving an improved decorative effect and an improved functional property can be obtained. In addition, a deep violet color of the solar cell can be almost invisible by such a coloring.

The display plate for a solar cell device in accordance with the present invention is characterized in that the colored light transmission substrate is a light transmission substrate that has been colored by containing a dye or a pigment in the light transmission substrate.

By such a configuration, for instance, the light transmission substrate can be easily colored by mixing a dye or a pigment in a resin that configures the light transmission substrate and by an injection molding method. As a result, a decorative effect and a functional property can be improved, and a design variation can be enlarged.

The display plate for a solar cell device in accordance with the present invention is characterized in that the colored light transmission substrate is a light transmission substrate that has been colored by forming a colored layer on the top or bottom surface or both the top and bottom surfaces of the light transmission substrate.

By such a configuration, the light transmission substrate can be easily colored by forming a colored layer on the top or bottom surface or both the top and bottom surfaces of the light transmission substrate. As a result, a decorative effect and a functional property can be improved, and a design variation can be enlarged.

The display plate for a solar cell device in accordance with the present invention is characterized in that the colored layer of the light transmission substrate that has been colored is made of at least one kind of a colored layer selected from a printing film, a coating film, and a metal film.

As described above, the light transmission substrate can be easily colored by forming a colored layer made of a printing film formed by a printing method such as a screen printing using an ink, a coating film formed by a coating method using a coating material, or a metal film, on the top or bottom surface or both the top and bottom surfaces of the light transmission substrate. As a result, a decorative effect and a functional property can be improved, and a design variation can be enlarged.

The display plate for a solar cell device in accordance with the present invention is characterized in that the light transmission substrate is composed of at least one light semi-permeable substrate made of one selected from a resin, a glass, a sapphire glass, and a ceramic.

In the case in which the light transmission substrate is made of a resin (including a molded plastic material), a glass, a sapphire glass, or a ceramic as described above, a decorative effect and a functional property can be improved for the display plate for a solar cell device, and a design variation can be enlarged.

The display plate for a solar cell device in accordance with the present invention is characterized in that the light transmission reflecting plate is a light semi-permeable reflecting plate.

By such a configuration, the reflecting surface has a function to scatter a light that has been irradiated to the light transmission substrate. Consequently, the surface of the display plate is visible brightly and vividly.

More specifically, for lights that have been irradiated to the light transmission reflecting plate, lights of approximately 50% are transmitted and lights of another 50% are reflected. Lights that have been transmitted to the light transmission substrate and the light semi-permeable reflecting plate are irradiated to a solar cell. At this time, the incident lights are reduced in half by the light semi-permeable reflecting plate. Some lights that have been irradiated to a solar cell are then absorbed, thereby further reducing lights to be reflected from the solar cell.

Moreover, approximately 50% of the reduced reflected lights are transmitted to the light semi-permeable reflecting plate. Consequently, an amount of lights that return to the light transmission substrate side is extremely reduced. Therefore, a deep violet color of the solar cell is hardly visible.

Furthermore, a reflected light with a high brightness can be obtained from the light transmission reflecting plate. Consequently, the surface of a dial plate is visible brightly and vividly.

Furthermore, for lights that have been irradiated to the light semi-permeable reflecting plate, lights of approximately 50% are transmitted to the light semi-permeable reflecting plate. Consequently, lights of an amount required for an electric power generation in the solar cell can be obtained, and the solar cell can generate an electric power by the lights of an amount required for an electric power generation, thereby reliably operating the solar cell device.

The display plate for a solar cell device in accordance with the present invention is characterized in that the light semi-permeable reflecting plate is made by forming a light semi-permeable film on the surface of the substrate.

The display plate for a solar cell device in accordance with the present invention is characterized in that the light semi-permeable film of the light semi-permeable reflecting plate is made of at least one kind of a light semi-permeable film selected from a metal evaporated film, a printing film, and a coating film.

By such a configuration, the light semi-permeable reflecting plate can be configured by forming the light semi-permeable film made of a metal evaporated film, a printing film, or a coating film on the surface of the substrate, thereby simplifying a production and thereby reducing a cost.

The display plate for a solar cell device in accordance with the present invention is characterized in that the light transmission reflecting plate is a reflection polarizing plate.

In the case in which a reflection polarizing plate is used as a light transmission reflecting plate, the reflection polarizing plate is provided with a reflection axis and a transmission ease axis. The reflection polarizing plate has characteristic properties in which a linearly polarized light component provided with a vibration plane parallel to the reflection axis is reflected and a linearly polarized light component provided with a vibration plane parallel to the transmission ease axis is transmitted.

Consequently, for lights that have been irradiated to the reflection polarizing plate, lights of approximately 50% are transmitted and lights of another approximately 50% are reflected. The reflected color from the reflection polarizing plate is a color such as silver or gold, and the brightness is extremely high.

Lights that have been transmitted to the light transmission substrate and the reflection polarizing plate are irradiated to a solar cell. At this time, the incident lights are reduced in half by the reflection polarizing plate. Some lights that have been irradiated to a solar cell are then absorbed, thereby further reducing lights to be reflected from the solar cell.

Moreover, approximately 50% of the reduced reflected lights are transmitted to the reflection polarizing plate. Consequently, an amount of lights that return to the light transmission substrate side is extremely reduced. A small amount of lights that return to the light transmission substrate side is scattered via the prism surface. Therefore, a deep violet color of the solar cell is hardly visible.

Furthermore, a reflected light with a high brightness can be obtained from the reflection polarizing plate. Consequently, the surface of a dial plate is visible brightly and vividly. In particular, in the case in which the reflection polarizing plate capable of obtaining a silver color is used, a state in which a white color tone is increased can be obtained.

The display plate for a solar cell device in accordance with the present invention is characterized in that the reflection polarizing plate is a reflection polarizing plate that has been colored.

By such a configuration, the display plate for a solar cell device can be easily colored by using the reflection polarizing plate that has been colored. As a result, a decorative effect and a functional property can be improved, and a design variation can be enlarged.

The display plate for a solar cell device in accordance with the present invention is characterized in that the colored reflection polarizing plate is a light transmission substrate that has been colored by forming a colored layer on the top or bottom surface or both the top and bottom surfaces of the reflection polarizing plate.

By such a configuration, the reflection polarizing plate can be easily colored by forming a colored layer on the top or bottom surface or both the top and bottom surfaces of the reflection polarizing plate. As a result, a decorative effect and a functional property can be improved, and a design variation can be enlarged.

The display plate for a solar cell device in accordance with the present invention is characterized in that the colored layer of the reflection polarizing plate that has been colored is made of at least one kind of a colored layer selected from a printing film, a coating film, and a metal film.

As described above, the reflection polarizing plate can be easily colored by forming a colored layer made of a printing film formed by a printing method such as a screen printing using an ink, a coating film formed by a coating method using a coating material, or a metal film, on the top or bottom surface or both the top and bottom surfaces of the reflection polarizing plate. As a result, a decorative effect and a functional property can be improved, and a design variation can be enlarged.

A display plate for a solar watch in accordance with the present invention is characterized in that the display plate for a solar cell device as defined in any one of above descriptions is a display plate for a solar watch.

By such a configuration, there can be provided the display plate for a solar watch that has a stereoscopic sense and a metal quality sense, and much gorgeousness and much sophistication, in which patterns and colors are freely combined, a decorative effect and a functional property can be improved, and a design variation can be enlarged.

A solar watch in accordance with the present invention is characterized in that the display plate for a solar cell device as defined in any one of above descriptions is used for a display plate for a solar watch.

Consequently, there can be provided the solar watch that has a stereoscopic sense and a metal quality sense, and much gorgeousness and much sophistication, in which patterns and colors are freely combined, a decorative effect and a functional property can be improved, and a design variation can be enlarged.

A method of manufacturing a display plate for a solar cell device provided with a solar cell on the bottom surface side in accordance with the present invention is characterized by comprising the steps of:

preparing a light transmission substrate;

forming a light transmission reflecting plate on the bottom surface side of the light transmission substrate; and forming a decorative member on the top surface side of the display plate.

By such a configuration, a light transmission reflecting plate made of a light semi-permeable reflecting plate or a reflection polarizing plate is formed on the bottom surface of the light transmission substrate made of a material such as a resin (including a molded plastic material), a glass, a sapphire glass, and a ceramic. Moreover, a decorative member such as a colored film, an index (including a numeric character, a composition, a stone, an electroformed time character, a time character print, and a demarcation print), a name print, a luminous paint layer, a pattern (including a satin pattern), and a concave and a convex are formed on the top surface of a light transmission substrate. As a result, the display plate for a solar cell device can be easily manufactured.

Moreover, for the display plate for a solar cell device manufactured as described above, a transmission light can be transmitted to the light transmission substrate and the light transmission reflecting plate. Therefore, a transmittance by which an electric power generation of a solar cell can be enabled can be obtained.

Furthermore, a light reflected from the light transmission reflecting plate is visible via the light transmission substrate and the decorative member from an observer by an operation of the reflecting plate. As a result, the observer can see a display plate for a solar cell device that has a stereoscopic sense and a metal quality sense and that is capable of enlarging a design variation by a free combination of patterns and colors, etc.

The method of manufacturing the display plate for a solar cell device in accordance with the present invention is characterized by further comprising the step of forming a decorative member on the bottom surface side of the light transmission substrate.

That is to say, the above decorative member can be disposed on the bottom surface side of the light transmission substrate.

The method of manufacturing the display plate for a solar cell device in accordance with the present invention is characterized in that the step of preparing the light transmission substrate is a step of preparing a light transmission substrate provided with a reflecting surface on the bottom surface side or on the top and bottom surface sides of the light transmission substrate.

By such a configuration, in the case in which the light transmission substrate provided with a reflecting surface on the bottom surface side or on the top and bottom surface sides of the light transmission substrate is used, the reflecting surface has a function to scatter a light that has been irradiated to the light transmission substrate from the top surface side or the bottom surface side of the light transmission substrate. Consequently, the surface of the display plate is visible brightly and vividly.

Moreover, the reflecting surface can also be formed on the top surface side of the light transmission substrate as a manner of course.

The method of manufacturing the display plate for a solar cell device in accordance with the present invention is characterized in that the reflecting surface of the light transmission substrate is made of a prism reflecting surface.

The method of manufacturing the display plate for a solar cell device in accordance with the present invention is characterized in that the prism reflecting surface of the light transmission substrate is composed of at least one prism reflecting surface having a shape selected from a circle shaper a spiral shape, a linear shape, an intersecting shape, and a geometric shape.

By such a configuration, in the case in which the light transmission substrate provided with the prism reflecting surface is used, the prism reflecting surface has a function to refract, disperse, and scatter a light that has been irradiated to the light transmission substrate from the lower side of the prism surface.

In particular, in the case in which the prism surface is formed in a circle shape, a spiral shape, a linear shape, an intersecting shape, or a geometric shape, lights are dispersed in four ways, thereby causing a remarkable scattering.

For lights that have been irradiated to the light transmission reflecting plate, lights of approximately 50% are transmitted and lights of another 50% are reflected. Lights that have been transmitted to the light transmission substrate and the light transmission reflecting plate are irradiated to a solar cell. At this time, the incident lights are reduced in half by the light transmission reflecting plate. Some lights that have been irradiated to a solar cell are then absorbed, thereby further reducing lights to be reflected from the solar cell.

Moreover, approximately 50% of the reduced reflected lights are transmitted to the light transmission reflecting plate. Consequently, an amount of lights that return to the light transmission substrate side is extremely reduced. A small amount of lights that return to the light transmission substrate side is scattered via the prism surface. Therefore, a deep violet color of the solar cell is hardly visible.

Moreover, a reflected light with a high brightness can be obtained from the light transmission reflecting plate. Consequently, the surface of a dial plate is visible brightly and vividly.

Furthermore, for lights that have been irradiated to the light semi-permeable reflecting plate, lights of approximately 50% are transmitted to the light semi-permeable reflecting plate. Consequently, lights of an amount required for an electric power generation in the solar cell can be obtained, and the solar cell can generate an electric power by the lights of an amount required for an electric power generation, thereby reliably operating the solar cell device.

The method of manufacturing the display plate for a solar cell device in accordance with the present invention is characterized in that the reflecting surface of the light transmission substrate is made of a pattern in a concave and convex shape.

By such a configuration, the reflecting surface of the light transmission substrate is made of a pattern in a concave and convex shape, thereby improving a decorative effect of the display plate.

Moreover, various patterns such as a satin pattern, a lattice pattern, a stripe pattern, a pyramid form cut pattern, a stitch pattern, and a radial pattern can be selected as the concave and convex pattern, thereby enlarging a design variation.

Furthermore, a reflected light from the solar cell is scattered by the concave and convex pattern, thereby extinguishing a color tone of the solar cell to prevent the solar cell from being visible.

The method of manufacturing the display plate for a solar cell device in accordance with the present invention is characterized by further comprising the step of disposing a pattern member provided with a convex and a concave that are composed of a convex portion and a concave portion formed by digging on the top surface of the light transmission substrate.

By such a configuration, a pattern member provided with a convex and a concave that are composed of a convex portion and a concave portion formed using a digging method such as an etching, a machining, and a laser beam machining is disposed on the top surface of the light transmission substrate. Consequently, a concave portion is chipped to be formed by partially etching the pattern member using a mask member, and a portion that is not dug is protruded to form a convex portion. The concave portion and the convex portion configure concaves and convexes.

Consequently, the concave and convex of the pattern member in accordance with the present invention can be formed in only two processes composed of a printing process of the mask member and a digging process such as an etching, a machining, and a laser beam machining of the pattern member, thereby reducing manufacturing processes. In addition, the concave and convex can be fabricated by an easy operating method, thereby extremely reducing a manufacturing cost and a facility cost.

Moreover, such concaves and convexes are formed, thereby obtaining a decoration having different quality senses and thereby obtaining abundant design variations.

The method of manufacturing the display plate for a solar cell device in accordance with the present invention is characterized in that the step of disposing the pattern member includes the step of bonding the light transmission substrate and the pattern member to each other and the step of forming a transparent film or a colored film on the top surface of the pattern member.

The method of manufacturing the display plate for a solar cell device in accordance with the present invention is characterized by further comprising the step of digging and removing a section of a pattern member on which the transparent film or the colored film is not formed.

The method of manufacturing the display plate for a solar cell device in accordance with the present invention is characterized in that the step of bonding the light transmission substrate and the pattern member to each other is carried out after the step of forming the transparent film or the colored film on the top surface of the pattern member.

By such a configuration, the light transmission substrate and the pattern member are bonded to each other, the transparent film or the colored film is formed on the top surface of the pattern member, the pattern member is partially dug by a method such as an etching, a machining, and a laser beam machining. Consequently, a concave portion is chipped to be formed, and a portion that is not dug is protruded to form a convex portion. The concave portion and the convex portion configure concaves and convexes.

Consequently, the concave and convex of the pattern member in accordance with the present invention can be formed in only two processes composed of a printing process of a transparent film or a colored film as a mask member and a digging process such as an etching, a machining, and a laser beam machining of the pattern member, thereby reducing manufacturing processes. In addition, the concave and convex can be fabricated by an easy operating method, thereby extremely reducing a manufacturing cost and a facility cost.

Moreover, the concave and convex are formed as described above, and a convex portion forming layer is disposed on the surface of the convex portion of the pattern member. Therefore, a depth (a difference of elevation) of the concave portion and the convex portion is further increased, thereby obtaining a decoration having different quality senses and thereby obtaining abundant design variations.

For the display plate, in the case in which the convex portion is formed by using a transparent film or a colored film, the quality senses of a color and a gloss property of the surface of the pattern member appear via the transparent film or the colored film.

In the case in which the transparent film is used, the quality sense of the identical color appears for the concave portion and the convex portion. In the case in which the colored film that has a light transmission property is used, two kinds of colors subtly different can be obtained, and a subtle quality sense appears. In the case in which the colored film that does not have a light transmission property is used, a decoration having different quality senses in which a color of the colored film and a color of the pattern member are mixed can be obtained, thereby obtaining abundant design variations.

The method of manufacturing the display plate for a solar cell device in accordance with the present invention is characterized in that the pattern member is a pattern member provided with a convex and a concave that are composed of a convex portion and a concave portion formed by digging a seashell, a glass, or a ceramic.

In the case in which the pattern member is a pattern member provided with a convex and a concave that are composed of a convex portion and a concave portion formed by digging a seashell, a glass, or a ceramic using a digging process such as an etching, a machining, and a laser beam machining, the concave and convex resulted by the members display a subtle stereoscopic sense, and abundant design variations can be obtained.

The method of manufacturing the display plate for a solar cell device in accordance with the present invention is characterized by further comprising the step of disposing a metal plate, provided with an opening portion, on the top or bottom surface of the light transmission substrate.

By such a configuration, the display plate has a three layer structure in which the light transmission substrate, the metal plate that is provided with an opening portion (having a light transmission property), and the light transmission reflecting plate are laminated. Consequently, lights of an amount required for an electric power generation in the solar cell can be obtained through the opening portion of the metal plate, and the solar cell can generate an electric power by the lights of an amount required for an electric power generation, thereby reliably operating the solar cell device.

Moreover, since the light transmission reflecting plate is disposed in the lowest layer, reflected lights from the solar cell is less, and a deep violet color of the solar cell is hardly visible from the comparatively small opening portion of the metal plate.

Furthermore, the metal plate enables the display plate to display a satisfactory metal sense.

In the case in which the light transmission substrate is disposed on the metal plate and a decoration is applied to the surface of the metal plate, a dignity accompanied by a sinking sense appears in the decoration, thereby imparting sophistication. Moreover, a design variation can be enlarged by applying many kinds of decorations to the metal plate.

The method of manufacturing the display plate for a solar cell device in accordance with the present invention is characterized by further comprising the steps of:
  forming a concave and a convex on the top or bottom surface or both the top and bottom surfaces of the light transmission substrate,
  forming a covering layer on the surface of the concave portion and the convex portion of the concave and convex, and
  polishing the convex portion to remove the covering layer formed on the surface of the convex portion, to make the covering layer to remain on the surface of the concave portion, and to form the convex portion to be almost flat.

The method of manufacturing the display plate for a solar cell device in accordance with the present invention is characterized in that the covering layer is made of at least one kind of a covering layer selected from a printing film, a coating film, and a metal film.

Consequently, the display plate for a solar cell device in accordance with the present invention can be formed in only three processes composed of a process of forming a concave and a convex on the top or bottom surface or both the top and bottom surfaces of the light transmission substrate by a method such as an injection molding and a metal molding, a process of forming a printing film, a coating film, or a metal film on the surface of the concave portion and the convex portion of the concave and convex by a method such as an evaporation, a sputtering, a coating formation, or a coating, and a process of removing the covering layer from on the surface of the convex portion by a method such as a polishing, thereby reducing manufacturing processes. In addition, the display plate for a solar cell device can be fabricated by an easy operating method, thereby extremely reducing a manufacturing cost and a facility cost.

By such a configuration, a concave and a convex are formed on the light transmission substrate, a covering layer is formed on the surface of the concave portion, and the convex portion is formed to be almost flat. Consequently, a subtle pattern and a shadow caused by a depth are generated by the covering layer formed on the concave portion and the convex portion, thereby displaying a new decorative effect, a new gorgeousness, and new sophistication, and thereby enlarging a design variation.

Moreover, even in the case in which the covering layer formed on the surface of the concave portion is made of a material having a low light transmission property or having no light transmission property, the covering layer is not formed on the almost flat section of the convex portion. Consequently, lights of an amount required for an electric power generation in the solar cell can be obtained through the convex portion, and the solar cell can generate an electric power by the lights of an amount required for an electric power generation, thereby reliably operating the solar cell device.

Moreover, since the light transmission reflecting plate is disposed in the lowest layer, reflected lights from the solar cell is less, and a deep violet color of the solar cell is hardly visible from the comparatively small convex portion of the light transmission substrate.

Effect of the Invention

By the display plate for a solar cell device in accordance with the present invention, a decorative member such as a colored film, an index (including a numeric character, a composition, a stone, an electroformed time character, a time character print, and a demarcation print), a name print, a luminous paint layer, a pattern (including a satin pattern), and a concave and a convex are formed on the top surface of a light transmission substrate made of a material such as a resin (including a molded plastic material), a glass, a sapphire glass, and a ceramic. Moreover, a light transmission reflecting plate made of a light semi-permeable reflecting plate or a reflection polarizing plate is formed on the bottom surface of the light transmission substrate. Consequently, a transmission light can be transmitted to the light transmission substrate and the light transmission reflecting plate. Therefore, a transmittance by which an electric power generation of a solar cell can be enabled can be obtained.

Moreover, a light reflected from the light semi-permeable reflecting plate is visible via the light transmission substrate and the decorative member from an observer. As a result, the observer can see the display plate for a solar cell device that has a stereoscopic sense and a metal quality sense and that is capable of enlarging a design variation by a free combination of patterns and colors, etc.

Consequently, there can be provided the display plate for a solar watch provided with a solar cell, the display plate for a solar cell device to be used for an electronic desk calculator provided with a solar cell, and the method of manufacturing the display plate for a solar cell device, in which a stereoscopic sense and a metal quality sense are involved, patterns and colors can be freely combined, much gorgeousness and much sophistication can be displayed, a decorative effect and a functional property can be improved, and a design variation can be enlarged.

BRIEF DESCRIPTION OF THE DRAWINGS

FIG. 26(a) is a plan view thereof, and FIG. 26(b) is a pivotal partially cross-sectional view thereof;

BEST MODE OF CARRYING OUT THE INVENTION

An embodiment (example) of the present invention will be described below in detail with reference to the drawings.

Figure 1:
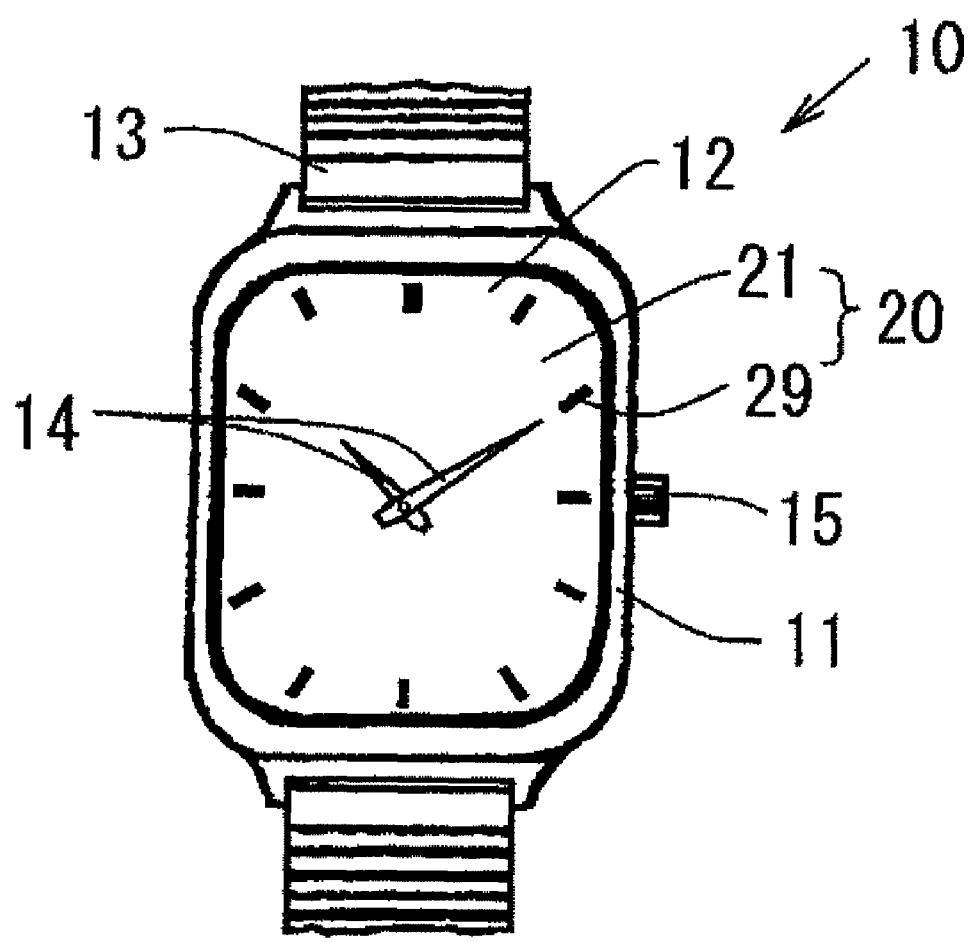
FIG. 1 is a plan view showing a solar watch in which a display plate for a solar cell device in accordance with the present invention is mounted to the solar watch as a display plate for a solar watch.
Figure 2:
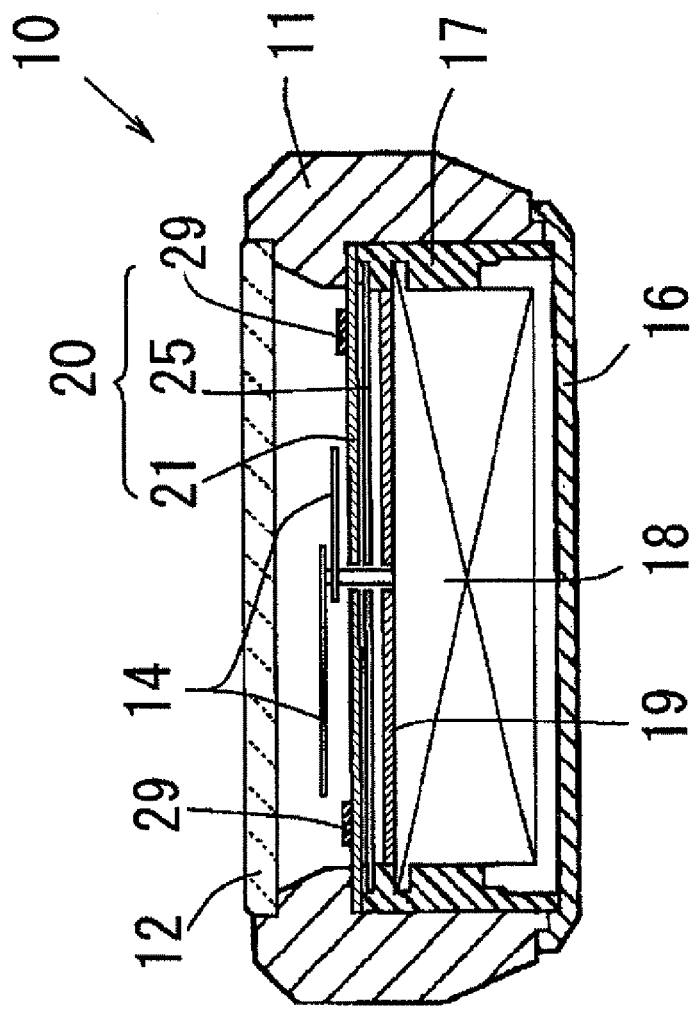
FIG. 2 is a pivotal partially cross-sectional view of FIG. 1.

FIG. 1 is a plan view showing a solar watch in which a display plate for a solar cell device in accordance with the present invention is mounted to the solar watch as a display plate for a solar watch. FIG. 2 is a pivotal partially cross-sectional view of FIG. 1.

As shown in FIGS. 1 and 2, a numeral 10 represents a solar watch in which a display plate for a solar cell device in accordance with the present invention is mounted to the solar watch as a display plate for a solar watch as a whole.

As shown in FIG. 2, for the solar watch 10, a movement 18 is mounted in a case 11 via an inner frame 17, and a solar cell 19 is disposed on the movement 18 in an integrating manner.

A display plate 20 for a solar watch is mounted over the solar cell 19 in the case 11 via the inner frame 17.

More specifically, as shown in FIG. 2, time characters 29 are disposed on the predetermined positions of a light transmission substrate 21. A reflection polarizing plate 25 that functions as a light transmission reflecting plate is disposed under the light transmission substrate 21, and the solar cell 19 is disposed under the reflection polarizing plate 25.

The display plate 20 for a solar watch is composed of the light transmission substrate 21 on which indexes 29 are formed and the reflection polarizing plate 25.

The index 29 is not restricted in particular and can be, for instance, a numeric character, a composition, a stone, an electroformed time character, a time character print, a demarcation print, a name print, and a luminous paint layer.

A hand axis is attached to the movement 18 while protruding to the upper side of the light transmission substrate 21. A hand 14 composed of the long hand and the short hand is attached to the end of the hand axis.

In such a manner that the above members are covered, a cover glass 12 is fixed to the case 11, and a rear cover 16 is fixed to the rear face side of the case 11.

As shown in FIG. 1, a band 13 is attached to the band attachment portions formed in the twelve and six o'clock directions on the side portion of the case 11, and a stem 15 is attached to the side face of the case 11.

Embodiment 1

Figure 3:
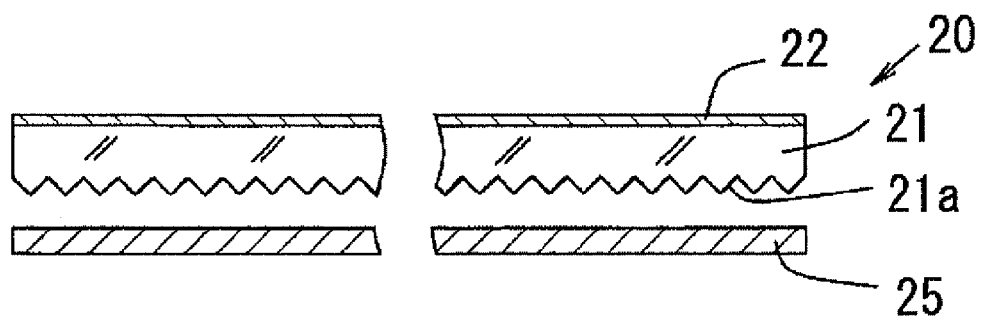
FIG. 3 is a pivotal partially cross-sectional view of a first embodiment of the display plate for a solar cell device in accordance with the present invention.
Figure 4:
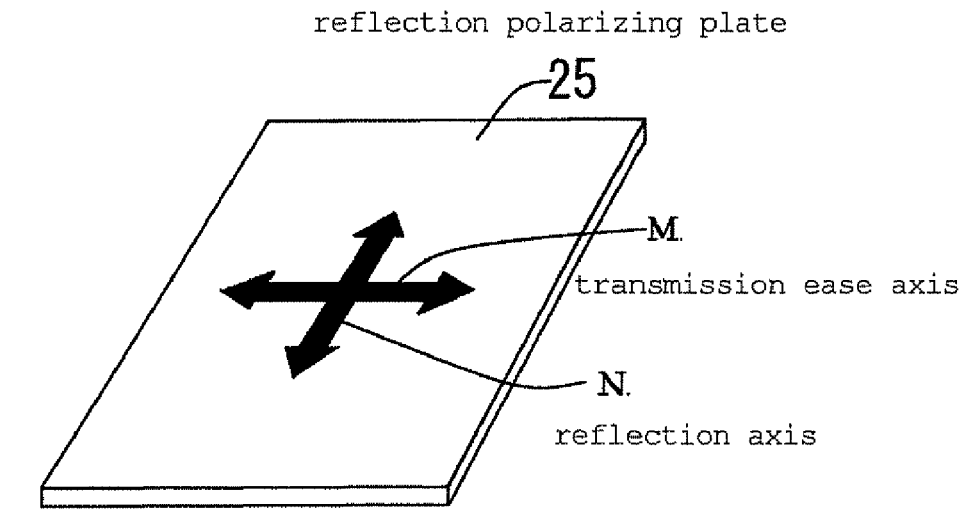
FIG. 4 is a view for illustrating a reflection polarizing plate shown in FIG. 3.
Figure 5:
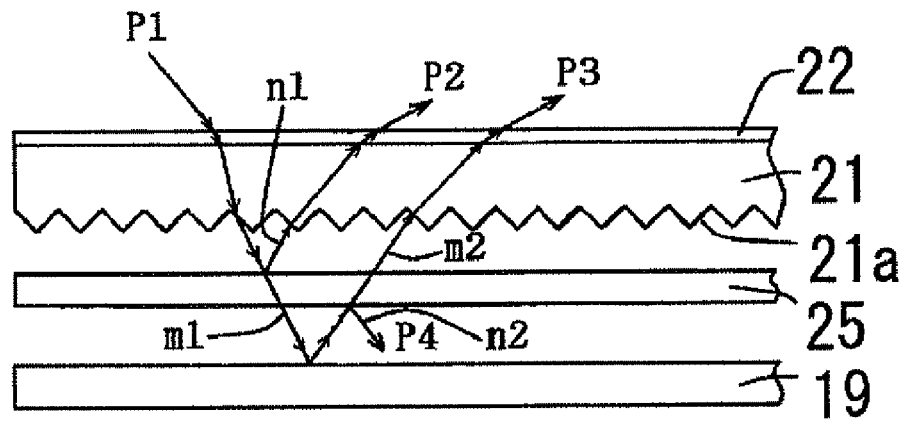
FIG. 5 is a view for illustrating an operation of the reflection polarizing plate shown in FIG. 3.

FIG. 3 is a pivotal partially cross-sectional view of a first embodiment of the display plate for a solar cell device in accordance with the present invention. FIG. 4 is a view for illustrating a reflection polarizing plate shown in FIG. 3. FIG. 5 is a view for illustrating an operation of the reflection polarizing plate shown in FIG. 3.

As shown in FIG. 3, a numeral 20 represents a display plate 20 for a solar watch to be attached to the solar watch 10 as described above (hereafter referred to as a display plate for a watch).

The display plate 20 for a watch is composed of the light transmission substrate 21, a first transmission colored film 22 formed on the light transmission substrate 21, and the reflection polarizing plate 25 that is a light transmission reflecting plate formed under the light transmission substrate 21.

An index is mounted on the first transmission colored film 22 although this is not shown in FIG. 3. The description of the index is omitted in all descriptions of the following embodiments.

As described above, the index is not restricted in particular and can be, for instance, a numeric character, a composition, a stone, an electroformed time character, a time character print, a demarcation print, a name print, and a luminous paint layer.

As shown in FIG. 3, the light transmission substrate 21 is made of a transparent resin such as a polycarbonate resin and an acrylic resin, and a prism reflecting surface 21a is formed on the bottom surface of the light transmission substrate.

The first transmission colored film 22 is formed on the light transmission substrate 21.

The light transmission substrate 21 is formed by a method such as an injection molding, and the prism reflecting surface 21a is simultaneously formed by a transcription from a metal mold.

As shown in FIG. 3, the prism reflecting surface 21a is in a prism shape with an approximately triangular cross section.

The prism reflecting surface 21a can have the dispersing and scattering functions of a light as described later. The shape thereof in a plan view is not restricted in particular. However, it is preferable that the shape of the prism reflecting surface 21a in a plan view is composed of at least one selected from a circle shape, a spiral shape, a linear shape (parallel straight lines, or straight lines disposed at random), an intersecting shape (lattice pattern, diagonally intersecting pattern or the like), and a geometric shape although this is not shown in the figure.

As shown in FIG. 3, an angle of a triangle of the prism reflecting surface 21a is 80 degrees at a concave portion and a convex portion. However, in the case in which the prism reflecting surface 21a has the dispersing and scattering functions of a light as described later, the angle thereof is not restricted in particular. For instance, it is preferable that the angle thereof is in the range of 60 to 120 degrees at intervals of 5 degrees, such as 60 degrees and 65 degrees.

As shown in FIG. 3, a height of the prism reflecting surface 21a is approximately 70 μm and a pitch thereof is approximately 140 μm. However, in the case in which the prism reflecting surface 21a has the dispersing and scattering functions of a light as described later, the height and pitch thereof are not restricted in particular.

It is preferable that the height and pitch of the prism reflecting surface 21a is a size of an invisible degree in such a manner that the processing of a metal mold is easy.

The light transmission substrate 21 is made of a transparent resin such as a polycarbonate resin and an acrylic resin. However, in the case in which the light transmission substrate 21 has a light transmission property, the material of the light transmission substrate 21 is not restricted in particular. In addition, a glass, a sapphire glass, and a ceramic can also be used as a material thereof.

In this embodiment, the first transmission colored film 22 that is formed on the light transmission substrate 21 is formed by mixing a white pigment to a resin and by a printing method.

It is to color the display plate 20 for a watch to be white that the white pigment is used. In the case in which the first transmission colored film is thicker, the display plate is colored to be white, but a light transmittance is degraded. Consequently, the first transmission colored film 22 is thinned to be in the range of 7 to 10 μm, and a light transmittance thereof is decreased by approximately 10% due to the thickness.

In the case in which the first transmission colored film 22 is toned to be another color, a pigment or a dye having another color can be used.

Moreover, a plating film, a printing film, and a coating film can also be used to color the first transmission colored film 22. For instance, an extremely thin metal film can be formed by a method such as a sputtering and evaporation. The material and method can be selected as needed corresponding to a desired color tone.

As shown in FIG. 4, the reflection polarizing plate 25 formed under the light transmission substrate 21 is provided with a reflection axis N and a transmission ease axis M. The reflection polarizing plate 25 has characteristic properties in which a linearly polarized light component provided with a vibration plane parallel to the reflection axis N is reflected and a linearly polarized light component provided with a vibration plane parallel to the transmission ease axis M is transmitted. In addition, the reflection polarizing plate 25 has characteristic properties in which lights of approximately 50% are transmitted and lights of another approximately 50% are reflected.

In this embodiment, DBEF (product name) manufactured by Sumitomo 3M Limited is used as the reflection polarizing plate 25 to obtain a strong reflected light colored to be silver with a gloss.

The silver reflected light of the reflection polarizing plate 25 and a white color of the first transmission colored film 22 are mixed to increase a white tone.

Moreover, the strong reflected light enables the surface to be bright, and a white color is made vivid. A gold reflected light can also be obtained from another reflection polarizing plate. The color of the reflecting light can be selected as needed corresponding to a design, etc.

The operation of the reflection polarizing plate 25 will be described below with reference to FIG. 5.

A light P1 irradiated to the light transmission substrate 21 repeats refraction during a transmission in the first transmission colored film 22 and the light transmission substrate 21. The light P1 is transmitted in the light transmission substrate 21 and irradiated to the reflection polarizing plate 25.

In this case, all the lights irradiated to the light transmission substrate 21 are not transmitted in the light transmission substrate 21. Part of the lights is reflected by the prism reflecting surface 21a and transmitted in the light transmission substrate 21 again to being radiated externally.

Of the lights irradiated to the reflection polarizing plate 25, a light n1 of a linearly polarized light component provided with a vibration plane parallel to the reflection axis N of the reflection polarizing plate 25 is reflected from the reflection polarizing plate 25 and is radiated externally as a reflected light P2.

On the other hand, a light m1 of a linearly polarized light component provided with a vibration plane parallel to the transmission ease axis M of the reflection polarizing plate 25 is transmitted in the reflection polarizing plate 25 and irradiated to a solar cell 19.

The lights irradiated to the solar cell 19 are classified into lights that are absorbed in the solar cell 19 and lights that are reflected from the solar cell 19.

Of the lights reflected from the solar cell 19, a light m2 of a linearly polarized light component provided with a vibration plane parallel to the transmission ease axis M of the reflection polarizing plate 25 is transmitted in the reflection polarizing plate 25 and is irradiated to the light transmission substrate 21.

The light m2 repeats refraction during a transmission in the light transmission substrate 21 and the first transmission colored film 22 and is radiated externally as a reflected light P3.

On the other hand, a light n2 of a linearly polarized light component provided with a vibration plane parallel to the reflection axis N of the reflection polarizing plate 25 is reflected by the reflection polarizing plate 25 and is returned to the solar cell 19 side.

By the above configuration, an amount of the lights that are irradiated to the light transmission substrate 21 and that are reflected from the solar cell 19 and returned to the light transmission substrate 21 is extremely small.

As described above, the prism reflecting surface 21a is formed in a circle shape or a spiral shape. Consequently, the lights reflected by the prism reflecting surface 21a of the light transmission substrate 21 and the lights reflected from the solar cell 19 and transmitted in the prism reflecting surface 21a do not become reflected lights in a uniform direction. The lights become reflected lights that have been dispersed and scattered in four ways and are radiated externally.

Therefore, lights that are reflected from the solar cell 19 become less and a scattering occurs due to the operation of the prism reflecting surface 21a. Consequently, a deep violet color tone of the solar cell 19 is completely extinguished and becomes invisible.

In this embodiment, the reflection polarizing plate 25 that functions as a light transmission reflecting plate is used. However, a light semi-permeable reflecting plate in which a metal evaporated film, a printing film, or a coating film has been formed on the surface of a substrate can also be used.

For the display plate 20 for a watch in accordance with this embodiment, by the above configuration, a color tone of the solar cell 19 can be completely extinguished, and the surface of the display plate 20 for a watch can be made vivid. Consequently, a whiteness of the display plate 20 for a watch in accordance with this embodiment increases, and the display plate 20 is visible vividly. Therefore, the display plate 20 for a watch is gorgeous and can create sophistication.

In this embodiment, the first transmission colored film 22 formed on the light transmission substrate 21 and the index function as a decorative member in accordance with the present invention.

Embodiment 2

Figure 6:
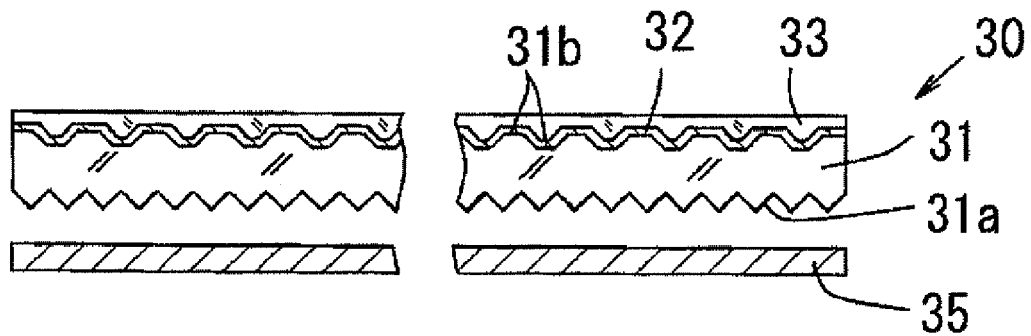
FIG. 6 is a pivotal partially cross-sectional view of a second embodiment of the display plate for a solar cell device in accordance with the present invention.

FIG. 6 is a pivotal partially cross-sectional view of a second embodiment of the display plate for a solar cell device in accordance with the present invention.

As shown in FIG. 6, for a display plate 30 for a watch in accordance with this embodiment, a first transmission colored film 32 is formed on a light transmission substrate 31, and a transparent film 33 is formed on the first transmission colored film 32. A reflection polarizing plate 35 that functions as a light transmission reflecting plate is formed under the light transmission substrate 31.

Consequently, the display plate 30 for a watch in accordance with this embodiment is composed of the light transmission substrate 31, the first transmission colored film 32 formed on the light transmission substrate 31, the transparent film 33, and the reflection polarizing plate 35 formed under the light transmission substrate 31.

The reflection polarizing plate 35 in accordance with this embodiment is a reflection polarizing plate that is capable of obtaining a gold reflected light with a gloss. The operations of a light transmission and a reflection are equivalent to those described in the first embodiment.

The light transmission substrate 31 is made of a transparent polycarbonate resin. The prism reflecting surface 31a in a circle shape or a spiral shape is formed on the bottom surface of the light transmission substrate 31, and a lattice pattern 31b with a concave and a convex is formed on the top surface of the light transmission substrate 31.

The prism reflecting surface 31a and the pattern 31b are formed by a transcription from a metal mold based on an injection molding. The shape of the prism reflecting surface 31a is equivalent to that of the prism reflecting surface 21a described in the first embodiment.

The first transmission colored film 32 is formed by a printing method with an ink made by mixing the copper metal powder to a transparent urethane resin. The display plate is finished in such a manner that a gold color tone appears as a whole by a color of a reflected light of the reflection polarizing plate 35 and a color of the first transmission colored film 32.

As described in the above first embodiment, in the case in which the first transmission colored film 32 is toned to be another color, a pigment or a dye having another color can be used.

As described in the above first embodiment, a plating film, a printing film, and a coating film can also be used to color the first transmission colored film 32. For instance, an extremely thin metal film can be formed by a method such as a sputtering or an evaporation. The material and method can be selected as needed corresponding to a desired color tone.

The transparent film 33 is formed for protection by printing a transparent urethane resin, etc. The surface of the transparent film 33 is finished to be a smooth surface. The transparent film 33 is not restricted in particular and can be formed by a transparent resin such as a urethane resin, a polycarbonate resin, and an acrylic resin.

The lattice pattern 31b formed on the top surface of the light transmission substrate 31 is clearly visible from the upper side. In the lattice pattern 31b, a depth and a width of a concave portion and a width of a convex portion are made large enough to be visible.

The pattern 31b also has a function to refract and scatter a reflected light from the lower side.

In this embodiment, although the pattern 31b is formed in the lattice pattern, the pattern 31b can also be another pattern with a concave and a convex. For instance, various patterns such as a satin pattern, a stripe pattern, a pyramid form cut pattern, a geometric pattern, a stitch pattern, and a radial pattern can be selected for the pattern 31b corresponding to a desired design.

For the display plate 30 for a watch in accordance with this embodiment, by the above configuration, by a strong reflected light of the reflection polarizing plate 35, a gold color tone is visible brightly and vividly by a color of the lattice pattern 31b formed on the top surface of the light transmission substrate 31, a color of a reflected light of the reflection polarizing plate 35, and a color of the first transmission colored film 32. By such a configuration, a noble metal sense appears to create sophistication. Moreover, a color tone of the solar cell 19 is completely extinguished and becomes invisible.

In this embodiment, the first transmission colored film 32 formed on the top surface of the light transmission substrate 31, the lattice pattern 31b, the index and so on function as a decorative member in accordance with the present invention.

Embodiment 3

Figure 7:
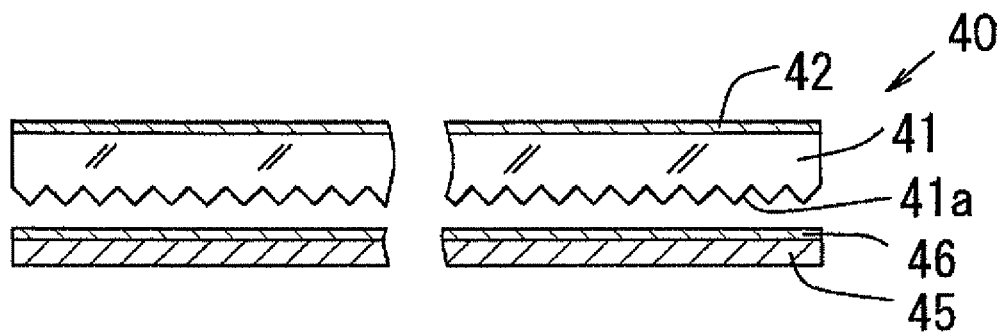
FIG. 7 is a pivotal partially cross-sectional view of a third embodiment of the display plate for a solar cell device in accordance with the present invention.

FIG. 7 is a pivotal partially cross-sectional view of a third embodiment of the display plate for a solar cell device in accordance with the present invention.

As shown in FIG. 7, for a display plate 40 for a watch in accordance with this embodiment, a prism reflecting surface 41a is formed on the bottom surface of a light transmission substrate 41, and a first transmission colored film 42 is formed on the light transmission substrate 41. Moreover, a second transmission colored film 46 is formed on a reflection polarizing plate 45 that is a light transmission reflecting plate.

Consequently, the display plate 40 for a watch in accordance with this embodiment is composed of the light transmission substrate 41, the first transmission colored film 42 formed on the light transmission substrate 41, the reflection polarizing plate 45, and the second transmission colored film 46 formed on the reflection polarizing plate 45.

The light transmission substrate 41 in accordance with this embodiment is provided with the prism reflecting surface 41a on the bottom surface thereof. The light transmission substrate 41 and the first transmission colored film 42 formed on the light transmission substrate 41 are formed based on the specifications equivalent to those described in the first embodiment.

The reflection polarizing plate 45 is equivalent to the reflection polarizing plate 25 that is used in the above first embodiment and that is capable of obtaining a silver reflected light with a gloss.

In this embodiment, the second transmission colored film 46 to be formed on the reflection polarizing plate 45 is formed to have a thickness in the range of 7 to 10 μm by a printing method with an ink made by a resin containing a white pigment. The second transmission colored film 46 is formed based on the specifications equivalent to those of the white first transmission colored film 42 formed on the light transmission substrate 41.

As described in the above first embodiment, in the case in which the first transmission colored film 42 and the second transmission colored film 46 are toned to be another color, a pigment or a dye having another color can be used.

As described in the above first embodiment, a plating film, a printing film, and a coating film can also be used to color the first transmission colored film 42 and the second transmission colored film 46. For instance, an extremely thin metal film can be formed by a method such as a sputtering or an evaporation. The material and method can be selected as needed corresponding to a desired color tone.

The display plate 40 for a watch in accordance with this embodiment is provided with a dial plate that is much whiter than the display plate 20 for a watch in accordance with the above first embodiment.

A silver color of a reflected light from the reflection polarizing plate 45 and a white color of the second transmission colored film 46 are mixed to accelerate whitening. The white color is mixed to a white color of the first transmission colored film 42 formed on the light transmission substrate 41 to obtain a deep white color.

For the display plate 40 for a watch in accordance with this embodiment, the transmission colored films are superposed on each other to make double layers, thereby reducing a light transmittance.

However, some recent solar cells can obtain a sufficient electric power generation amount by an improvement of a photoelectric conversion efficiency even in the case in which a light transmittance is 15%.

Consequently, a light transmittance of the first transmission colored film 42 and the second transmission colored film 46 can be set in such a manner that a required light transmittance can be obtained sufficiently. Corresponding to the set light transmittance, a quantity of a pigment to be compounded and a thickness of a film to be formed can be set preferably.

The display plate 40 for a watch in accordance with this embodiment can be a dial plate that is deeply white and that displays a brightness. In the case in which an index that includes time characters, a mark, and a decorative pattern and so on are applied to the surface of the white dial plate, the index, the mark, and the decorative pattern can be much vividly visible. In addition, the dial plate becomes bright and gorgeous.

In this embodiment, the first transmission colored film 42 formed on the light transmission substrate 41, the index and so on function as a decorative member in accordance with the present invention. In this case, the second transmission colored film 46 formed on the reflection polarizing plate 45 also has a decorative function.

Embodiment 4

Figure 8:
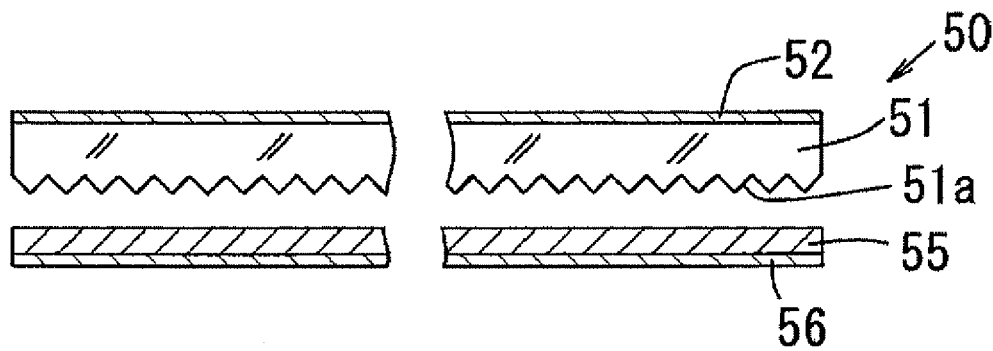
FIG. 8 is a pivotal partially cross-sectional view of a fourth embodiment of the display plate for a solar cell device in accordance with the present invention.

FIG. 8 is a pivotal partially cross-sectional view of a fourth embodiment of the display plate for a solar cell device in accordance with the present invention.

As shown in FIG. 8, for a display plate 50 for a watch in accordance with this embodiment, a prism reflecting surface 51a is formed on the bottom surface of a light transmission substrate 51, and a first transmission colored film 52 is formed on the light transmission substrate 51. Moreover, a second transmission colored film 56 is formed on the bottom surface of a reflection polarizing plate 55 that is a light transmission reflecting plate.

Consequently, the display plate 50 for a watch in accordance with this embodiment is composed of the light transmission substrate 51 with the prism reflecting surface 51a formed on the bottom surface thereof, the first transmission colored film 52 formed on the light transmission substrate 51, the reflection polarizing plate 55, and the second transmission colored film 56 formed on the bottom surface of the reflection polarizing plate 55.

The light transmission substrate 51 in accordance with this embodiment is provided with the prism reflecting surface 51a on the bottom surface thereof. The light transmission substrate 51 and the first transmission colored film 52 formed on the light transmission substrate 51 are formed based on the specifications equivalent to those described in the first embodiment.

The reflection polarizing plate 55 is equivalent to the reflection polarizing plate 25 that is used in the above first embodiment and that is capable of obtaining a silver reflected light with a gloss.

The second transmission colored film 56 formed on the bottom surface of the reflection polarizing plate 55 is formed to soften a color tone of a light reflected from the solar cell 19.

By such a configuration, a light transmittance is reduced slightly. A thickness of the second transmission colored film 56 is set in such a manner that a required light transmittance can be obtained.

As a color of the second transmission colored film 56, it is preferable to select a complementary color with a deep violet color or a color close to a complementary color with a deep violet color. As a complementary color with a deep violet color, there are mentioned, for instance, a yellow color and a yellow green color. In the case in which a light with a deep violet color are mixed to a light with a complementary color with a deep violet color, whitening is accelerated.

Consequently, as well as the second transmission colored film 56 can soften a color tone of the solar cell 19, the second transmission colored film 56 can accentuate a color tone of the first transmission colored film 52 formed on the light transmission substrate 51.

The display plate 50 for a watch in accordance with this embodiment can be a dial plate that is deeply white and that appears brightly. In the case in which an index that includes time characters, a mark, and a decorative pattern and so on are applied to the surface of the white dial plate, the index, the mark, and the decorative pattern can be much vividly visible. In addition, the dial plate becomes bright and gorgeous.

In this embodiment, the first transmission colored film 52 formed on the light transmission substrate 51, the index and so on function as a decorative member in accordance with the present invention. In this case, the second transmission colored film 56 formed on the bottom surface of the reflection polarizing plate 55 also has a decorative function.

Embodiment 5

Figure 9:
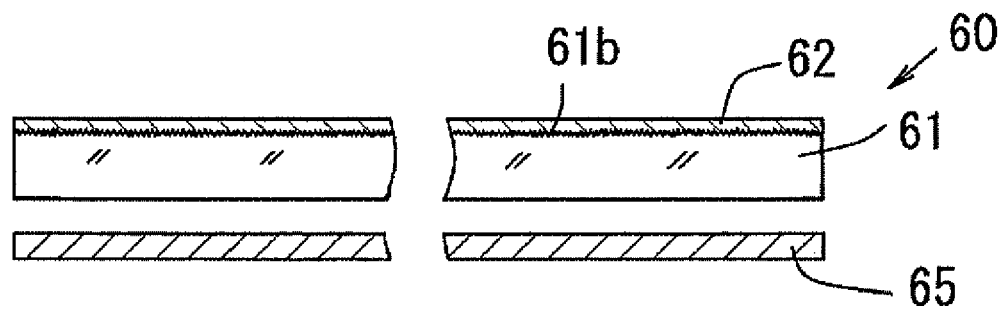
FIG. 9 is a pivotal partially cross-sectional view of a fifth embodiment of the display plate for a solar cell device in accordance with the present invention.

FIG. 9 is a pivotal partially cross-sectional view of a fifth embodiment of the display plate for a solar cell device in accordance with the present invention.

As shown in FIG. 9, for a display plate 60 for a watch in accordance with this embodiment, a first transmission colored film 62 is formed on a light transmission substrate 61, and a reflection polarizing plate 65 that is a light transmission reflecting plate is formed under the light transmission substrate 61.

The reflection polarizing plate 65 in accordance with this embodiment is equivalent to the reflection polarizing plate 25 that is used in the above first embodiment and that is capable of obtaining a silver reflected light.

The light transmission substrate 61 is formed by a transcription from a metal mold in a resin molding process. A satin pattern 61b with a concave and a convex is formed on the surface of the light transmission substrate 61.

The first transmission colored film 62 is formed on the satin pattern 61b. The first transmission colored film 62 is formed based on the specifications equivalent to those of the first transmission colored film 22 in accordance with the first embodiment.

For a display plate 60 for a watch in accordance with this embodiment, a silver color strongly appears by such a configuration. Moreover, a convex portion of the satin pattern 61b glitters corresponding to a direction of an application of a light as the sand ground that glitters by receiving the sunlight. A noble metal sense appears and a photoluminescence also appears by glittering.

Furthermore, a reflected light from the solar cell 19 is scattered by the concave and convex pattern of the satin pattern 61b, thereby extinguishing a color tone of the solar cell 19 to prevent the solar cell from being visible.

In this embodiment, the satin pattern 61b with a concave and a convex is formed on the surface of the light transmission substrate 61. However, as the concave and convex pattern, various patterns such as a lattice pattern, a stripe pattern, a pyramid form cut pattern, a stitch pattern, and a radial pattern can also be selected in addition to the satin pattern.

In this embodiment, the first transmission colored film 62 formed on the light transmission substrate 61, the satin pattern 61b, and the index function as a decorative member in accordance with the present invention.

Embodiment 6

Figure 10:
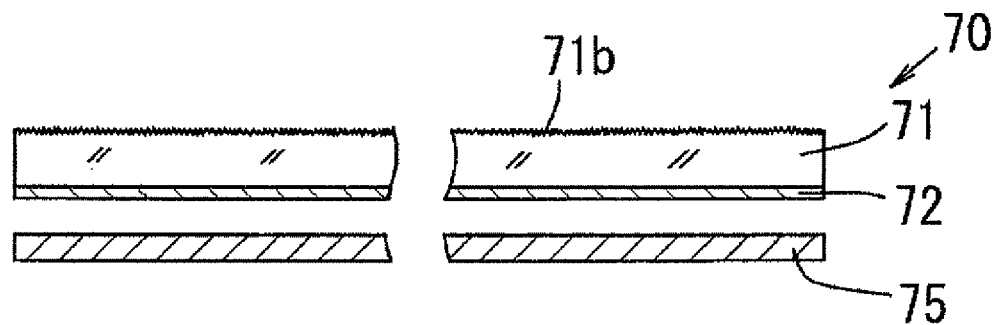
FIG. 10 is a pivotal partially cross-sectional view of a sixth embodiment of the display plate for a solar cell device in accordance with the present invention.

FIG. 10 is a pivotal partially cross-sectional view of a sixth embodiment of the display plate for a solar cell device in accordance with the present invention.

As shown in FIG. 10, for a display plate 70 for a watch in accordance with this embodiment, a satin pattern 71b is uniformly formed on a light transmission substrate 71, and a first transmission colored film 72 is formed on the bottom surface of the light transmission substrate 71. A reflection polarizing plate 75 that is a light transmission reflecting plate is formed under the light transmission substrate 71.

The reflection polarizing plate 75 in accordance with this embodiment is equivalent to the reflection polarizing plate that is used in the above first embodiment and that is capable of obtaining a silver reflected light.

The first transmission colored film 72 formed on the bottom surface of the light transmission substrate 71 is a printing film that is formed by mixing a white pigment of 7 weight % to have a thickness of approximately 7 μm by a printing method. In this case, a light transmittance of the first transmission colored film 72 becomes approximately 70%, and a reduction of a light transmittance is approximately three times as much as that of a light transmittance of the first transmission colored film in accordance with the above embodiments 1 to 5.

In the case of the present embodiment, a satin pattern 71b with a concave and a convex is also formed on the top surface of the light transmission substrate 71. However, as the concave and convex pattern, various patterns such as a lattice pattern, a stripe pattern, a pyramid form cut pattern, a stitch pattern, and a radial pattern can also be selected in addition to the satin pattern.

For a display plate 70 for a watch in accordance with this embodiment, by such a configuration, a silver color tone fades, and a bright satin tone closer to a white color can be obtained. Moreover, a glittering photoluminescence described in the above embodiment 5 does not appear. Furthermore, a color tone of the solar cell 19 is extinguished to prevent the solar cell from being visible.

In this embodiment, the satin pattern 71b formed on the light transmission substrate 71, and the index function as a decorative member in accordance with the present invention. In this case, the first transmission colored film 72 formed on the bottom surface of the light transmission substrate 71 also has a decorative function.

Embodiment 7

Figure 11:
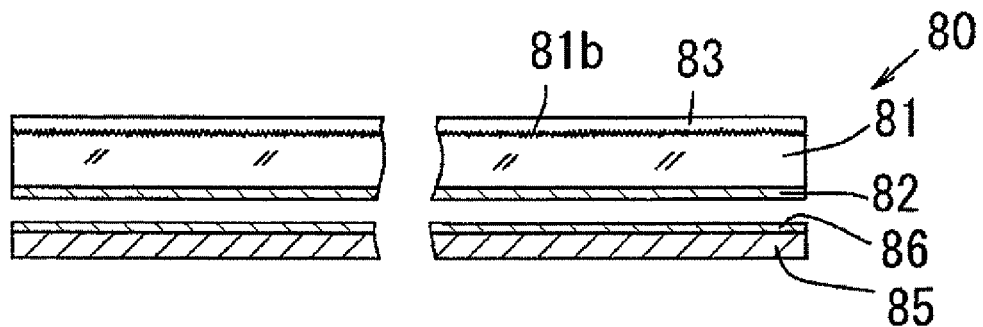
FIG. 11 is a pivotal partially cross-sectional view of a seventh embodiment of the display plate for a solar cell device in accordance with the present invention.

FIG. 11 is a pivotal partially cross-sectional view of a seventh embodiment of the display plate for a solar cell device in accordance with the present invention.

As shown in FIG. 11, for a display plate 80 for a watch in accordance with this embodiment, a satin pattern 81b is uniformly formed on a light transmission substrate 81, and a transparent film 83 is formed on the satin pattern 81b. A first transmission colored film 83 is formed on the bottom surface of the light transmission substrate 81.

A reflection polarizing plate 85 that is a light transmission reflecting plate is formed under the light transmission substrate 81. A second transmission colored film 86 is formed on the reflection polarizing plate 85.

The transparent film 83 formed over the light transmission substrate 81 is formed based on the specifications equivalent to those of the transparent film 33 in accordance with the above second embodiment.

The first transmission colored film 82 formed on the bottom surface of the light transmission substrate 81 is formed to have a thickness in the range of 7 to 10 μm by mixing a white pigment in such a manner that a light transmittance of the first transmission colored film is approximately 90%.

The reflection polarizing plate 85 is equivalent to the reflection polarizing plate 35 that is used in the above second embodiment and that is capable of obtaining a gold light tone with a gloss from a reflected light.

The second transmission colored film 86 formed on the reflection polarizing plate 85 is formed based on the specifications entirely equivalent to those of the first transmission colored film 82 formed on the bottom surface of the light transmission substrate 81, and has a white color tone.

The first transmission colored film 82 and the second transmission colored film 86 are made of a paint film (including a printing film and a coating film) having a white color tone in such a manner that a gold color with a gloss obtained from the reflection polarizing plate 85 fades. A gold color extremely fades, thereby obtaining a dial plate having a faded yellow color tone. The transparent film 83 is formed as a protection film to prevent a satin pattern from being damaged due to a flaw.

For a display plate 80 for a watch in accordance with this embodiment, by such a configuration, there can be obtained a bright surface of the display plate having a slightly faded color tone like a yellow (so-called faded light gold), and a surface of the display plate having a calm atmosphere caused by the satin pattern.

The combination of colors of the first transmission colored film 82 and the second transmission colored film 86 enables various color tones to appear.

In the case in which a gold color tone that appears from the reflection polarizing plate 85 is displayed, the copper metal powder is compounded to the first transmission colored film 82 and the second transmission colored film 86 to make a paint film, thereby maintaining a gold color tone and obtaining a gold dial plate having a calm atmosphere without a gloss. Consequently, there can be obtained a display plate having a metal tone almost equivalent to a metal display plate provided with a satin pattern on which gold plating has been carried out.

In the case of this embodiment, the satin pattern 81b with a concave and a convex is formed on the surface of the light transmission substrate 81. However, as the concave and convex pattern, various patterns such as a lattice pattern, a stripe pattern, a pyramid form cut pattern, a stitch pattern, and a radial pattern can also be selected in addition to the satin pattern.

In this embodiment, the satin pattern 81b formed on the light transmission substrate 81, and the index function as a decorative member in accordance with the present invention. In this case, the first transmission colored film 82 formed on the bottom surface of the light transmission substrate 81 and the second transmission colored film 86 formed on the reflection polarizing plate 85 also have a decorative function.

Embodiment 8

Figure 12:
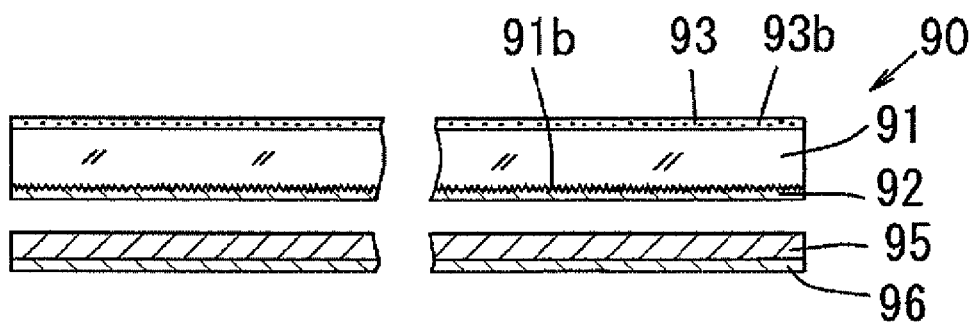
FIG. 12 is a pivotal partially cross-sectional view of an eighth embodiment of the display plate for a solar cell device in accordance with the present invention.

FIG. 12 is a pivotal partially cross-sectional view of an eighth embodiment of the display plate for a solar cell device in accordance with the present invention.

As shown in FIG. 12, for a display plate 90 for a watch in accordance with this embodiment, a transparent film 93 containing a photo luminescent material 93b is formed on a light transmission substrate 91.

A satin pattern 91b with a concave and a convex is uniformly formed on the bottom surface of the light transmission substrate 91, and a first transmission colored film 92 is formed on the bottom surface of the satin pattern 91b.

A reflection polarizing plate 95 that is a light transmission reflecting plate is formed under the light transmission substrate 91. A second transmission colored film 96 is formed on the bottom surface of the reflection polarizing plate 95.

The satin pattern 91b on the bottom surface of the light transmission substrate 91 is formed by a transcription from a metal mold. In this embodiment, a pattern with a slightly rough texture is used for the satin pattern.

More specifically, in the case in which a satin pattern is formed for a metal mold, a sand blasting method in which sand or the like is blasted at a high pressure is used in general. The satin pattern with a rough texture is formed by using sand with a large particle diameter.

The first transmission colored film 92 formed under the light transmission substrate 91 is formed based on the specifications entirely equivalent to those of the transmission colored film 22 in accordance with the above first embodiment, and has a white color tone.

The photo luminescent material 93b is mixed to the transparent film 93 formed on the light transmission substrate 91. The photo luminescent material 93b used in this embodiment is the powder of a white pearl oyster shell.

In this case, a mixing amount of the photo luminescent material 93b can be set in such a manner that a light transmittance of the transparent film 93 does not affect an electric power generation in the solar cell 19.

As the photo luminescent material 93b, in addition to the powder of a white pearl oyster shell in accordance with this embodiment, the powder of pearl, mica, a titanium metal, or silicon oxide can also be selected. In particular, since silicon oxide is transparent, it cannot be visually confirmed that silicon oxide is contained in the transparent film.

The reflection polarizing plate 95 is formed based on the specifications equivalent to those of the reflection polarizing plate 25 in accordance with the above first embodiment, and has a silver color tone.

The second transmission colored film 96 formed on the bottom surface of the reflection polarizing plate 95 is formed to soften a color tone of the solar cell 19.

As described in the above fourth embodiment, as a color of the second transmission colored film 56, it is preferable to select a complementary color with a deep violet color or a color close to a complementary color with a deep violet color. As a complementary color with a deep violet color, for instance, a yellow color and a yellow green color are mentioned. In the case in which a light with a deep violet color are mixed to a light with a complementary color with a deep violet color, whitening is accelerated and a color tone of the solar cell 19 can be softened.

For a display plate 90 for a watch in accordance with this embodiment, by such a configuration, there can be obtained the display plate in which a photoluminescence peculiar to a seashell appears by an action of the powder of a white pearl oyster shell that is the photo luminescent material 93b mixed to the transparent film 93.

A gorgeous photoluminescence peculiar to a seashell is visible by a light directly reflected from the powder of a white pearl oyster shell that is the photo luminescent material 93b mixed to the transparent film 93, or by a light that is reflected from the reflection polarizing plate 95 and that passes through the first transmission colored film 92 and the satin pattern 91b to be white and is reflected from the powder of a white pearl oyster shell being the photo luminescent material 93b mixed to the transparent film 93, among lights irradiated to the transparent film 93.

In such a manner that as many lights as possible strongly reflected from the reflection polarizing plate 95 are directly irradiated to the powder of a white pearl oyster shell that is the photo luminescent material 93b mixed to the transparent film 93, the surface of the satin pattern is made rough.

By such a configuration, some strongly reflected lights are irradiated to the powder of a white pearl oyster shell, and seashells displaying a photoluminescence are increased.

The bright and vivid photoluminescence of the powder of many white pearl oyster shells is visible. Moreover, in the case in which there is a gap between the powders of a white pearl oyster shell that is the photo luminescent material 93b mixed to the transparent film 93, the satin pattern 91b formed on the bottom surface of the light transmission substrate 91 is visible in the gap. Consequently, a profundity appears in the satin pattern, and a stereoscopic sense is imparted to the seashells.

In this embodiment, the photo luminescent materials 93b are dispersed in the transparent film 93. However, in place of the transparent film 93, the first transmission colored film 92 can also be formed on the light transmission substrate 91 and photo luminescent materials can be dispersed in the first transmission colored film 92. However, in this case, a photoluminescence slightly fades.

In this embodiment, the transparent film 93 to which the photo luminescent material 93b is mixed and that is formed on the light transmission substrate 91, and the index function as a decorative member in accordance with the present invention. In this case, the first transmission colored film 92 formed on the bottom surface of the light transmission substrate 91, the satin pattern 91b, and the second transmission colored film 96 formed on the bottom surface of the reflection polarizing plate 95 also have a decorative function.

Embodiment 9

Figure 13:
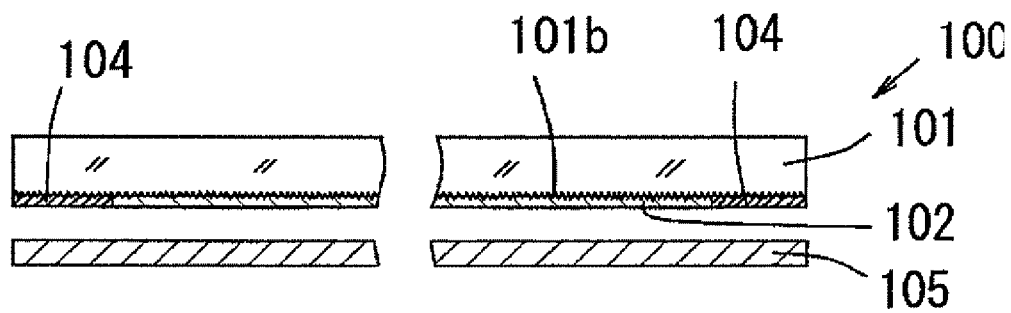
FIG. 13 is a pivotal partially cross-sectional view of a ninth embodiment of the display plate for a solar cell device in accordance with the present invention.

FIG. 13 is a pivotal partially cross-sectional view of a ninth embodiment of the display plate for a solar cell device in accordance with the present invention.

In this embodiment, a compact solar cell is used although this is not shown in the figure.

As shown in FIG. 13, for a display plate 100 for a watch in accordance with this embodiment, a satin pattern 101b is uniformly formed on the bottom surface of the light transmission substrate 101.

A first transmission colored film 102 is formed on the bottom surface of the satin pattern 101b and on an inner periphery side. A colored film 104 that hardly has a light transmission property is formed on the outer periphery side of the first transmission colored film 102 along the outer periphery region of the display plate 100 in a ring shape.

A reflection polarizing plate 105 that is a light transmission reflecting plate is formed under the light transmission substrate 101.

In this case, in this embodiment, the colored film 104 in a ring shape hardly having a light transmission property is formed by evaporating an aluminum metal. A light is transmitted to a portion inside the colored film 104 in a ring shape, that is, the first transmission colored film 102. A compact solar cell 19 of 10 mm×10 mm is disposed under the first transmission colored film 102.

The first transmission colored film 102 formed on the bottom surface of the light transmission substrate 101 is made of a paint film (including a printing film and a coating film) to which the copper metal powder, the copper alloy metal powder (such as brass) or the like has been compounded.

In this case, the copper metal powder is compounded to the first transmission colored film 102 in such a manner that a light transmittance thereof is in the range of 80 to 90%. Consequently, the first transmission colored film 102 is extremely thin, and a gold color tone is displayed from the first transmission colored film 102.

The satin pattern 101b formed on the bottom surface of the light transmission substrate 101 is a satin pattern with a fine texture similar to that of the satin patterns in accordance with the above embodiments 5 to 7.

The reflection polarizing plate 105 is equivalent to the reflection polarizing plate 35 that is used in the above second embodiment and that is capable of obtaining a gold color tone with a gloss from a reflected light.

For the display plate 100 for a watch with such a configuration, a metal color of a white color tone is visible in the colored film 104 that has been formed by an evaporated film of an aluminum metal and that hardly has a light transmission property. A gold color tone without a gloss is visible in the first transmission colored film 102 inside the colored film 104.

A strong reflected light of the reflection polarizing plate 105 is extinguished by the satin pattern 101b with a fine texture and is changed to a light without a gloss.

Consequently, the entire display plate 100 for a watch becomes a bright display plate having a calm atmosphere by a combination of a white color tone and a gold color tone.

The upper surface side of the light transmission substrate 101 section under which the colored film 104 with a white color tone is formed is a location on which an index is formed. Therefore, in the case in which a metal time character with a gold color tone is bonded to the location, the index is vividly visible.

Since the display plate 100 for a watch in accordance with this embodiment has such a configuration, two kinds of metal colors with different color tones can appear on the surface of the display plate.

In such a manner that a light transmittance does not affect an electric power generation in the solar cell 19, two or three kinds of metal evaporated films with different color tones can be formed, thereby making a surface of the display plate capable of obtaining a plurality of metal colors. Moreover, the colored film 104 hardly having a light transmission property is not restricted to a metal evaporated film, and can also be a printing film.

In this embodiment, the time character and so on formed on the light transmission substrate 101 function as a decorative member in accordance with the present invention. In this case, the first transmission colored film 102 formed on the bottom surface of the light transmission substrate 101, the satin pattern 101b, and the colored film 104 in a ring shape formed on the outer periphery side of the first transmission colored film 102 also have a decorative function.

Embodiment 10

Figure 14:
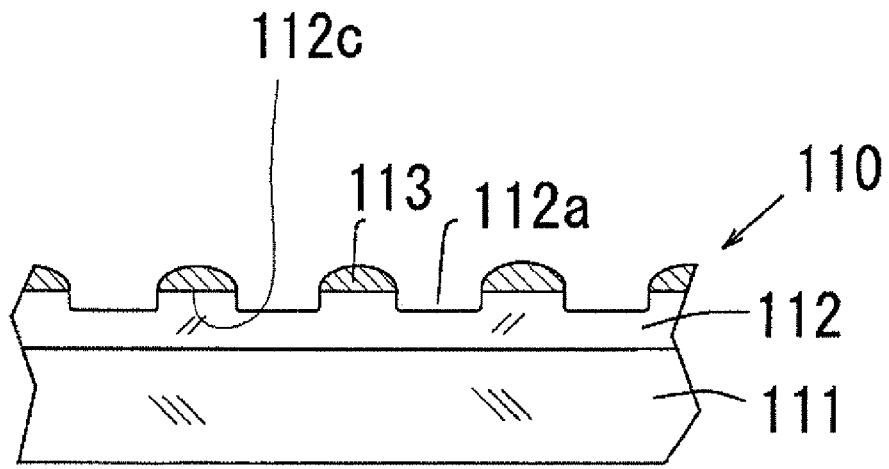
FIG. 14 is a pivotal partially cross-sectional view of a tenth embodiment of the display plate for a solar cell device in accordance with the present invention.

FIG. 14 is a pivotal partially cross-sectional view of a tenth embodiment of the display plate for a solar cell device in accordance with the present invention.

As shown in FIG. 14, a display plate 110 for a watch in accordance with this embodiment is composed of a light transmission substrate 111, a pattern member 112 formed on the light transmission substrate 111, and a transparent resin film 113 formed on a convex portion 112c of the pattern member 112.

In FIG. 14, a light transmission reflecting plate is not shown to facilitate the description.

Here, in the case in which the light transmission substrate 111 has a light transmission property, the material of the light transmission substrate 111 is not restricted in particular similarly to the light transmission substrate 21 in accordance with the above first embodiment. For instance, a transparent resin such as a polycarbonate resin and an acrylic resin (including a molded plastic material), a glass, a sapphire glass, and a ceramic can also be used as a material thereof. The light transmission substrate 111 is thickened to a certain degree to have rigidity.

Moreover, a surface treatment such as a coating, a printing, and plating can also be carried out for the light transmission substrate 111.

The pattern member 112 is made of a decorative material such as a seashell, a glass, a ceramic, a stone such as a marble, a noble stone such as an agate, an onyx, and an opal. The decorative material is formed to have a required thickness.

The pattern member 112 is provided with a concave portion 112a, which is formed by chipping the pattern member 112 using a digging method such as an etching, a machining, and a laser beam machining.

More specifically, as described later, a gap portion between the transparent resin films 113 formed adjacently to each other in a pattern shape is chipped by an etching to form a concave portion.

A depth of the concave portion 112a can be freely adjusted based on an etching time, and can be set corresponding to the specifications.

The transparent resin film 113 is not restricted in particular. However, the transparent resin film 113 can be formed by a transparent resin such as an acrylic resin, an epoxy resin, and a urethane resin.

In some cases, the transparent resin film 113 can be formed by compounding an ultraviolet light absorber.

The transparent resin film 113 is formed by a publicly known printing method and has a thickness of at least 8 μm. The building up of at least 8 μm enables an edge portion of a printed paint film (an end of a rising portion of a paint film) to be rounded, thereby obtaining a paint film in a round helmet shape.

In the case in which such a round helmet shape appears, as shown in FIG. 14, the transparent resin film 113 can be in a hemispherical lens shape. By the lens effect, the transparent resin film 113 is visually thick, and has a great stereoscopic sense.

Consequently, a section in which the transparent resin film 113 is formed configures a convex portion. By the above lens effect, the convex portion is visually thicker than the actual size, and has a greater stereoscopic sense.

Even in the case in which a depth of a concave portion 112a of the pattern member 112 is small, a height of the concave and convex portion is visually large by the convex portion in a round helmet shape of the transparent resin film 113. In place of the transparent resin film 113, a colored resin film can also be formed.

Figure 15:
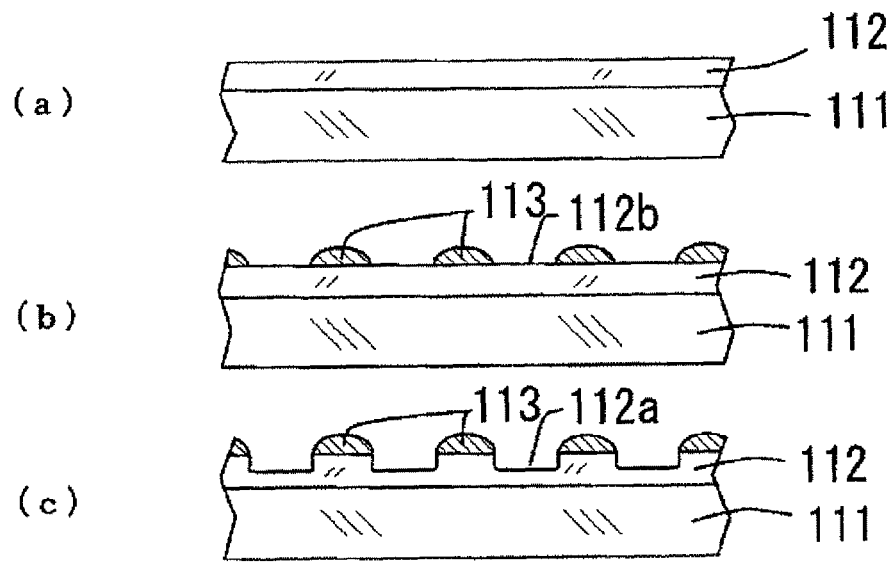
FIGS. 15(a)-(c) represent a schematic flow sheet for illustrating a manufacturing method of the display plate for a solar cell device shown in FIG. 14.

A manufacturing method of the display plate 110 for a watch having such a configuration is described below with reference to FIG. 15.

First, as shown in FIG. 15(a), the light transmission substrate 111 and the pattern member 112 are bonded to each other via an adhesive. In this case, an adhesive is not restricted in particular, and an epoxy resin adhesive and an acrylic resin adhesive can be used for instance.

As a method for bonding the light transmission substrate 111 and the pattern member 112, a transparent pressure sensitive adhesive double coated tape can be used.

Next, as shown in FIG. 15(b), the transparent resin film 113 is formed on the pattern member 112 bonded to and fixed to the light transmission substrate 111 by a method such as a screen printing using a transparent resin in such a manner that the transparent resin film 113 becomes a pattern partially including a gap (an exposed face 112b of the pattern member 112).

In the case in which the transparent resin film 113 is formed by a printing after the pattern member 112 is fixed to the light transmission substrate 111, a handling is facilitated and damages to the pattern member 112 can be reduced since the light transmission substrate 111 has rigidity.

In this case, the transparent resin film 113 must have a thickness of at least 8 μm. In the case of a screen printing, printing of at least one time enables a thickness of at least 8 μm to be obtained. Consequently, at least one printing can ensure a thickness that conforms to the design specifications. In the case in which the transparent resin film 113 is formed to be thicker, printing of at least two times is preferably carried out.

Moreover, the transparent resin film 113 is formed to have a pattern in such a manner that a gap 112b can be obtained. Such a pattern is not restricted in particular. However, the pattern is, for instance, a circle pattern, a lattice pattern, a stripe pattern, a stitch pattern, a geometric pattern, or a mosaic pattern.

In the case in which the transparent resin film 113 is formed to have a pattern as described above, a finish of the display plate 110 is beautiful and a decorative effect is improved.

A pattern of the transparent resin film 113 can also be a pattern other than the above patterns. As described above, the transparent resin film 113 section having the pattern enables a convex portion with a thickness of at least 8 μm to be formed.

As a method for forming the pattern of the transparent resin film 113, the pattern can be formed by an exposure and a development using a publicly known photoresist film.

Next, as shown in FIG. 15(c), at the section other than a section on which the transparent resin film 113 has been formed, that is, the exposed face 112b in which the surface of the pattern member 112 is exposed, the pattern member 112 is chipped by an etching with an etchant to form the concave portion 112a having a predetermined depth, thereby obtaining the concave and convex pattern.

An etchant is selected depending on a material of the pattern member 112. In the case in which the pattern member 112 is a seashell, it is preferable to carry out an etching at a normal temperature using an etchant having a composition of the 1 to 5% solution of hydrochloric acid (hydrochloric acid of 1 to 5% and the other component is water).

It is preferable to mix a surface active agent of approximately 0.3% to remove a gas bubble that has been generated.

In the case in which the pattern member 112 is a glass, it is preferable to carry out an etching at a normal temperature using a composition solution of hydrofluoric acid of 330 g, water of 100 g, and sulfuric acid of 20 g.

Moreover, in the case in which alumina ($Al_2O_3$) ceramic is used as the pattern member 112, it is preferable to carry out an etching under the heated condition in the range of 70 to 80° C. using a composition solution of hydrofluoric acid of 330 g, water of 100 g, and sulfuric acid of 20 g.

As an etching amount of such an etchant, in the case of a seashell, an etching in the range of 8 to 10 μm is carried out by dipping in a hydrochloric acid solution of 1% for one minute. Consequently, since a considerable amount is chipped for a comparatively short time, a sufficient time control is required.

As described above, the concave portion 112a is formed by etching only the pattern member 112. The transparent resin film 113 is not corroded by an etchant and maintains the initial form thereof.

By the above manufacturing method, the concave and convex pattern provided with a concave portion and a convex portion can be formed.

Consequently, by using such a manufacturing method, the concave and convex pattern can be formed on the pattern member 112 in only two processes composed of a printing process of the transparent resin film 113 and an etching process of the pattern member 112. Therefore, the display plate can be fabricated at an extremely low cost. Moreover, a particular apparatus is not required, thereby reducing a facility cost.

In this embodiment, the concave portion is formed by using an etching method as a digging method. However, for instance, the concave and convex pattern can also be formed by a machine engraving in which a cutting tool is attached to a machine to carry out a digging or by a laser digging in which a laser apparatus is used to carry out a digging.

In this case, the convex portion is formed on the pattern member 112 by the transparent resin film 113. Consequently, the quality senses of a color and a gloss property of the surface of the pattern member 112 are visible through the transparent resin film 113.

Consequently, since the convex portion and the concave portion have the identical color and the identical quality sense, and the portions are visible without losing the quality sense of a decorative member.

In the present invention, as the transparent resin film 113, a colored resin film can also be formed in place of the transparent resin. In this case, as a colored resin film, two kinds of a film having a light transmission property and a film that does not have a transmission property can be adopted.

In the case in which a resin film that is slightly colored and that has a light transmission property is formed as the transparent resin film 113, a color of the pattern member 112 is reflected and mixed to the color of the resin since the resin film has a light transmission property.

By this, the section of the transparent resin film 113 displays a different color while slightly keeping the color of the pattern member 112.

In the case in which a color that makes a beautiful contrast with the color of the pattern member 112 is selected as a color of the colored resin for the transparent resin film 113, the color of the pattern member 112 can be strongly set off.

Consequently, a natural color of the pattern member 112 at the concave portion 112a of the pattern member 112 and a color that is set off at the convex portion appear being accompanied by a subtle quality sense, thereby further improving a decorative effect.

In the case in which a resin film that does not have a light transmission property is formed as a colored resin film of the transparent resin film 113, a color of the pattern member 112 and a color of the colored resin film are mixed to each other to obtain a decorative combination color.

On the other hand, in the case in which a resin film having a color that sets off the color of the pattern member 112 is formed as a colored resin film of the transparent resin film 113, a decorative effect can be improved and a new design can be obtained.

Moreover, in the case in which the transparent resin film 113 is formed having a thickness of at least 8 µm to make a paint film (including a printing film and a coating film) in a round helmet shape, the concave and convex pattern looks like being enlarged and having a stereoscopic sense. As a result, a pattern having a beautiful color and a stereoscopic sense appears, thereby extremely improving a decorative effect.

By using a decorative material such as a seashell and a glass that have a light transmission property as the pattern member 112 and by using a member such as a plastic and a glass that have a light transmission property as the light transmission substrate 111, a display plate for a solar cell watch can be satisfactorily used.

In this embodiment, the transparent resin film 113 remains on the convex portion of the pattern member 112. However, depending on a design, the entire of the transparent resin film 113 can also be removed, or the transparent resin film 113 can be partially removed selectively.

In this embodiment, the concave and convex of the pattern member 112, the transparent resin film 113, and the index that are formed on the light transmission substrate 111 and so on function as a decorative member in accordance with the present invention.

Embodiment 11

FIG. 16(a) is a plan view showing an eleventh embodiment of the display plate for a solar cell device in accordance with the present invention, and FIG. 16(b) is a pivotal partially cross-sectional view thereof.

Figure 16:
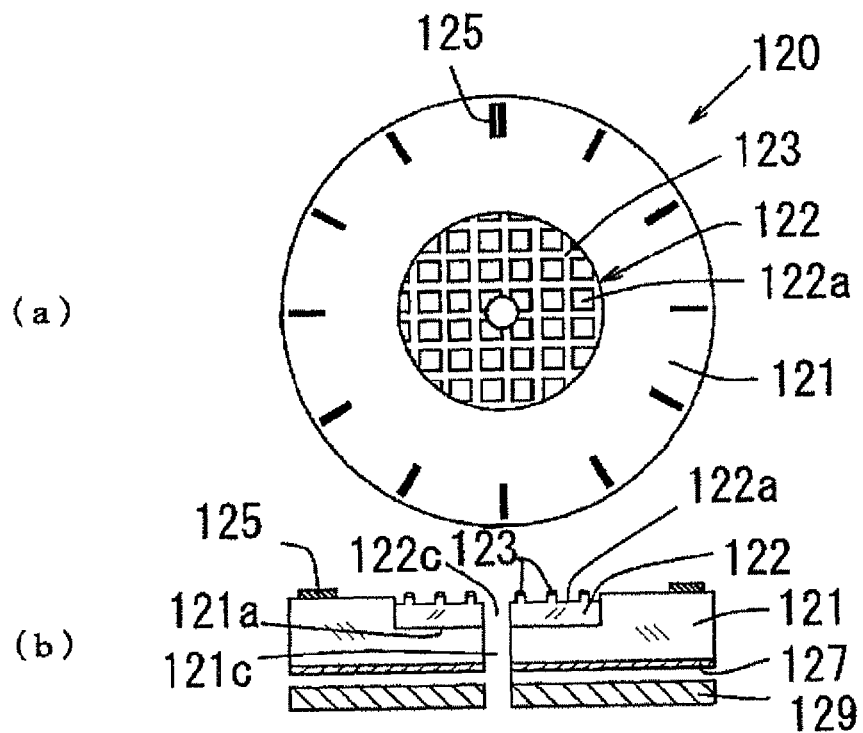
FIG. 16(a) is a plan view showing an eleventh embodiment of the display plate for a solar cell device in accordance with the present invention.
FIG. 16(b) is a pivotal partially cross-sectional view thereof.

As shown in FIG. 16, a display plate 120 for a watch in accordance with this embodiment is provided with a light transmission substrate 121 made of a plastic having a light transmission property. A concave portion 121a is formed at the center of the light transmission substrate 121, and a pattern member 122 made of a seashell or the like is bonded to the concave portion 121a via an adhesive.

An index 125 that is a time character formed by a printing method or the like is disposed at the peripheral region on the surface of the light transmission substrate 121. A light transmission reflecting plate 127 is formed on the bottom surface of the light transmission substrate 121.

Moreover, a solar cell 129 is disposed under the display plate 120 for a watch. Consequently, the display plate 120 is a display plate for a solar watch.

As shown in FIG. 16(b), the pattern member 122 is provided with the concave and convex pattern formed in a lattice pattern. A convex portion is configured by forming a colored resin film 123, and a concave portion 122a is configured by chipping the pattern member 122 using an etching that is a digging method.

In this case, it is preferable that the light transmission substrate 121 is made of a plastic material having a light transmission property. As the material thereof, there can be used, for instance, a polycarbonate resin, a polyimide resin, a polyethylene resin, a polystyrene resin, a polypropylene resin, a polyethylene terephthalate resin, and an acrylic resin, which have a heat resistance, a humidity resistance, a chemical resistance, and an impact resistance.

In this embodiment, a polycarbonate resin that has been slightly colored is used. The colored resin is used as the light transmission substrate 121 to improve a decorative effect and to cause a generic deep violet color of the solar cell 129 to be not conspicuous. The colored resin is formed by slightly compounding a pigment or the like to a resin in such a manner that a light transmittance does not lose an electric power generation in the solar cell.

The light transmission substrate 121 is formed by an injection molding method to be used as a display plate for a watch in such a manner that the thickness is approximately 0.5 mm.

As shown in FIG. 16(b), the concave portion 121a is formed at the center of the light transmission substrate 121, and a center hole 121c is formed at the center of the concave portion 121a. In this case, the concave portion 121a is formed to dispose the pattern member 122, and the center hole 121c is formed to attach a hand. It is preferable to form the concave portion 121a and the center hole 121c by an injection molding method.

In this embodiment, a white pearl oyster shell is used for the pattern member 122. A seashell, which has a photoluminescence and a color peculiar to a seashell, can be satisfactorily used as a decorative member.

In this case, a black pearl oyster shell and an ear shell can also be used as a seashell in addition to a white pearl oyster shell. The pattern member 122 made of a seashell is provided with a small hole 122c for attaching a hand at the center. It is preferable to form the small hole 122c by a grinding method or the like.

The pattern member 122 made of a seashell and formed to have a required thickness and a required diameter by a grinding method or the like is bonded to and fixed to the concave portion 121a of the light transmission substrate 121 via an adhesive.

It is preferable to set the dimensions of those members in advance in such a manner that the surface of the pattern member 122 and the surface of the light transmission substrate 121 are in the same face in the case in which the pattern member 122 is bonded to and fixed to the concave portion.

For the pattern member 122 made of a seashell, the colored resin film 123 is formed in a pattern shape on the surface of the pattern member 122, and the concave portion 122a is formed by etching the pattern member 122 section on which the colored resin film 123 is not formed while using an etchant.

In this case, it is preferable to carry out an etching at a normal temperature using an etchant of the 1 to 5% solution of hydrochloric acid (hydrochloric acid of 1 to 5% and the other component is water). In the case in which a surface active agent of approximately 0.3% is mixed to the etchant to remove a gas bubble that has been generated, a uniform etching shape can be preferably obtained.

A depth of a concave portion 122a is determined depending on a concentration of the etchant and the time of dipping. For instance, in the case in which a dipping is carried out for one minute at a normal temperature using the 1% solution of hydrochloric acid, an etching in the range of 8 to 10 μm can be performed.

An etching time can be shortened by using an etchant with a high concentration. However, an etched surface is made rough. Consequently, it is preferable to set a concentration of a solution and time in such a manner that a beautiful etched surface can be obtained.

By doing such a setting, the pattern member 122 section on which the colored resin film 123 is not formed is etched by an etchant, and is gradually chipped while increasing a depth to form the shape provided with a concave portion.

The concave portion 112a that has been formed by chipping the pattern member as described above can clearly display a photoluminescence and a color peculiar to a seashell without deterioration. It is preferable to mask the small hole 122c of the pattern member 122 by a resin plug prior to an etching.

In this embodiment, the colored resin film 123 is a permeable resin film that has been formed by a screen printing method using a slightly colored resin.

Moreover, the colored resin film 123 is formed in a lattice pattern. In this case, by forming the pattern member 122 to have a pattern, the finished pattern member 122 can display an extremely beautiful and well-regulated decorative effect.

The pattern of the colored resin film 123 is not restricted to the above lattice pattern. Various patterns such as a circle pattern, a lattice pattern, a stripe pattern, a stitch pattern, a geometric pattern, a mosaic pattern, and a radial pattern can also be selected.

The colored resin film 123 is preferably formed to have a thickness of at least 8 μm. The building up of at least 8 μm enables an edge portion of a printed paint film (an end of a rising portion of a paint film) to be rounded, thereby obtaining a paint film in a round helmet shape. In the case in which such a round helmet shape appears, the colored resin film 123 is visually thick, and has a great stereoscopic sense. Consequently, a section in which the colored resin film 123 is formed configures a convex portion. The convex portion is visually thicker than the actual size, and has a greater stereoscopic sense.

In this embodiment, the colored resin film 123 is formed by using a resin that is slightly colored to be white and that has a light transmission property. This is caused by using a white pearl oyster shell as the pattern member 122.

More specifically, a white pearl oyster shell and an ear shell have a color like a yellow in a photoluminescence. Consequently, having the color like a yellow causes a vividness of a color to be lost. In the case in which the color like a yellow fades or disappears, a vividness of a color appears.

Consequently, in the case in which the light transmission colored resin film 123 that has been slightly colored to be white is formed on the pattern member 122 made of a white pearl oyster shell, the color like a yellow of a seashell disappears and a vivid color appears without a color like a yellow. By this, the convex portion on which the colored resin film 123 has been formed has a vivid color of a seashell of the pattern member 122.

In this case, it is preferable that a color shade of the colored resin is set depending on a kind of the pattern member 122 and a color that sets off the color of the pattern member 122 is selected.

As described above, in the case in which the colored resin film 123 that sets off the color of the pattern member 122 is formed, a color degree of the pattern member 122 is improved and a decorative effect is also improved.

The colored resin film 123 is not restricted to a light transmission colored resin film, and can be a colored resin film without a light transmission property. In this case, the convex portion composed of the colored resin film 123 does not have a color of the pattern member 122 but has a color of the colored resin film 123.

The index 125 such as a time character is formed by a pad printing method using a black ink in the embodiment 1. A method for forming the index 125 is not restricted to a printing method. The index 125 can also be formed by other methods such as bonding a metal index, a stone or the like as a bonding composition.

Moreover, the light transmission reflecting plate 127, which is a light semi-permeable reflecting plate, is a film that has the both functions of a light transmission property and a reflecting property. The light transmission reflecting plate 127 is formed to soften a deep violet color of the solar cell 129 and to make a color of the display plate 120 as vivid as possible.

Consequently, it is preferable that the light transmission reflecting plate 127 is a light semi-permeable reflecting plate and is made of a material having a high reflectance. In this embodiment, the light transmission reflecting plate 127 is made of an aluminum evaporated film having a transmission property. However, the light transmission reflecting plate 127 is not restricted to an aluminum evaporated film, and can also be a silver metal thin film or a white coating film having a transmission property. Moreover, as described in other embodiments, a reflection polarizing plate can also be used as the light transmission reflecting plate 127.

The display plate 120 for a watch configured as described above induces an electric power generation in the solar cell 129 by a transmission of required lights.

A deep violet color of the solar cell 129 can be softened by the action of the light transmission reflecting plate 127 and the light transmission substrate 121.

Since a seashell is used as the pattern member 122, a color with a photoluminescence peculiar to a seashell and a vivid color adjusted by the colored resin film 123 appear, thereby obtaining a decorative effect with quality senses subtly different.

The pattern member 122 made of a seashell has a concave and a convex that form a lattice pattern, thereby obtaining an improved decorative effect and creating sophistication.

Moreover, the formation of a concave and a convex of the pattern member 122 can be carried out by two processes of forming the colored resin film 123 and forming the concave portion 122a by an etching, thereby extremely reducing a manufacturing cost.

In this embodiment, a concave and a convex of the pattern member 122, the colored resin film 123, and the index 125 such as a time character that are formed on the light transmission substrate 121 function as a decorative member in accordance with the present invention.

Embodiment 12

Figure 17:
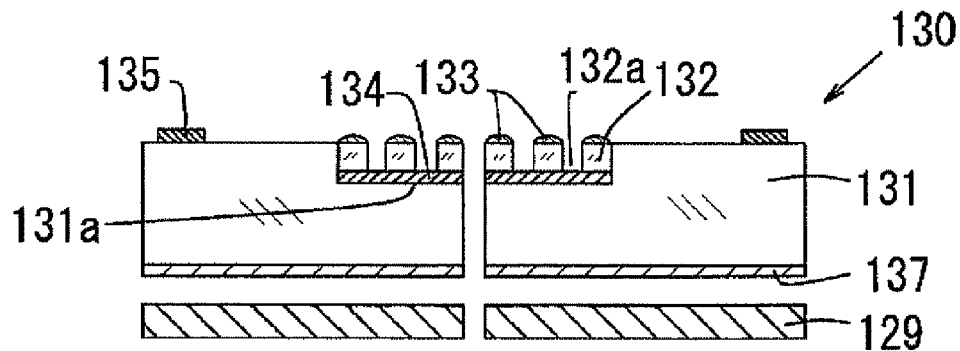
FIG. 17 is a pivotal partially cross-sectional view of a twelfth embodiment of the display plate for a solar cell device in accordance with the present invention.

FIG. 17 is a pivotal partially cross-sectional view of a twelfth embodiment of the display plate for a solar cell device in accordance with the present invention.

As shown in FIG. 17, a display plate 130 for a watch in accordance with this embodiment is a display plate for a solar watch and a solar cell 129 is disposed under the display plate.

The display plate 130 for a watch in accordance with this embodiment is colored to be blue and is provided with a light transmission substrate 131 made of a resin having a light transmission property. A concave portion 131a is formed at the center of the light transmission substrate 131.

A reflecting film 134 is formed on the bottom surface of the concave portion 131a of the light transmission substrate 131. A pattern member 132 made of a seashell or the like is formed to the reflecting film 134 in such a manner that the pattern member 132 is fitted into the concave portion 131a of the light transmission substrate 131. A transparent resin film 133 in a pattern shape is formed on the pattern member 132.

Moreover, the index 135 such as a time character is formed on the light transmission substrate 131. The light transmission reflecting plate 137, which is a light semi-permeable reflecting plate, is formed on the bottom surface of the light transmission substrate 131.

The pattern member 132 in accordance with this embodiment is made of a seashell such as a white pearl oyster shell and an ear shell. The transparent resin film 133 with a thickness of at least 8 µm is formed in a mesh pattern on the surface of the pattern member 132 made of a seashell.

A through hole 132a is formed in the pattern member 132 by chipping the pattern member 132 section that corresponds to the square of a mesh of the transparent resin film 133 using an etching that is a digging method.

Consequently, the reflecting film 134 disposed below is visible via the through hole 132a. A color with a photoluminescence of the pattern member 132 disposed below and made of a seashell is visible via the transparent resin film 133.

Therefore, for the pattern member 132, a color of a seashell is visible via the transparent resin film 133 at a section that corresponds to a net of a mesh, and a color of the reflecting film 134 is visible at a section that corresponds to the square of a mesh.

It looks like that the both colors have a clear difference of elevation (step), and a stereoscopic sense appears in such a manner that a seashell looks as if it was embossed.

In this case, it is preferable to carry out an etching at a normal temperature using an etchant of the 1 to 5% solution of hydrochloric acid (hydrochloric acid of 1 to 5% and the other component is water). In the case in which a surface active agent of approximately 0.3% is mixed to the etchant to remove a gas bubble that has been generated, a uniform etching shape can be preferably obtained.

It is preferable to use the reflecting film 134 having a color tone that sets off a color with a photoluminescence of a seashell forming the pattern member 132. In the case in which a white paint film is used for instance, a color like a yellow of a seashell fades and a color of the seashell looks like having vividness.

However, the reflecting film 134 is not restricted to a white paint film, and can have another color that sets off a color of a seashell forming the pattern member 132. For instance, in the case in which a metal film made of aluminum or silver is used as the reflecting film 134, the reflecting film 134 can have a high reflectance and can vividly set off a color with a photoluminescence.

The light transmission substrate 131 is formed based on the specifications equivalent to those of the light transmission substrate 121 in accordance with the above eleventh embodiment. More specifically, the light transmission substrate 131 is formed by an injection molding method using a colored polycarbonate resin. During the injection molding, the concave portion 131a is simultaneously formed.

In this embodiment, the index 135 such as a time character is formed by bonding a metal index formed by an electroforming method.

In this embodiment, a light semi-permeable reflecting plate made of an aluminum evaporated film having a transmission property, a silver metal thin film, or a white coating film having a transmission property is used as the light transmission reflecting plate 137.

However, as the light transmission reflecting plate 137, a reflection polarizing plate can also be used similarly to the reflection polarizing plate 25 in accordance with the above first embodiment.

In the display plate 130 for a watch configured as described above, for the pattern member 132 made of a seashell, a color with a photoluminescence peculiar to a seashell appears at a section of the transparent resin film 133 formed in a mesh pattern, and a color of the reflecting film 134 appears at a section that corresponds to the square of a mesh.

Consequently, a decorative effect caused by a color of a seashell and a color of the reflecting film 134 can be obtained. The colors appear having a difference of elevation, thereby obtaining a stereoscopic sense.

Therefore, by the display plate 130 for a watch in accordance with this embodiment, a display plate with an improved decorative effect in a mesh pattern and having a stereoscopic sense can be obtained. Moreover, a deep violet color of the solar cell 129 can be softened by the action of the light transmission reflecting plate 137 and the colored light transmission substrate 131.

In this embodiment, a concave and a convex of the pattern member 132, the transparent resin film 133, the reflecting film 134, and the index 135 such as a time character that are formed on the light transmission substrate 131 function as a decorative member in accordance with the present invention.

Embodiment 13

Figure 18:
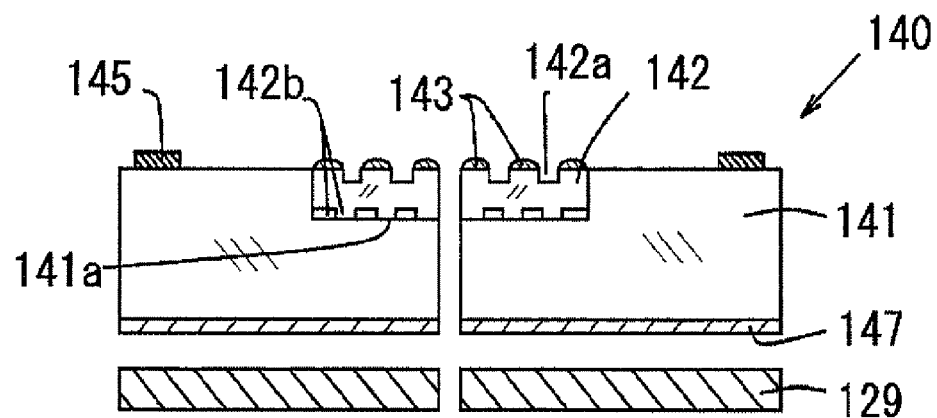
FIG. 18 is a pivotal partially cross-sectional view of a thirteenth embodiment of the display plate for a solar cell device in accordance with the present invention.

FIG. 18 is a pivotal partially cross-sectional view of a thirteenth embodiment of the display plate for a solar cell device in accordance with the present invention.

As shown in FIG. 18, a display plate 140 for a watch in accordance with this embodiment is a display plate for a solar watch and a solar cell 129 is disposed under the display plate.

The display plate 140 for a watch in accordance with this embodiment is colored and is provided with a light transmission substrate 141 made of a resin having a light transmission property. A concave portion 141a is formed at the center of the light transmission substrate 141.

A pattern member 142 made of a seashell or the like is formed in such a manner that the pattern member 142 is fitted into the concave portion 141a of the light transmission substrate 141. A transparent resin film 143 in a pattern shape is formed on the pattern member 142.

Moreover, the index 145 such as a time character is formed on the light transmission substrate 141. On the other hand, the light transmission reflecting plate 147 is formed on the bottom surface of the light transmission substrate 141.

The light transmission substrate 141, the transparent resin film 143, the index 145, and the light transmission reflecting plate 147 that are used in this embodiment are formed based on the specifications equivalent to those of the components in accordance with the above twelfth embodiment. Consequently, the descriptions of the specifications for the components having the equivalent specifications are omitted.

The pattern member 142 in accordance with this embodiment is made of a seashell such as a white pearl oyster shell and an ear shell. The pattern member 142 is thin and has a light transmission property. In the case in which the pattern member 142 has a thickness of 0.1 mm, a light transmittance of approximately 50% can be obtained.

The transparent resin film 143 with a thickness in the range of 20 to 30 μm is formed in a mesh pattern on the surface of the pattern member 142 made of a seashell.

A concave portion 142*a* with a depth in the range of 20 to 30 μm is formed in the pattern member 142 by chipping the pattern member section that corresponds to the square of a mesh in which the transparent resin film 143 is not formed while using an etching that is a digging method.

On the other hand, as shown in FIG. 18, the second concave and convex pattern 142*b* is formed on the bottom surface (rear face) of the pattern member 142. In the case in which the second concave and convex pattern 142*b* is formed on the rear face of the pattern member 142 as described above, the second concave and convex pattern 142*b* formed on the rear face is visible in a watermark pattern by a reflecting action from the light transmission reflecting plate 147 formed on the bottom surface of the light transmission substrate 141.

It is preferable that the concave portion 142*a* on the top side of the light transmission substrate 141 is formed by an etching at a normal temperature using an etchant of the 1 to 5% solution of hydrochloric acid (hydrochloric acid of 1 to 5% and the other component is water). In the case in which a surface active agent of approximately 0.3% is mixed to the etchant, a uniform etching shape can be preferably obtained.

It is preferable that the second concave and convex pattern 142*b* on the bottom side of the light transmission substrate 141 is formed by using the same etchant in advance.

In this embodiment, the transparent resin film 143 that configures a convex portion is formed to have a thickness in the range of 20 to 30 μm, and the concave portion 142*a* on the top side of the light transmission substrate 141 is formed to have a depth in the range of 20 to 30 μm. Consequently, the concave and convex step of the concave and convex portion is made large to be in the range of 40 to 60 μm.

The second concave and convex pattern 142*b* is formed on the bottom surface of the pattern member 142. Consequently, in the case in which the concave and convex step of the concave and convex pattern that is a mesh pattern on the top side is not made large, a height of the concave and convex is not remarkable. Therefore, the concave and convex step is formed largely in this embodiment.

In the display plate 140 for a watch configured as described above, for the pattern member 142 made of a seashell, a vivid color peculiar to a seashell appears in a mesh pattern on the top side. Moreover, since the concave and convex step of the concave and convex of the pattern member 142 is made large, a color appears with a stereoscopic sense imparted having a concave and a convex.

Moreover, the second concave and convex pattern 142*b* formed on the bottom surface of the pattern member 142 slightly appears in a watermark pattern, thereby obtaining a design variation having a new improved decorative effect.

A watermark pattern that appears from the second concave and convex pattern 142*b* can be set off by a method for changing the pattern of the concave and convex pattern on the top side of the pattern member 142 and the pattern of the second concave and convex pattern 142*b* formed on the bottom side or for changing a size of a square of the pattern.

In this embodiment, a concave and a convex of the pattern member 142 formed on the light transmission substrate 141, the transparent resin film 143, the second concave and convex pattern 142*b* formed on the bottom side of the light transmission substrate 141, and the index 145 such as a time character function as a decorative member in accordance with the present invention.

Embodiment 14

Figure 19:
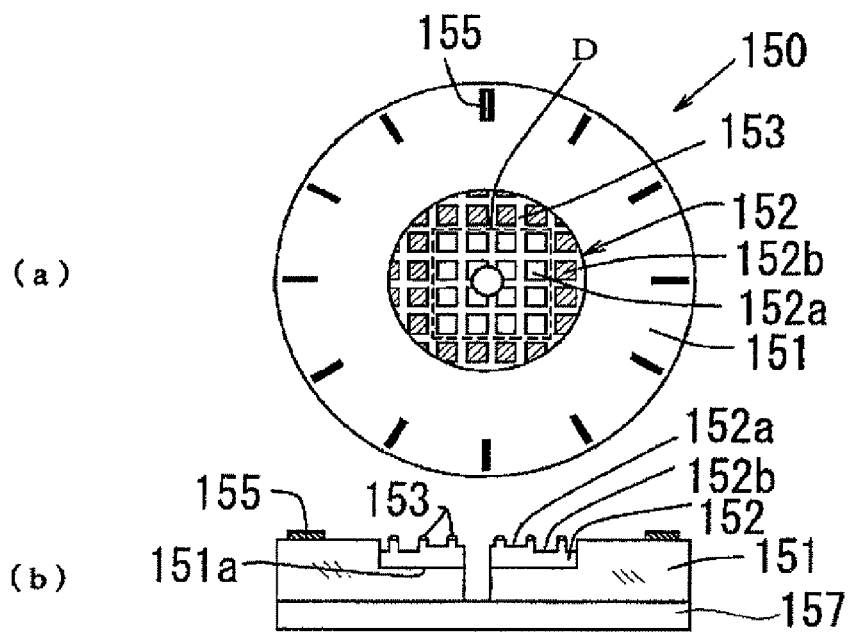
FIG. 19(a) is a plan view showing a fourteenth embodiment of the display plate for a solar cell device in accordance with the present invention.
FIG. 19(b) is a pivotal partially cross-sectional view thereof.

FIG. 19(*a*) is a plan view showing a fourteenth embodiment of the display plate for a solar cell device in accordance with the present invention, and FIG. 19(*b*) is a pivotal partially cross-sectional view thereof.

As shown in FIG. 19, the display plate 150 for a watch in accordance with this embodiment is colored and is provided with a light transmission substrate 151 made of a resin having a light transmission property. A concave portion 151*a* is formed at the center of the light transmission substrate 151.

A pattern member 152 made of a seashell or the like is formed in such a manner that the pattern member 152 is fitted into the concave portion 151*a* of the light transmission substrate 151. A transparent resin film 153 in a pattern shape is formed on the pattern member 152.

Moreover, the index 155 such as a time character is formed on the light transmission substrate 151. On the other hand, the light transmission reflecting plate 157 is formed on the bottom surface of the light transmission substrate 151.

The light transmission substrate 151, the transparent resin film 153, the index 155, and the light transmission reflecting plate 157 that are used in this embodiment are formed based on the specifications equivalent to those of the components in accordance with the above twelfth embodiment. Consequently, the descriptions of the specifications for the components having the equivalent specifications are omitted.

The pattern member 152 in accordance with this embodiment is made of a seashell such as a white pearl oyster shell and an ear shell. The transparent resin film 153 with a thickness in the range of 10 to 20 μm is formed in a lattice pattern on the surface of the pattern member 152, and forms a convex portion.

The pattern member 152 section on which the transparent resin film 153 is not formed (a square section of a lattice in FIG. 19 (*a*)) is chipped by an etching that is a digging method to form a concave portion.

There are two types of depths of concave portions. A concave portion 152*a* with a depth in the range of 10 to 20 μm is formed in a square inside a dotted line D of FIG. 19(*a*), and a concave portion 152*b* with a depth in the range of 40 to 50 μm is formed in a square outside the dotted line D (square containing diagonal lines).

That is to say, the concave portion 152*b* formed in a square outside the dotted line D is deeper than the concave portion 152*a* formed in a square inside the dotted line D by approximately 30 μm.

The concave portion 152*a* and the concave portion 152*b* that have the different depth are preferably formed as described below.

After the transparent resin film 153 is formed in a lattice pattern, a first etching is carried out to the entire of the section on which the transparent resin film 153 is not formed (the square section in FIG. 19(*a*)) by an etchant to form a concave portion with a depth in the range of 10 to 20 μm.

Next, a second etching is carried out to only a square outside the dotted line D, and the square is further chipped by approximately 30 μm to form a concave portion with a depth in the range of 40 to 50 μm.

By the above method, the concave portion formed by the first etching is the concave portion 152*a*, and the concave portion formed by the second etching is the concave portion 152b. Consequently, two types of concave portions that have the different depth are formed.

For an etching method, an etchant of the 1 to 5% solution of hydrochloric acid is dropped to the square section to carry out a selective etching. Moreover, masking can also be carried out for a selective etching.

By the above method, two types of concave portions that have the different depth can be formed. Consequently, a difference in depth enables a photoluminescence and a color of a seashell configuring the pattern member 152 to be subtly changed.

More specifically, a deeper section of a concave portion has a photoluminescence of a less degree and a darker color. This is thought to be caused by a weaker reflected light at a deeper section.

Depending on a viewing angle, a shadow partially appears in a color of a seashell having a concave and a convex, thereby subtly changing the quality sense.

Consequently, a slight brightness contrast is partially imparted to a photoluminescence and a color of a seashell, and appears at a concave portion, thereby subtly changing the quality sense of a seashell. As a result, an effect for enlarging a decorative variation can be obtained.

The effect requires a difference of a certain degree in a depth of a concave portion. In the case of a difference of 10 μm, the above action cannot appear visually. In the case in which a depth of a concave portion has a difference of at least 20 μm, the above action appears.

In this embodiment, concave portions having two kinds of depths are formed. However, depths of concave portions are not restricted to two kinds. Moreover, concave portions with different depths can be formed regardless of a type of a pattern.

In this embodiment, a concave and a convex of the pattern member 152 (in particular, the concave portion 152a and the concave portion 152b that have a different depth), the transparent resin film 153, and the index 155 such as a time character that are formed on the light transmission substrate 151 function as a decorative member in accordance with the present invention.

Embodiment 15

FIG. 20(a) is a plan view showing a fifteenth embodiment of the display plate for a solar cell device in accordance with the present invention, and FIG. 20(b) is a pivotal partially cross-sectional view thereof.

Figure 20:
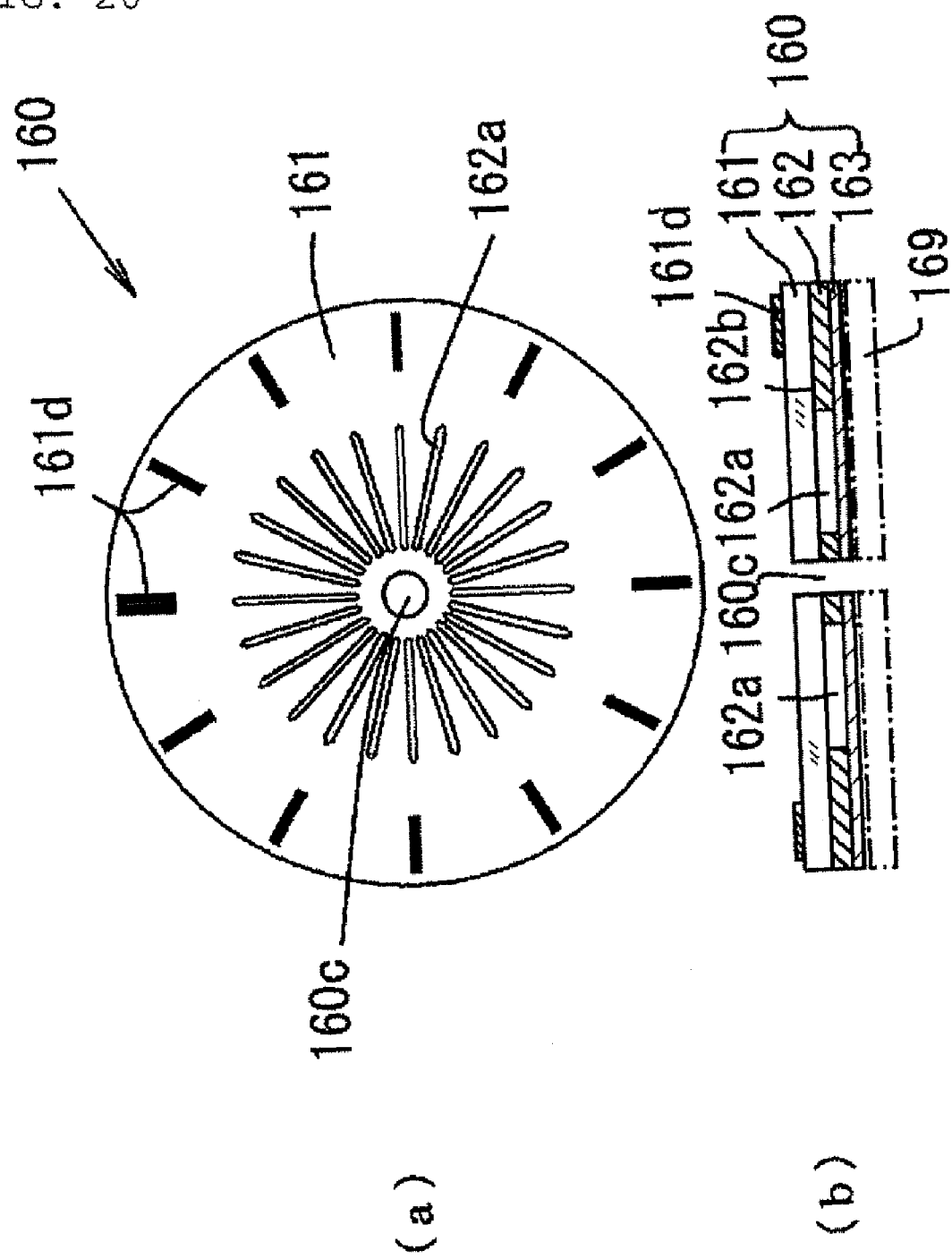
FIG. 20(a) is a plan view showing a fifteenth embodiment of the display plate for a solar cell device in accordance with the present invention.
FIG. 20(b) is a pivotal partially cross-sectional view thereof.

As shown in FIG. 20, a display plate 160 for a watch in accordance with this embodiment is a display plate to be used for a solar watch and is composed of a light transmission substrate 161, a metal plate 162 that is provided with an opening portion 162a and that is formed on the bottom surface of the light transmission substrate 161, and a light transmission reflecting plate 163 formed on the bottom surface of the metal plate 162.

In some configurations, those three components are integrated with each other via an adhesive. In some other configurations, those three components are superposed on each other, positioned, and fixed in a support frame or an inner frame for positioning and fixing a solar cell 169 and a movement without using an adhesive.

The display plate 160 for a watch is provided with a small hole 160c for attaching a hand at the center thereof. The display plate 160 is disposed on the solar cell 169. In FIG. 20, a slight gap is disposed between the solar cell 169 and the display plate 160 for a watch. However, it is not a problem to superpose and dispose the solar cell 169 and the display plate 160 without a gap.

The light transmission substrate 161 is made of a transparent resin or glass, or a sapphire glass. The top surface of the light transmission substrate 161 is a smooth surface. An index 161d indicating a time character is formed on the predetermined position.

The index 161d is preferably formed by a bonding method of a metal index or a printing method using a resin ink.

In this embodiment, the index 161d is indicated by a mark in a bar shape. However, a Roman figure or an Arabic figure can also be used. Moreover, the light transmission substrate 161 can also be provided with marks such as a mark of a brand name and a logo mark in addition to a mark indicating a time character.

Furthermore, a pattern can also be printed and the light transmission substrate 161 can be colored to improve a decorative effect. Patterning and coloring can not only improve a decorative effect but also soften a deep violet color of the solar cell 169 by the color tone.

In the case in which the light transmission substrate 161 is made of a resin, it is preferable to use an excellent material that has an adhesion property, a surface treatment property, a heat resistance, and a humidity resistance. For instance, a polycarbonate resin, a polyethylene resin, a polypropylene resin, a polystyrene resin, a polyethylene terephthalate resin, and an acrylic resin can be mentioned as the material.

In the case in which the light transmission substrate 161 is made of a glass, and a soda glass, a quartz glass, a borosilicate glass, an alkali glass, a normal plate glass, and a sapphire glass can be used for instance. A thickness of the light transmission substrate 161 to be used is in the range of 100 to 400 μm.

The metal plate 162 provided with the opening portion 162a is a metal plate such as a brass plate, a phosphorus bronze plate, a stainless plate, and a nickel silver plate, in which the opening portion 162a is formed.

The opening portion 162a is a portion in which a light is transmitted, and is formed in a radiating pattern and in a long hole shape in this embodiment. However, the shape of the opening portion 162a is not restricted to this shape, and the opening portion 162a can also be in other shapes such as a stripe pattern and a lattice pattern.

The opening portion can also be formed in a numerical shape, a character shaper or a mark shape. Moreover, these shapes can be combined to form the opening portion 162a.

The opening portion 162a is a daylight opening to the solar cell 169. In the case in which the display plate is equally segmented to four regions by the 3-9 o'clock line and the 6-12 o'clock line, and an area of the opening portions in each segmented region is equal to each other, an electric power generation efficiency of the solar cell can be improved.

It is preferable that a size of the opening portion 162a is as small as possible and the opening portions to be formed are as many as possible from a visual aspect in such a manner that a solar cell viewed through the opening portion 162a is not large remarkably.

Since the total area of the opening portions 162a regulates a light transmittance, a certain area of the opening portions is required. A photoelectric conversion efficiency of a recent solar cell has been improved. For some recent solar cells, a sufficient electric power generation amount can be obtained even in the case in which a light transmittance is approximately 15%. Consequently, an area of the opening portions 162a must be set in such a manner that a light transmittance of at least 15% can be obtained.

The opening portion 162a is formed by a punching method or an etching method. The metal plate 162 with a thickness in the range of 50 to 400 μm is used. In the case in which the metal plate 162 is thin or a shape of the opening portion 162a is complicated, an etching method is preferably used.

For instance, in the case in which a brass plate is used, a masking is carried out to sections other than the opening portion 162a and an etching is carried out using a ferric chloride solution (heated to the range of 40° C. to 60° C.) to form the opening portion. In the case in which the metal plate 162 is thick, a punching is effective.

The metal plate 162 has a decorative role as a display plate. Consequently, a top surface 162b has a radial pattern containing minute concaves and convexes, a grain pattern in a stripe shape, a satin pattern or the like.

Moreover, a metal such as nickel, aluminum, chromium, silver, palladium, rhodium, and gold is plated on the pattern.

By carrying out the patterning or plating to the metal plate 162 as described above, a display plate having an improved decorative effect and sophistication in which a noble metal sense appears can be obtained.

An index of a numerical number, a character, or a mark can be formed on the metal plate 162 to enable a functional display of the display plate.

The light transmission reflecting plate 163, which is a light semi-permeable reflecting plate, is a plate that has the both functions of a light transmission property and a reflecting property. A metal thin film is formed on a resin film such as a polyethylene terephthalate resin film and a polyimide resin film by a dry plating method such as a vacuum evaporation method, a sputtering method, and an ion plating method to form a film plate that has the both functions of a light transmission property and a reflecting property. A reflection polarizing plate can be used as the light transmission reflecting plate 163.

For the light transmission reflecting plate 163 on which a metal thin film is formed by a dry plating method, a light transmittance can be set freely by changing a thickness of the metal film.

The light transmission reflecting plate 163 is formed not to make a deep violet color of the solar cell 169 strongly visible. Moreover, the light transmission reflecting plate 163 is formed to reduce lights that are reflected from the solar cell 169 and that are transmitted to the display surface side for outgoing, and to soften a deep violet color by a color tone of the light transmission reflecting plate 163.

As a color tone of the light transmission reflecting plate 163, it is preferable to select a color tone similar to that of the metal plate 162. In the case in which a similar color is used, the opening portion 162a is not conspicuous, and a sense of incongruity does not appear.

A light irradiated to the opening portion 162a of the metal plate 162 is transmitted to the light transmission reflecting plate 163 and is irradiated to the solar cell 169. However, some lights are reflected by the light transmission reflecting plate 163, thereby reducing a light transmittance thereof. Consequently, it is preferable to set a size and an area of the opening portion 162a of the metal plate 162 in consideration of a light transmittance of the light transmission reflecting plate 163 and so on. A thickness of the light transmission reflecting plate 163 to be used is in the range of 50 to 300 μm.

The display plate 160 for a watch in accordance with this embodiment has a configuration in which the metal plate 162 to which the patterning or plating has been carried out and that is provided with an opening portion 162a is formed on the bottom surface of the transparent light transmission substrate 161 on which the index 161d has been formed, and a light semi-permeable reflecting plate that is the light transmission reflecting plate 163 is laminated on the bottom surface of the metal plate 162.

The display plate having an improved decorative effect and a noble metal sense can be obtained by the metal plate 162 to which the patterning or plating has been carried out.

Moreover, the transparent light transmission substrate 161 is formed on the metal plate 162. Consequently, a dignity accompanied by a sinking sense appears in the pattern of the metal plate 162, thereby imparting sophistication.

Furthermore, the index 161d formed on the light transmission substrate 161 has a stereoscopic sense. Furthermore, since the light transmission reflecting plate 163 has a color similar to that of the metal plate 162, the opening portion 162a formed in the metal plate 162 is not conspicuous.

A deep violet color of the solar cell 169 is almost invisible by an operation of the light transmission reflecting plate 163. Lighting via the opening portion 162a formed in the metal plate 162 can induce an electric power generation with a sufficient amount in the solar cell 169.

In this case, for the display plate 160 for a watch in accordance with this embodiment, a thickness of the transparent light transmission substrate 161 is set to be in the range of 100 to 400 μm, a thickness of the metal plate 162 is set to be in the range of 50 to 400 μm, and a thickness of the light transmission reflecting plate 163 is set to be in the range of 50 to 300 μm.

Moreover, a thickness of the display plate 160 for a watch is set to be in the range of 200 to 1100 μm.

In the case in which a thickness of the display plate 160 for a watch is less than 200 μm, the display plate 160 has flexibility and a weak body, thereby easily causing bending or damage. Consequently, a functional problem may easily occur.

Moreover, a thickness of 1100 μm as a thickness of the display plate 160 for a watch is a maximum thickness in which the display plate can be mounted to all general portable watches. In the case in which a thickness of the display plate 160 for a watch is larger than 1100 μm, the display plate cannot be mounted to a watch.

A thickness of the light transmission substrate 161 in the range of 100 to 400 μm, a thickness of the metal plate 162 in the range of 50 to 400 μm, and a thickness of the light transmission reflecting plate 163 in the range of 50 to 300 μm are set in consideration of a thickness of the display plate 160 for a watch set to be in the range of 200 to 1100 μm. In addition, those thicknesses are set in consideration of a facility of handling, processability, and deformability due to processing.

In the case in which a thickness of the light transmission substrate 161 is less than 100 μm, many problems occur. For instance, the resin film has no elasticity, easy handling is not enabled, a printing operation and a cutting operation are difficult, a pattern formed on the metal plate 162 looks sinking, and a stereoscopic visibility of the index or the like formed on the light transmission substrate 161 is deteriorated.

In the case in which a thickness of the light transmission substrate 161 is larger than 400 μm, a space between the index 161d formed on the light transmission substrate 161 and the metal plate 162 is large, and a parallax appears, thereby deteriorating a visual appearance quality.

In the case in which a thickness of the metal plate 162 is less than 50 μm, many problems occur. For instance, rigidity disappears, a processing handling is deteriorated, processability for a press and so on is deteriorated, and a processing deformation appears.

In the case in which a thickness of the light transmission reflecting plate 163 is less than 50 μm, many problems occur. For instance, the plate has no elasticity, easy handling is not enabled, and a dry plating operation and a cutting operation are difficult. On the other hand, in the case in which a thickness of the light transmission reflecting plate 163 is enlarged, a light transmission property is deteriorated.

In this embodiment, the index and so on formed on the light transmission substrate 161 function as a decorative member in accordance with the present invention. In this case, the metal plate 162 provided with the opening portion 162*a* formed on the bottom surface of the light transmission substrate 161 and the surface pattern thereof also have a decorative function.

Embodiment 16

Figure 21:
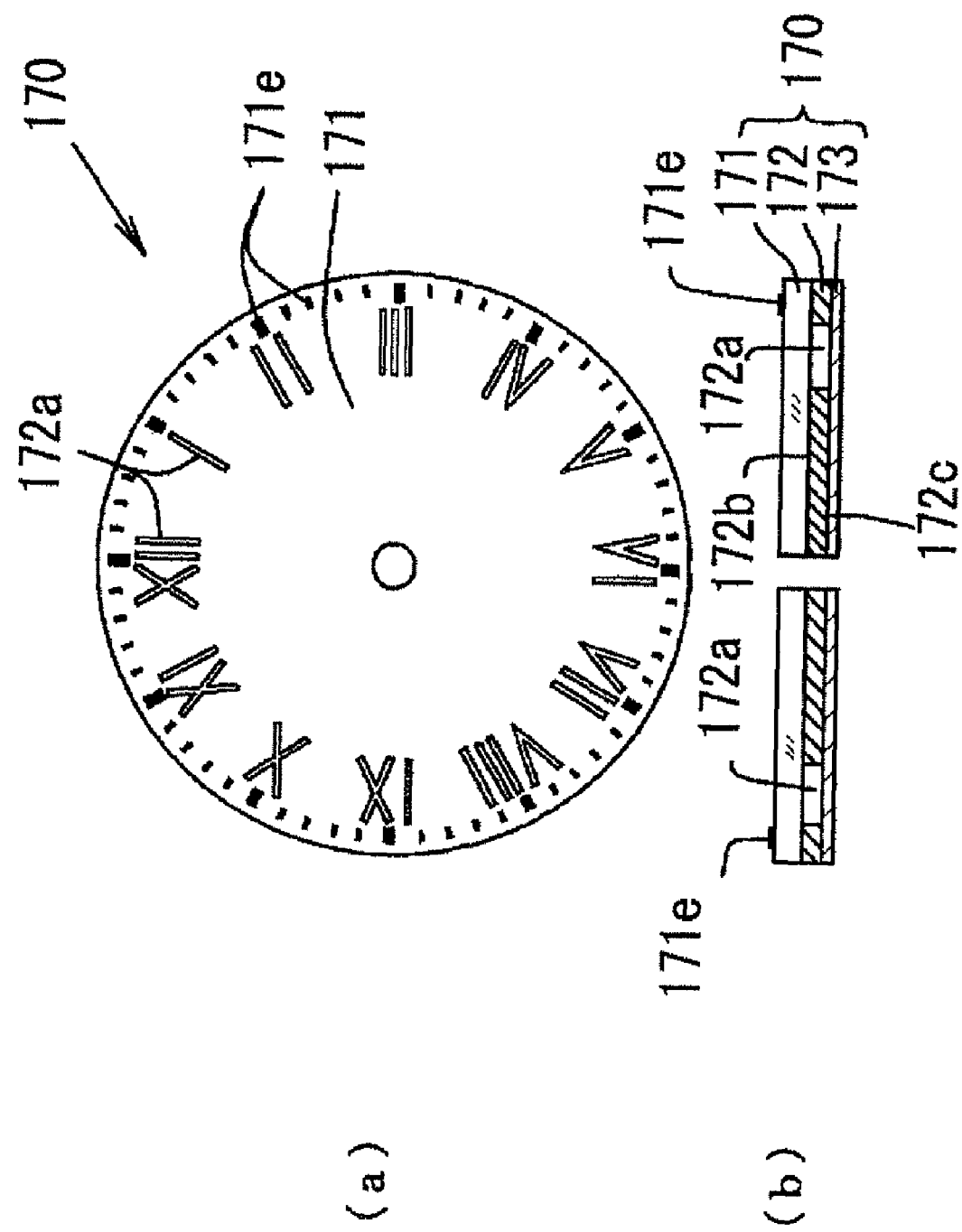
FIG. 21(a) is a plan view showing a sixteenth embodiment of the display plate for a solar cell device in accordance with the present invention.
FIG. 21(b) is a pivotal partially cross-sectional view thereof.

FIG. 21(*a*) is a plan view showing a sixteenth embodiment of the display plate for a solar cell device in accordance with the present invention, and FIG. 21(*b*) is a pivotal partially cross-sectional view thereof.

As shown in FIG. 21, a display plate 170 for a watch in accordance with this embodiment is a display plate to be used for a solar watch and has a configuration in which a transparent light transmission substrate 171, a metal plate 172 that is provided with an opening portion 172*a* and that is formed on the bottom surface of the light transmission substrate 171, and a light transmission reflecting plate 173 formed on the bottom surface of the metal plate 172 are laminated and bonded to each other through an adhesive.

A solar cell is disposed under the display plate 170 for a watch although this is not shown in the figure.

In this case, the light transmission substrate 171 is made of a transparent polycarbonate resin plate having a thickness of 250 μm.

As shown in FIG. 21, a demarcation strip scale 71*e* is formed in a bar mark shape along the outer periphery on the smooth surface of the light transmission substrate 171. The demarcation strip scale 171*e* is formed on the surface of the light transmission substrate 171 by a pad printing method using a black ink.

The metal plate 172 is made of a brass plate or a phosphorus bronze plate having a thickness of 100 μm and is provided with the opening portion 172*a* indicating a time character of a Roman figure including I, II, and III on the periphery, the opening portion 172*a* formed by an etching method.

A radial marking of minute concaves and convexes is carried out to form a radial pattern on a top surface 172*b* of the metal plate 172. A satin composed of minute concaves and convexes is carried out to form a satin pattern on an entire bottom surface 172*c*.

Silver plating is carried out to the entire surface of the metal plate 172 by the electrolytic plating. The metal plate 172 is then covered by a clear paint film.

The radial pattern on the top surface 172*b* of the metal plate 172 is formed to improve a decorative effect. The satin pattern on the bottom surface 172*c* of the metal plate 172 is formed to diffuse a light. The satin face forms a light diffusing layer.

Nickel plating is carried out to the surface of the satin pattern on the bottom surface 172*c* of the metal plate 172 by the electrolytic plating to prevent the metal plate 172 from rusting and to improve a light diffusing property of the metal plate 172. The silver plating is carried out to display a noble metal sense of a silver color. The clear paint film is formed to prevent the silver plate from discoloring and rusting.

A size and an area of the opening portion 172*a* of the metal plate 172 are those by which a light transmission amount enough for an electric power generation of the solar cell can be obtained.

It is preferable to form the opening portion 172*a* of the metal plate 172 by an etching method since the metal plate 172 is thin. More specifically, a resist film is formed on sections other than the opening portion 172*a*, and a section of the opening portion 172*a* on which no resist film is formed is etched by an etchant of ferric chloride (heated to the range of 40° C. to 60° C.) to form the opening portion 172*a*. After the etching, the resist film is removed to obtain the metal plate 172 provided with the opening portion 172*a*. An etching speed can be improved by adding a small amount of hydrochloric acid to the etchant of ferric chloride.

For the radial mark to be formed on the top surface 172*b* of the metal plate 172, a wire rotation brush is applied to the metal plate 172 using a marking apparatus while rotating the metal plate 172 to carry out the radial marking.

The satin pattern to be formed on the bottom surface 172*c* of the metal plate 172 is formed by a sand blasting method or a honing method. For the sand blasting method, sand is blasted under a high pressure using a sand blasting apparatus to make the pattern. For the honing method, glass beads or the like are blasted under a high pressure (1 atmospheric pressure to 4 atmospheric pressures) using a honing apparatus to make the pattern. In the case in which sand or glass beads are blasted to a metal plate under a high pressure as described above, the metal plate is hit, and minute concaves and convexes are generated on the metal plate, thereby forming the satin pattern. A roughness of a concave and a convex is determined depending on a particle size of the sand or the glass bead.

As the light transmission reflecting plate 173, a reflection polarizing plate having a thickness of 130 μm is used. It is preferable to use a reflection polarizing plate similar to the reflection polarizing plate 25 in accordance with the above first embodiment. In this embodiment, a reflection polarizing plate that is capable of obtaining a strong reflected light colored to be silver with a gloss is used.

By the above configuration of the display plate 170 for a watch, the display plate having a radial pattern, a silver color, an improved decorative effect, and a noble metal sense can be obtained.

The opening portion 172*a* indicating a time character formed in the metal plate 172 is hardly conspicuous by an action of the light transmission reflecting plate 173 by which a silver reflected light can be obtained, and a sense of incongruity does not appear.

The radial pattern formed on the metal plate 172 is visible at the bottom of the light transmission substrate 171 having a thickness of 250 μm. Consequently, the visible radial pattern seems to be a pattern having a dignity accompanied by a profundity.

The demarcation strip scale 171*e* formed on the light transmission substrate 171 has a difference of elevation by 250 μm from the metal plate 172 located below. Consequently, the demarcation strip scale 171*e* seems to have a stereoscopic sense.

The light diffusing layer of a satin composed of minute concaves and convexes is formed on the bottom surface 172*c* of the metal plate 172. Consequently, a reflected light from the solar cell is reflected and diffused by the light diffusing layer to be irradiated to the solar cell. Such a configuration improves the utilization efficiency of a light and effectively contributes to an electric power generation.

A deep violet color of the solar cell is influenced by the light transmission reflecting plate 173 by which a silver reflected light can be obtained. Consequently, a deep violet color tone is softened and is hardly visible. The total thickness of the display plate 170 for a watch is approximately 500 μm and has no problem on mounting to a watch.

In this embodiment, the light transmission substrate 171 is made of a material of a polycarbonate resin. However, the material is not restricted to the polycarbonate resin. The light transmission substrate 171 can also be formed by using a material such as a polyethylene resin, a polypropylene resin, a polystyrene resin, a polyethylene terephthalate resin, and an acrylic resin.

Although the index 171e made of a demarcation strip scale is formed on the top surface of the light transmission substrate 171, the index 171e can also be formed on the bottom surface of the light transmission substrate 171. In such a case, the index and the radial pattern formed in the metal plate 172 are located on the same plane.

In this embodiment, the light diffusing layer made of a satin composed of minute concaves and convexes is formed on the bottom surface 172c of the metal plate 172. In addition to the satin, a paint film in which diffusion particles such as silicon oxide powder have been dispersed in a transparent resin such as an acrylic resin, an epoxy resin, and a urethane resin can also be used as a diffusing layer to obtain the similar effect.

In this embodiment, a reflection polarizing plate is used as the light transmission reflecting plate 173. However, a metal thin film made of a silver metal can also be formed on a resin film such as a polyethylene terephthalate resin by a method such as a vacuum evaporation to form a light semi-permeable reflecting plate having the both functions of a light transmission property and a reflecting property, and the light semi-permeable reflecting plate can also be used as the light transmission reflecting plate. In this case, the light semi-permeable reflecting plate is formed to have a thickness in the range of 80 to 100 μm, thereby obtaining a metal color having a silver color (a gloss cannot be obtained) and a light transmittance in the range of 50 to 60%.

In this embodiment, the demarcation strip scale 171e formed on the light transmission substrate 171 and so on function as a decorative member in accordance with the present invention. In this case, the metal plate 172 provided with the opening portion 172a composed of a time character disposed on the bottom surface of the light transmission substrate 171, and the patterns and plating that are formed on the top and bottom surfaces of the metal plate 172 also have a decorative function.

Embodiment 17

FIG. 22(a) is a plan view showing a seventeenth embodiment of the display plate for a solar cell device in accordance with the present invention, and FIG. 22(b) is a pivotal partially cross-sectional view thereof.

Figure 22:
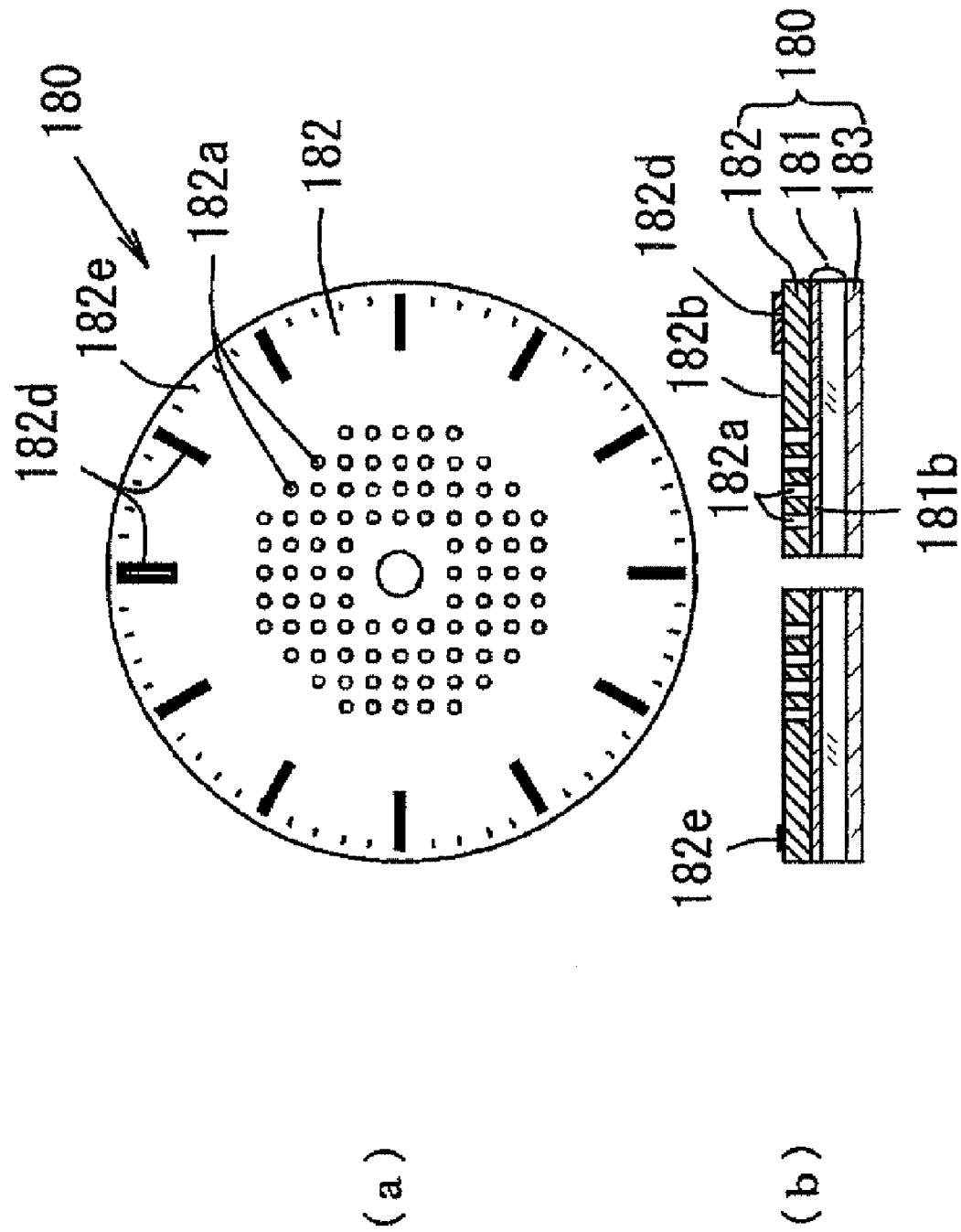
FIG. 22(a) is a plan view showing a seventeenth embodiment of the display plate for a solar cell device in accordance with the present invention.
FIG. 22(b) is a pivotal partially cross-sectional view thereof.

As shown in FIG. 22, a display plate 180 for a watch in accordance with this embodiment is a display plate to be used for a solar watch and has a configuration in which the metal plate 182 that is provided with an opening portion 182a, a transparent light transmission substrate 181 that is formed on the bottom surface of the metal plate 182, and a light transmission reflecting plate 183 formed on the bottom surface of the transparent light transmission substrate 181 are laminated and bonded to each other through an adhesive. A solar cell is disposed under the display plate 180 for a watch although this is not shown in the figure.

The metal plate 182 is made of a brass plate or a phosphorus bronze plate having a thickness of 150 μm and is provided with a plurality of the circular opening portions 182a at an approximately equal pitch around the center hole. The total area of the opening portions 172a is set in such a manner that a light transmittance enough for an electric power generation of the solar cell can be obtained. It is preferable to form the opening portion 182a by a punching processing.

A vertical paper marking is carried out to a top surface 182b of the metal plate 182. A gold plating film is formed on the surface of the metal plate 182 by the electrolytic plating. The metal plate 182 is then covered by a clear paint film.

The clear paint film is formed to be thick, and the top surface is polished to be a smooth surface with a gloss. Consequently, the metal plate 182 is finished to be a metal plate having an improved decorative effect and a noble metal sense.

An index 182d made of a metal indicating a time character is formed close to the peripheral edge of the metal plate 182 by using an adhesive. A black demarcation strip scale 182e is formed along the circumference. In this case, the index 182d is formed to have a thickness in the range of 20 to 40 μm by an electroforming plating method. Metal plating is carried out to the surface of the index 182d by a metal such as silver, palladium, and rhodium.

The index 182d is bonded to the metal plate 182 by an acrylic resin adhesive, an epoxy resin adhesive, or a pressure sensitive adhesive. The demarcation strip scale 182e is formed to have a thickness in the range of 5 to 10 μm by a publicly known printing method such as a screen printing and a pad printing using a black ink.

The light transmission substrate 181 is made of a transparent polycarbonate resin plate having a thickness of 250 μm. A decorative film 181b is formed on the light transmission substrate 181. The decorative film 181b is made of a paint film that displays a light gold color tone and that has a color similar to that of the metal plate 182. The decorative film 181b is formed to make the opening portion 182a in the metal plate 182 not conspicuous. Simultaneously, the decorative film 181b is formed to improve a decorative effect in such a manner that a gold color tone can be obtained totally.

The decorative film 181b, which requires a light transmission property, is formed to be thin (a thickness in the range of 5 to 10 μm) by a publicly known printing method such as a screen printing and a pad printing using an ink formed by mixing metal powder of gold, copper, or a copper alloy of a small amount (0.2 to 1.0 weight %) to a transparent resin such as an acrylic resin, an epoxy resin, and a urethane resin. As a result, the decorative film 181b having a light transmittance of approximately 70% can be obtained to display a light gold color.

A reflection polarizing plate having a thickness of 130 μm is used as the light transmission reflecting plate 183 similarly to the above fifteenth embodiment. In this embodiment, a reflection polarizing plate that is capable of obtaining a gold reflected light is used.

For the display plate 180 for a watch configured as described above, a paper marking decoration is visible displaying a gold color, and the index 182d displays a metal color similar to a white color. Consequently, a contrast with a gold base color of the display plate 180 is improved, and the index 182d is vividly visible. Therefore, the display plate can totally have a noble metal sense and sophistication.

The opening portion 182a of the metal plate 182 is influenced by the decorative film 181b that displays a light gold color of the transparent light transmission substrate 181 and the light transmission reflecting plate 183 by which a gold reflected light can be obtained. Consequently, the opening portion 182*a* is not conspicuous, and a visual sense of incongruity does not appear.

A deep violet color of the solar cell is influenced by the light transmission reflecting plate 183 and the decorative film 181*b*, and is hardly visible.

In the case in which the metal plate 182 having a thickness of 150 μm is used, the opening portion 182*a* can be formed by a press processing, thereby reducing a manufacturing cost. The total thickness of the display plate 180 for a watch is in the range of 570 to 580 μm and has no problem on mounting to a watch.

In this embodiment, the light transmission substrate 181 is made of a material of a polycarbonate resin. However, the material is not restricted to the polycarbonate resin. The light transmission substrate 181 can also be formed by using a material such as a polyethylene resin, a polypropylene resin, a polystyrene resin, a polyethylene terephthalate resin, and an acrylic resin. In addition, the light transmission substrate 181 can also be made of a transparent glass or a sapphire glass.

In this embodiment, the decorative film 181*b* formed on the light transmission substrate 181 is formed by an ink made using metal powder of gold, copper, or a copper alloy. An ink having a color similar to a gold color can also be used. Consequently, an ink in which a color tone similar to a gold color is displayed by a mixture with a pigment can be substituted for the ink made using metal powder. A metal thin film having a light transmission property can be formed as the decorative film by a dry plating method such as a vacuum evaporation and a sputtering while using a metal of gold, copper, or a copper alloy without a problem.

In this embodiment, a reflection polarizing plate is used as the light transmission reflecting plate 183. However, a metal thin film can also be formed on a resin film such as a polyethylene terephthalate resin by a dry plating method such as a vacuum evaporation and a sputtering using a gold metal to form a light semi-permeable reflecting plate having the both functions of a light transmission property and a reflecting property, and the light semi-permeable reflecting plate can also be used as the light transmission reflecting plate 183.

In this embodiment, the decorative film 181*b* formed on the light transmission substrate 181, the metal plate 182 provided with the opening portion 182*a* formed on the decorative film 181*b*, and the surface pattern, plating, the index 182*d*, and the demarcation strip scale 182*e* that are formed on the metal plate 182 and so on function as a decorative member in accordance with the present invention.

Embodiment 18

Figure 23:
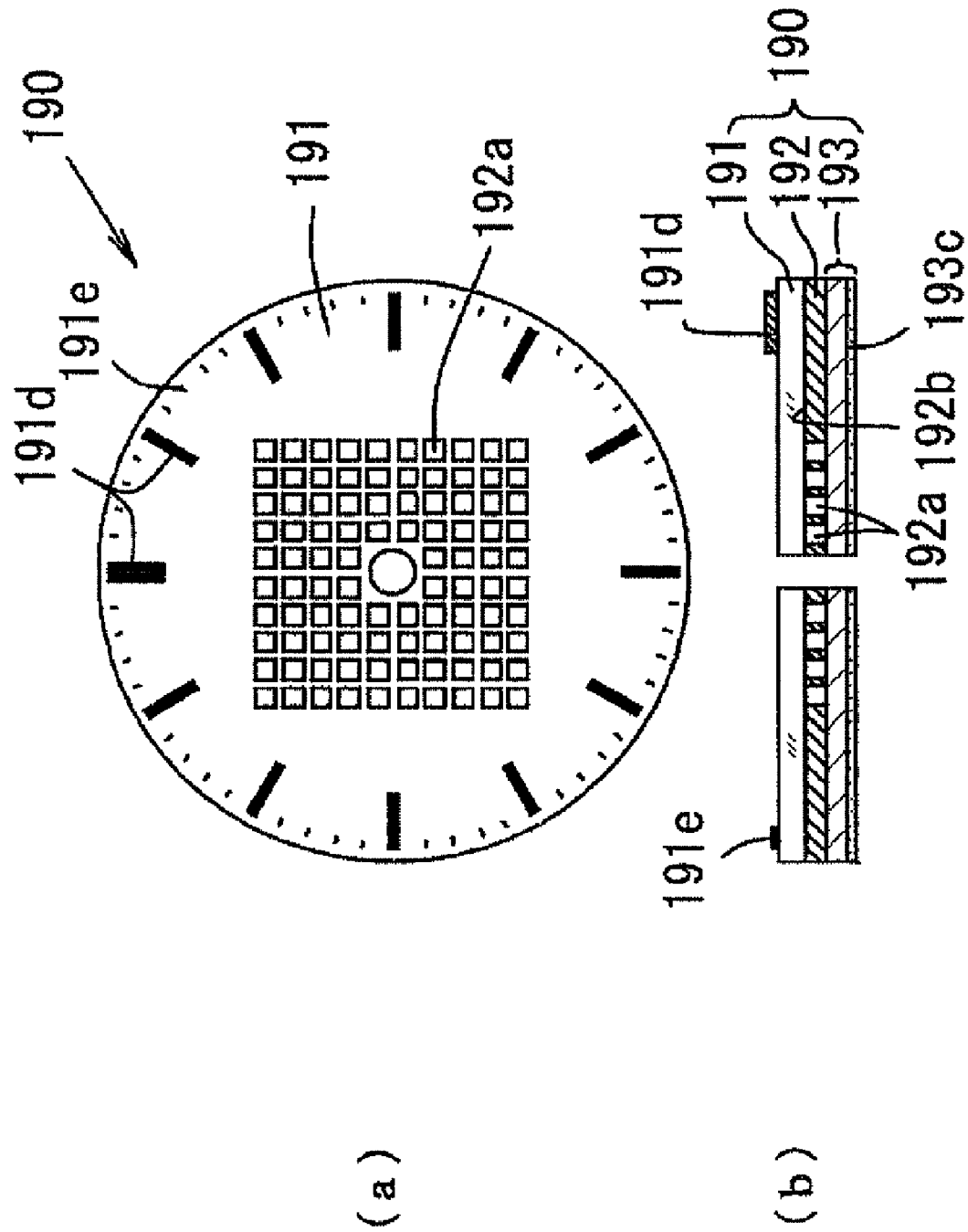
FIG. 23(a) is a plan view showing an eighteenth embodiment of the display plate for a solar cell device in accordance with the present invention, and FIG. 23 (b) is a pivotal partially cross-sectional view thereof.

FIG. 23(*a*) is a plan view showing an eighteenth embodiment of the display plate for a solar cell device in accordance with the present invention, and FIG. 23 (*b*) is a pivotal partially cross-sectional view thereof.

As shown in FIG. 23, a display plate 190 for a watch in accordance with this embodiment is a display plate to be used for a solar watch and has a configuration in which a light transmission substrate 191 that displays a light white color, a metal plate 192 that is provided with an opening portion 192*a* and that is formed on the light transmission substrate 191, and a light transmission reflecting plate 193 that is formed on the bottom surface of the metal plate 192 and that is provided with a light diffusing layer 193*c* on the bottom surface thereof are laminated and bonded to each other through an adhesive. A solar cell is disposed under the display plate 190 for a watch although this is not shown in the figure.

The light transmission substrate 191 is made of a transparent polycarbonate resin plate that has a thickness of 250 μm and in which a white pigment has been dispersed. The concave and convex pattern (a satin pattern) having minute concaves and convexes is formed on the top and bottom surfaces of the light transmission substrate 191. The concave and convex pattern functions as a light diffusing layer.

An index 191*d* made of a metal indicating a time character is formed close to the peripheral edge of the light transmission substrate 191 by using an adhesive. A demarcation strip scale 191*e* having a gold color tone is formed by a printing method.

The light transmission substrate 191 is palletized by compounding a white pigment in the range of 1 to 3 weight % to a transparent polycarbonate resin and is formed by an injection molding method using an injection molding machine. In this case, the concave and convex pattern formed on the top and bottom surfaces is simultaneously formed by a transcription from a forming metal mold.

The light transmission substrate 191 formed as described above obtains a light transmittance of approximately 70% and is visible in such a manner that a light white color tone is displayed.

The index 191*d* made of a metal is formed to have a thickness in the range of 20 to 40 μm by a photoresist method and an electroforming plating method. Metal plating is carried out to the surface of the index 191*d* to display a gold color with a gloss.

The demarcation strip scale 191*b* is formed by a publicly known printing method such as a screen printing and a pad printing using an ink formed by mixing metal powder of gold, copper, or a copper alloy to a transparent resin such as an acrylic resin, an epoxy resin, and a urethane resin in such a manner that the demarcation strip scale 191*b* has a color similar to that of the index 191*d*.

The light transmission substrate 191 having such a configuration displays a light white color tone and has a high light transmittance.

The metal plate 192 is made of a brass plate or a phosphorus bronze plate having a thickness of 100 μm and is provided with a plurality of opening portions 192*a* in a square shape formed around the center hole in a lattice pattern by an etching method.

Minute radial concaves and convexes are formed to make a radial pattern on a top surface 192*b* of the metal plate 192. A paint film having a light blue color is formed on the radial pattern.

It is preferable to form the opening portion 192*a* of the metal plate 192 by an etching method since the metal plate 192 is thin. More specifically, a resist film is formed on sections other than the opening portion 192*a*, and a section of the opening portion 192*a* on which no resist film is formed is etched by an etchant of ferric chloride (heated to the range of 40° C. to 60° C.) to form the opening portion 192*a*. After the etching, the resist film is removed to obtain the metal plate 192 provided with the opening portion 192*a*.

The total area of the opening portions 192*a* of the metal plate 192 is set in such a manner that a light transmittance enough for an electric power generation of the solar cell can be obtained.

For the radial pattern to be formed on the top surface 192*b* of the metal plate 192, a wire rotation brush is applied to the metal plate 192 using a marking apparatus while rotating the metal plate 192 to carry out the radial marking and to make the radial pattern.

The paint film having a light blue color is formed by a printing method or a spray coating method using an ink or a coating material formed by a blue pigment of a small amount to a transparent resin such as an acrylic resin, an epoxy resin, and a urethane resin.

The light transmission reflecting plate 193 is a reflection polarizing plate that is provided with the light diffusing layer 193c. The reflection polarizing plate is one having the specifications equivalent to those of the reflection polarizing plate in accordance with the above fifteenth embodiment. In this embodiment, a reflection polarizing plate that is capable of obtaining a reflected light colored to be silver is used.

The light diffusing layer 193c is formed on the bottom surface of the reflection polarizing plate to configure the light transmission reflecting plate 193. The light diffusing layer 193c is formed by a printing method such as a screen printing and a pad printing using an ink formed by mixing diffusing particles such as silicon oxide powder to a transparent resin such as an acrylic resin, an epoxy resin, and a urethane resin.

The light diffusing layer 193c is formed to diffuse a light reflected from the solar cell and to reflect the light toward the solar cell again.

The silicon oxide powder is used as diffusing particles in this embodiment. However, the diffusing particle is not restricted to the silicon oxide powder. A reflecting particle such as titanium oxide powder and zinc oxide powder can also be used to obtain the same effect caused by diffusion and a reflection.

For the display plate 190 for a watch configured as described above, a color tone like an extremely light blue appears by an influence of a light white color tone of the light transmission substrate 191, a scattering layer composed of the concave and convex pattern, and a light blue paint film of the metal plate 192.

The radial pattern is comparatively clearly visible in the color tone. In the section of the opening portion 192a of the metal plate 192 formed in the lattice pattern, a deep violet color of the solar cell is softened by a silver color reflected by the light transmission reflecting plate 193. Moreover, a deep violet color of the solar cell is almost extinguished by a light white color of the light transmission substrate 191 and the light diffusing layer composed of the concave and convex pattern, and is visible as a lattice pattern having a color tone similar to a white.

As described above, a radial pattern and a lattice pattern are visible, thereby obtaining a display plate having an improved decorative effect. Consequently, a design variation can be enlarged.

In this embodiment, the concave and convex pattern (a satin pattern) formed on the top and bottom surfaces of the light transmission substrate 191, the index 191d composed of a time character formed on the light transmission substrate 191, and the decorative film 191b function as a decorative member in accordance with the present invention.

In this case, the metal plate 192 provided with the opening portion 192a disposed on the bottom surface of the light transmission substrate 191, and the surface pattern and the paint film that are formed on the top surface 192b of the metal plate 192 also have a decorative function.

Embodiment 19

FIG. 24(a) is a plan view showing a nineteenth embodiment of the display plate for a solar cell device in accordance with the present invention, and FIG. 16(b) is a pivotal partially cross-sectional view thereof.

Figure 24:
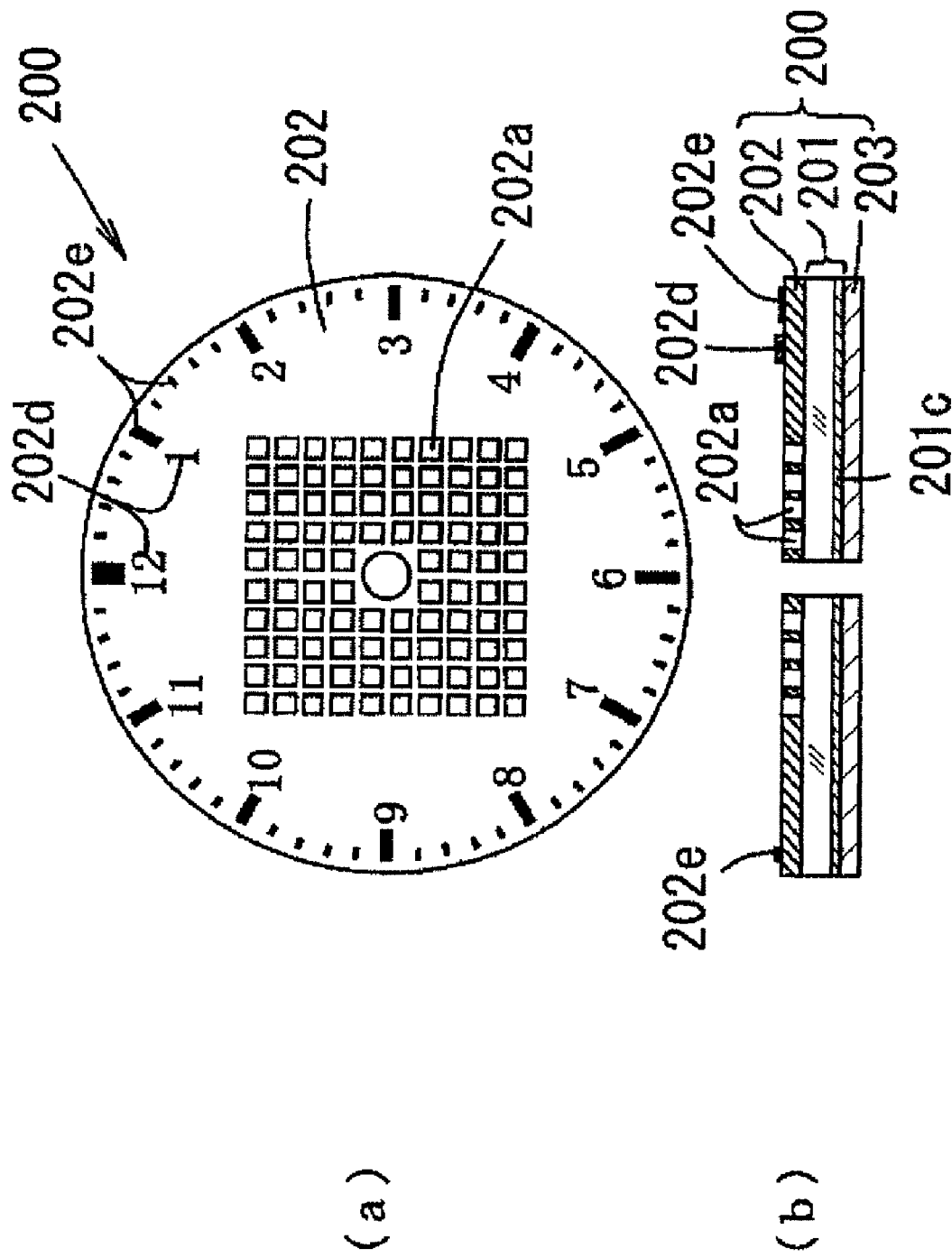
FIG. 24(a) is a plan view showing a nineteenth embodiment of the display plate for a solar cell device in accordance with the present invention.

As shown in FIG. 24, a display plate 200 for a watch in accordance with this embodiment has a configuration in which the metal plate 202 that is provided with an opening portion 202a, a transparent light transmission substrate 201 that is formed on the bottom surface of the metal plate 202 and that is provided with a paint film having a light white color on the bottom surface thereof, and a light transmission reflecting plate 203 formed on the bottom surface of the transparent light transmission substrate 201 are laminated and bonded to each other through an adhesive. A solar cell is disposed under the display plate 200 for a watch although this is not shown in the figure.

The metal plate 202 is made of a brass plate or a phosphorus bronze plate having a thickness of 100 μm and is provided with a plurality of opening portions 202a in a square shape formed at an approximately equal pitch around the center hole in a lattice pattern.

The total area of the opening portions 202a is set in such a manner that a light transmittance enough for an electric power generation of the solar cell can be obtained.

The opening portion 202a of the metal plate 202 is preferably formed by an etching method. More specifically, a resist film is formed on sections other than the opening portion 202a, and a section of the opening portion 202a on which no resist film is formed is etched by an etchant of ferric chloride (heated to the range of 40° C. to 60° C.) to form the opening portion 202a. After the etching, the resist film is removed to obtain the metal plate 201 provided with the opening portion 202a.

Minute radial concaves and convexes are formed to make a radial pattern on the surface of the metal plate 202. Gold plating is carried out to the radial pattern by the electrolytic plating. A clear paint film is then formed over the entire surface.

For the radial pattern, a wire rotation brush is applied to the metal plate using a marking apparatus while rotating the metal plate to carry out the radial marking.

A metal index 202d composed of Arabic figures such as 1, 2, and 3 indicating a time character is formed close to the peripheral edge of the metal plate 202 by using an adhesive. In addition, a black demarcation strip scale 202e is formed along the circumference. In this case, the metal index 202d is formed to have a thickness in the range of 20 to 40 μm by an electroforming plating method. Gold plating is carried out to the surface of the index 202d by the electrolytic plating method. The demarcation strip scale 202e is formed to have a thickness in the range of 5 to 10 μm by a publicly known printing method such as a screen printing and a pad printing using a black ink.

The light transmission substrate 201 is made of a transparent borosilicate glass plate having a thickness of 200 μm, and is provided with a paint film 201c having a light white color on the bottom surface thereof. The paint film 201c having a white color is formed to have a thickness in the range of 5 to 10 μm by a spray coating method or a printing method of a coating material or an ink made by compounding a white pigment in the range of 5 to 7 weight % to a transparent resin such as an acrylic resin and a urethane resin.

The paint film 201c formed as described above obtains a light transmittance in the range of 70% to 80% and is visible in such a manner that a light white color tone is displayed. The white paint film 201c is formed to soften a deep violet color of the solar cell and to enable the patterning of the opening portion 202a of the metal plate 202 to be visible without a sense of incongruity.

The light transmission reflecting plate 203 is a reflection polarizing plate having the specifications equivalent to those of the reflection polarizing plate in accordance with the above fifteenth embodiment, that is, a reflection polarizing plate that is capable of obtaining a reflected light colored to be silver.

For the display plate 200 for a watch configured as described above, a gold color is displayed, a lattice pattern having a color similar to a white appears in a radial marking pattern, a decorative effect is improved, and a noble metal sense can be obtained, thereby obtaining a new design variation.

Moreover, a deep violet color of the solar cell is almost extinguished and is invisible by an operation of the light transmission reflecting plate 203 and the white paint film 201c. The total thickness of the display plate 200 for a watch is in the range of 450 to 500 µm and has no problem on mounting to a watch.

In this embodiment, the metal plate 202 that is provided with an opening portion 202a disposed on the light transmission substrate 201, the surface pattern and plating that are formed on the metal plate 202, the index 202d and the demarcation strip scale 202e that are formed on the metal plate 202 and so on function as a decorative member in accordance with the present invention.

In this case, the paint film 201c formed on the bottom surface of the light transmission substrate 201 and so on also have a decorative function.

Embodiment 20

Figure 25:
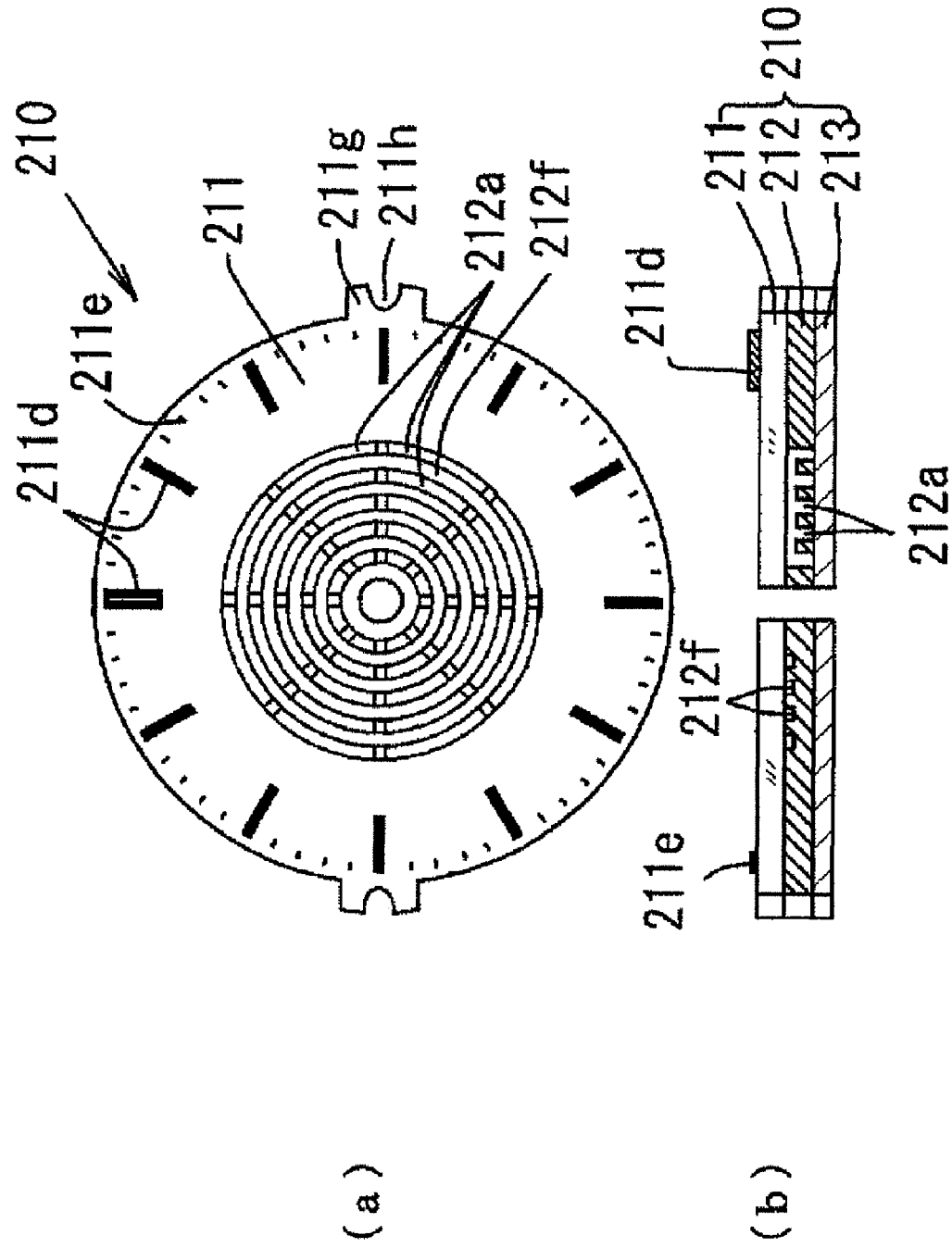
FIG. 25(a) is a plan view showing a twentieth embodiment of the display plate for a solar cell device in accordance with the present invention.
FIG. 25(b) is a pivotal partially cross-sectional view thereof.
Figure 26:
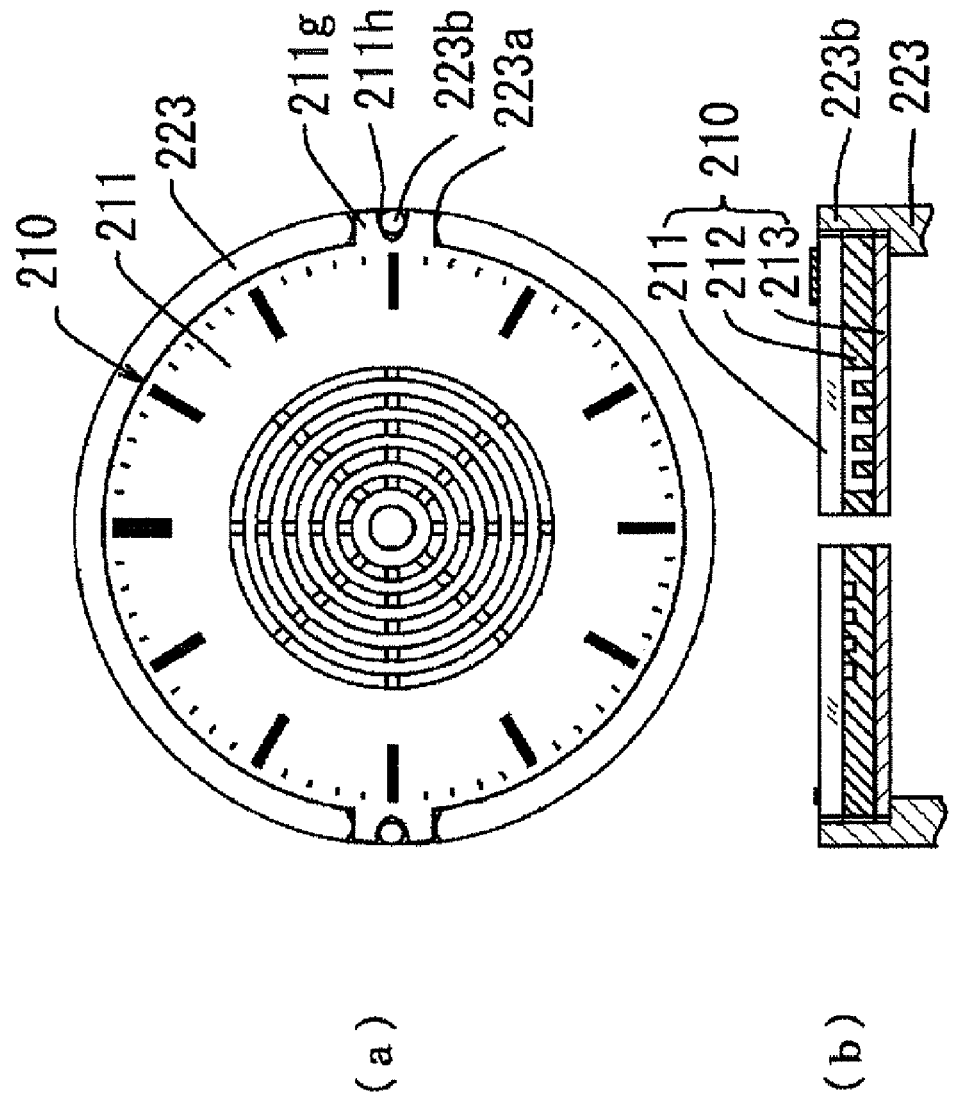
FIG. 26 is a plan view and a cross-sectional view showing a configuration in which the display plate of FIG. 25 is attached to an inner frame.
Figure 27:
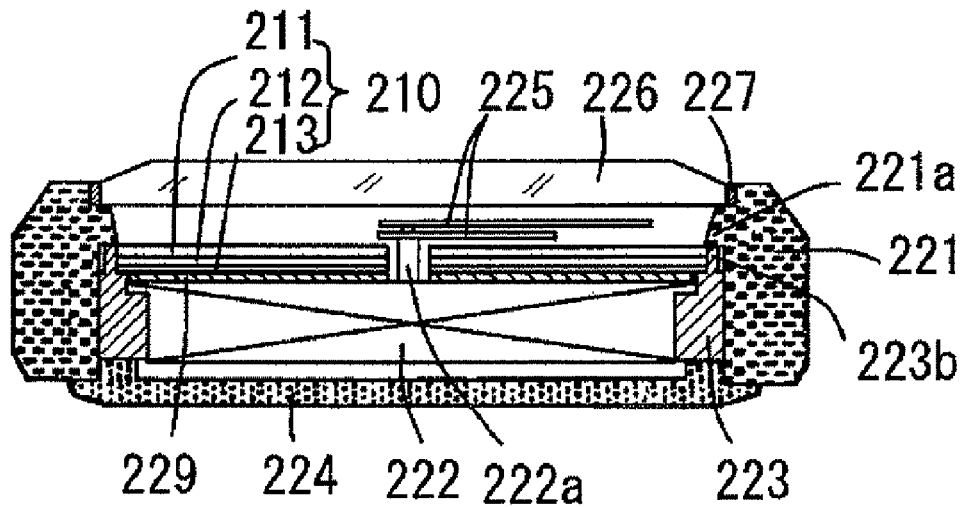
FIG. 27 is a pivotal partially cross-sectional view showing a configuration in which the display plate and the inner frame of FIG. 26 are mounted to a watch.

FIG. 25(a) is a plan view showing a twentieth embodiment of the display plate for a solar cell device in accordance with the present invention, and FIG. 25(b) is a pivotal partially cross-sectional view thereof. FIG. 26 is a plan view and a cross-sectional view showing a configuration in which the display plate of FIG. 25 is attached to an inner frame. FIG. 26(a) is a plan view thereof, and FIG. 26(b) is a pivotal partially cross-sectional view thereof. FIG. 27 is a pivotal partially cross-sectional view showing a configuration in which the display plate and the inner frame of FIG. 26 are mounted to a watch.

As shown in FIG. 25, a display plate 210 for a watch in accordance with this embodiment is composed of a transparent light transmission substrate 211, a metal plate 212 that is formed on the bottom surface of the transparent light transmission substrate 211 and that is provided with an opening portion 212a, and a light transmission reflecting plate 213 formed on the bottom surface of the metal plate 212.

In FIG. 25(b), these three components, that is, the light transmission substrate 211, the metal plate 212, and the light transmission reflecting plate 213, are laminated in an integrated manner. However, the three components are formed individually first, and are superposed during an assembly described later.

Here, an operation and an effect in a superposition are described. A solar cell is disposed under the display plate 210 for a watch although this is not shown in the figure.

The light transmission substrate 211 is made of a transparent polycarbonate resin plate having a thickness of 200 µm. An index 211d made of a metal indicating a time character is formed close to the peripheral edge of the top surface finished to be a smooth surface by using an adhesive A demarcation strip scale 211e having a gold color tone is formed by a printing method.

A hook 211g protruding externally is formed at the left and right positions of the peripheral edge of the light transmission substrate 211. A cut portion 211h is formed at the almost central position of the hook 211g.

The light transmission substrate 211 having such a configuration is formed by an injection molding method using a polycarbonate resin.

The index 211d made of a metal is formed to have a thickness in the range of 20 to 40 µm by a photoresist method and an electroforming plating method. Metal plating is carried out to the surface of the index 211d to display a gold color with a gloss.

The demarcation strip scale 211e is formed by a publicly known printing method such as a screen printing and a pad printing using an ink formed by mixing metal powder of gold, copper, or a copper alloy to a transparent resin such as an acrylic resin, an epoxy resin, and a urethane resin in such a manner that the demarcation strip scale 211e has a color similar to that of the index 211d.

The metal plate 212 is made of a brass plate or a phosphorus bronze plate having a thickness of 300 µm. A plurality of concave grooves 212f in a circle shape composed of concentric circles is formed in a region close to the center hole of the metal plate 212. A plurality of opening portions 212a in the same concentric circle shape is formed inside and outside the plurality of concave grooves 212f.

As shown in FIG. 25, in this embodiment, a plurality of concave grooves 212f composed of concentric circles is formed, and eight opening portions 212a in the same concentric circle shape are formed inside and outside the concave grooves 212f.

Consequently, there are two patterns composed of a circle pattern formed by a plurality of concave grooves 212f and a pattern formed by a plurality of opening portions 212a.

The total area of the opening portions 212a is set in such a manner that a light transmittance enough for an electric power generation of the solar cell can be obtained.

A satin composed of minute concaves and convexes is carried out to form a satin pattern on the top surface of the metal plate 212. Moreover, nickel plating and silver plating are carried out to the surface by the electrolytic plating to finish the surface to be silver.

The metal plate 212 is also provided with a hook protruding externally formed at the left and right positions of the peripheral edge and a cut portion formed at the almost central position of the hook similarly to the light transmission substrate 211. The shape and size of the hook and cut portion of the metal plate 212 are equivalent to those of the hook 211g and the cut portion 211h of the light transmission substrate 211.

The metal plate 212 is provided with a plurality of concave grooves 212f in a circle shape formed by a coining method using a coining metal mold to a plate material. A depth of the concave groove 212f is set to be in the range of 50 to 100 µm. Subsequently, a trimming die is used to trim an external shape and to punch the opening portion 212a, thereby forming the external shape and the opening portion 212a.

A reflection polarizing plate having a thickness of 130 µm is used as the light transmission reflecting plate 213 similarly to the above first embodiment. In this embodiment, a reflection polarizing plate that is capable of obtaining a silver reflected light is used. The light transmission reflecting plate 213 is also provided with a hook protruding externally formed at the left and right positions of the peripheral edge and a cut portion formed at the almost central position of the hook similarly to the light transmission substrate 211. The shape and size of the hook and cut portion of the light transmission reflecting plate 213 are equivalent to those of the hook 211g and the cut portion 211h of the light transmission substrate 211. The hook and cut portion are preferably formed by a punching method using a metal mold.

For the display plate 210 for a watch having the above configuration in which the light transmission substrate 211, the metal plate 212, and the light transmission reflecting plate 213 are superposed to each other, three patterns appear such as the satin pattern formed on the metal plate 212, the circle pattern composed of the concave grooves 212f, and a pattern visible by a reflected light from the opening portion 212a.

As a color tone of the display plate 210 for a watch, a silver color tone having a calm atmosphere is visible by the silver plating and the satin surface, and the demarcation strip scale 211e and the index 211d having a gold color tone are vividly visible.

By an operation of the transparent light transmission substrate 211, the pattern formed on the metal plate 212 displays a dignity accompanied by a sinking sense, thereby enabling the display plate to involve the sophistication accompanied by an improved decorative effect, a noble metal sense, and a dignity.

Moreover, a deep violet color of the solar cell is extinguished and is invisible by an operation of a silver reflected light from the light transmission reflecting plate 213. Furthermore, three patterns appear for the display plate 210 for a watch, thereby obtaining a new design variation. The total thickness of the display plate 210 for a watch is 630 μm and has no problem on mounting to a watch.

In this embodiment, the index 211d and the demarcation strip scale 211e that are formed on the light transmission substrate 211 function as a decorative member in accordance with the present invention.

In this case, the opening portion 212a disposed on the bottom surface of the light transmission substrate 211, the metal plate 212 that is provided with the concave groove 212f, the surface pattern and plating that are formed on the metal plate 212 and so on also have a decorative function.

A mounting process into a watch for the light transmission substrate 211, the metal plate 212, and the light transmission reflecting plate 213 that have the above configuration will be described with reference to FIGS. 26 and 27.

As shown in FIG. 26, the hook and the cut portion at the two positions of the light transmission reflecting plate 213 are aligned to and fitted into a cut portion 223a and an ejector pin 223b that are formed at two positions of the left and right sides of an inner frame 223.

Similarly, the metal plate 212 and the light transmission substrate 211 are superposed and fitted into the inner frame in turn. As a result, the metal plate 212 and the light transmission substrate 211 are positioned and fixed in the inner frame 223.

The inner frame 223 is made of a plastic material and has elasticity, thereby fixing the light transmission substrate 211, the metal plate 212, and the light transmission reflecting plate 213 that are superposed to each other to the inner frame 223. It is preferable that the mounting process into the inner frame 223 is carried out after a movement 222 and a solar cell 292 are mounted to the inner frame 223.

For the mounting process into a watch, as shown in FIG. 27, after the movement 222, the solar cell 229, the light transmission reflecting plate 213, the metal plate 212, and the light transmission substrate 211 are mounted to the inner frame 223, a hand 225 composed of a long hand and a short hand is fitted to and mounted to a hand axis 222a protruding from the center of the movement 222.

Subsequently, the inner frame 223 is fitted into a watch case 221 to which a windshield glass 226 is fixed via a waterproof packing 227.

Lastly, a rear cover 224 is mounted to the watch case 221. In the case in which the rear cover 224 is mounted, a convex portion formed on the rear face of the rear cover 224 pushes up the inner frame 223, thereby pushing up the movement 222 and the superposed display plate 210 for a watch.

By the above operation, the display plate 210 for a watch is protruded to the inner periphery side of the watch case 221, and is abutted to the bottom surface of a protruding portion 221a configuring an end leaf face. The display plate 210 for a watch is then fixed in the watch case 221, and the movement 222 is also fixed in the watch case 221.

As described above, the display plate 210 for a watch composed of three components of the light transmission reflecting plate 213, the metal plate 212, and the light transmission substrate 211 are fixed in the watch via the inner frame 223.

In this embodiment, three components that configure the display plate 210 for a watch, that is, the light transmission reflecting plate 213, the metal plate 212, and the light transmission substrate 211, are superposed to each other and fixed via the inner frame 223. However, three components can also be bonded to each other by using an adhesive or a pressure sensitive adhesive, and superposed in an integrating manner without a problem.

Moreover, in this embodiment, a plurality of concave grooves 212f is formed in a concentric circle shape to form a circle pattern. However, the pattern is not restricted to a circle pattern, and various patterns can be formed. For instance, a lattice pattern, a pyramid form cut pattern, a geometric pattern, or a stitch pattern can also be formed. A pattern entirely different from a pattern composed of a plurality of opening portions 212a can also be incorporated, thereby improving a decorative effect and enlarging a design variation.

Embodiment 21

FIG. 28(a) is a plan view showing a twenty-first embodiment of the display plate for a solar cell device in accordance with the present invention, and FIG. 28(b) is a pivotal partially cross-sectional view thereof.

Figure 28:
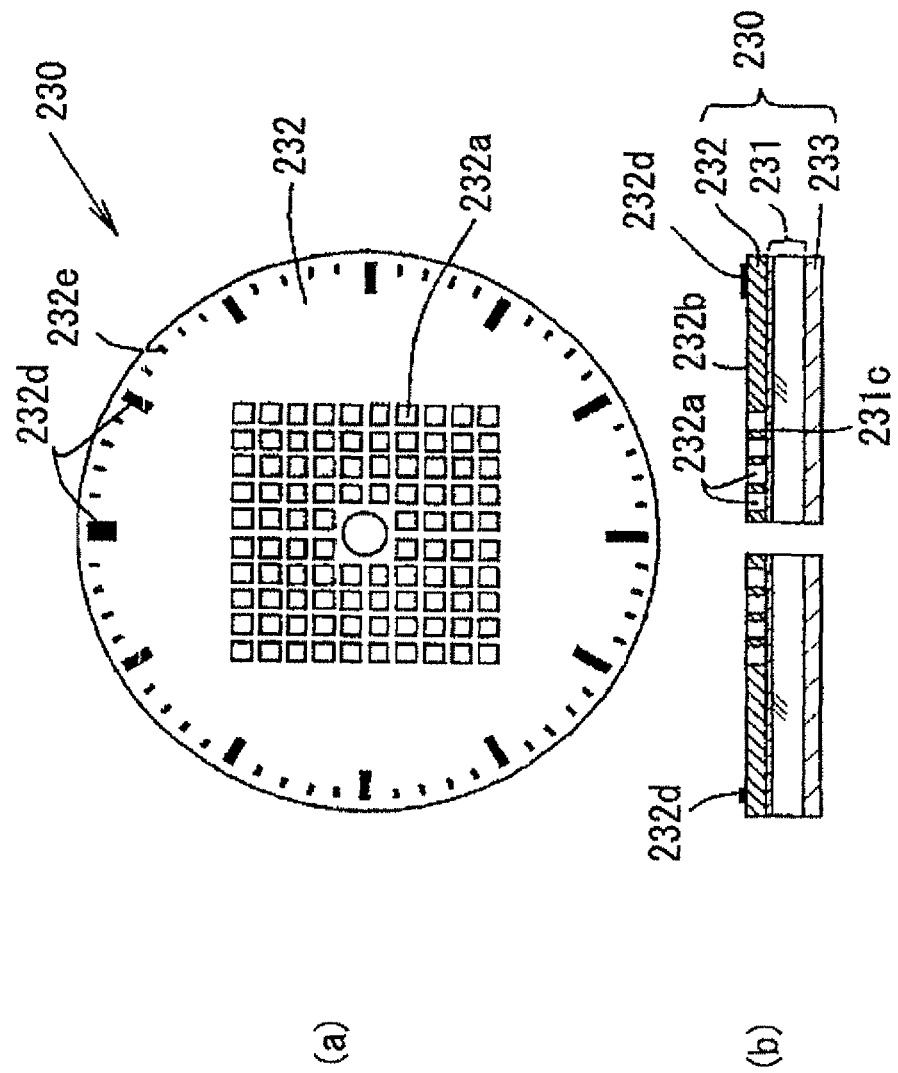
FIG. 28(a) is a plan view showing a twenty-first embodiment of the display plate for a solar cell device in accordance with the present invention.
FIG. 28(b) is a pivotal partially cross-sectional view thereof.

As shown in FIG. 28, a display plate 230 for a watch in accordance with this embodiment has a configuration in which the metal plate 232 that is provided with an opening portion 232a, a transparent light transmission substrate 231 that is formed on the bottom surface of the metal plate 232 and that is provided with a diffusing layer 231c on the bottom surface thereof, and a light transmission reflecting plate 233 formed on the bottom surface of the transparent light transmission substrate 231 are laminated and bonded to each other through an adhesive. A solar cell is disposed under the display plate 230 for a watch although this is not shown in the figure.

The metal plate 232 is made of a brass plate, a nickel silver plate, or a phosphorus bronze plate having a thickness of 150 μm and is provided with a plurality of opening portions 232a in a square shape formed at an approximately equal pitch around the center hole. The total area of the opening portions 232a is set in such a manner that a light transmittance enough for an electric power generation of the solar cell can be obtained. The opening portion 232a is preferably formed by a punching processing.

A radial marking pattern is formed on the top surface 232b of the metal plate 232. A rhodium plating film is formed on the surface by the electrolytic plating. A clear paint film is then formed over the surface.

The clear paint film is formed to be thick, and the top surface is polished to be a smooth surface with a gloss. Consequently, the metal plate 232 is finished to be a metal plate having an improved decorative effect and a noble metal sense.

An index 232d made of a metal indicating a time character is formed close to the peripheral edge of the metal plate 232 by using an adhesive. A black demarcation strip scale 232e is formed along the circumference. In this case, the index 232d is formed to have a thickness in the range of 20 to 40 μm by an electroforming plating method. Metal plating is carried out to the surface of the index 232d by a rhodium metal.

The index 232d is bonded to the metal plate 232 by an acrylic resin adhesive, an epoxy resin adhesive, or a pressure sensitive adhesive. The demarcation strip scale 232e is formed to have a thickness in the range of 5 to 10 μm by a publicly known printing method such as a screen printing and a pad printing using a black ink.

The light transmission substrate 231 is made of a transparent polycarbonate resin plate having a thickness of 250 μm. The diffusing layer 231c is formed on the light transmission substrate 231.

The diffusing layer 231c is formed to have a thickness in the range of 10 to 20 μm by a publicly known printing method such as a screen printing or a publicly known coating method such as an air spray coating using an ink or a coating material formed by mixing a transparent silica fine particle to a transparent resin such as an acrylic resin, an epoxy resin, and a urethane resin.

The light transmission reflecting plate 233 is a reflection polarizing plate that has a thickness of 130 μm and that is capable of obtaining a reflected light colored to be silver with a gloss similarly to the above fifteenth embodiment.

For the display plate 230 for a watch configured as described above, the beautiful display plate can have a radial pattern, display a metal color similar to a white color by a rhodium plating finishing, and involve an improved decorative effect and a noble metal sense.

Moreover, the transparent light diffusing layer 231c is formed on the transparent light transmission substrate 231 that is formed on the bottom surface of the metal plate 232. Consequently, in the case in which a reflected light displaying a deep violet color from the solar cell is transmitted to the light transmission reflecting plate 233, the color tone is softened. Moreover, in the case in which the reflected light is transmitted to the light diffusing layer 231c, a light diffusion occurs. Therefore, a deep violet color of the solar cell is almost extinguished and is invisible.

In the case in which a reflected light of the solar cell is diffused by the light diffusing layer 231c, a part of the diffused lights is emitted toward the solar cell. The lights are transmitted to the light transmission reflecting plate 233 and irradiated to the solar cell again. Such a configuration improves the utilization efficiency of a light and effectively contributes to an electric power generation.

In this embodiment, the light transmission substrate 231 is provided with the light diffusing layer 231c on the top surface thereof. However, the light diffusing layer can also be formed on the bottom surface to form the light transmission substrate. Such a configuration has a same effect. Moreover, a configuration in which the light diffusing layer is formed on the top surface of the light transmission reflecting plate 233 also has a same effect.

In this embodiment, the light diffusing layer 231c formed on the top surface of the light transmission substrate 231, and the surface pattern, plating, a paint film, the index 232d, and the demarcation strip scale 232e that are formed on the metal plate 232 that is provided with an opening portion 232a disposed on the light transmission substrate 231 function as a decorative member in accordance with the present invention.

Embodiment 22

Figure 29:
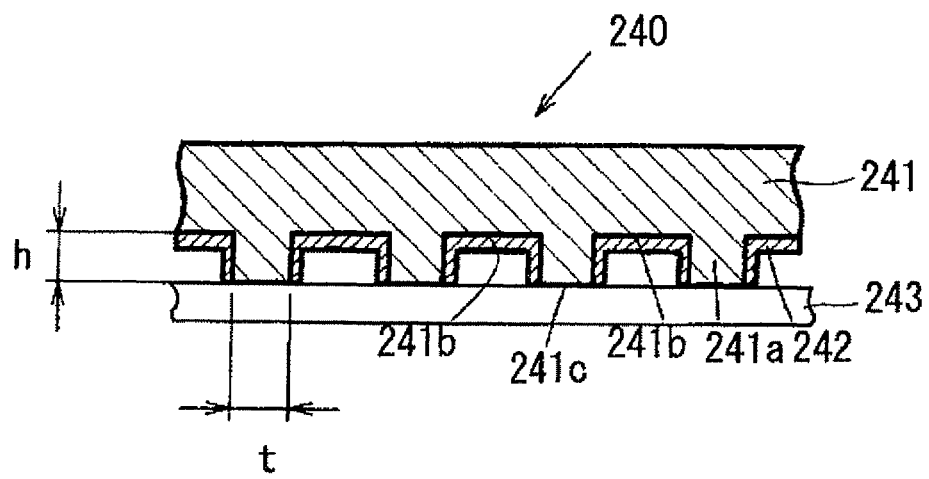
FIG. 29 is a pivotal partially cross-sectional view of a twenty-second embodiment of the display plate for a solar cell device in accordance with the present invention.
Figure 30:
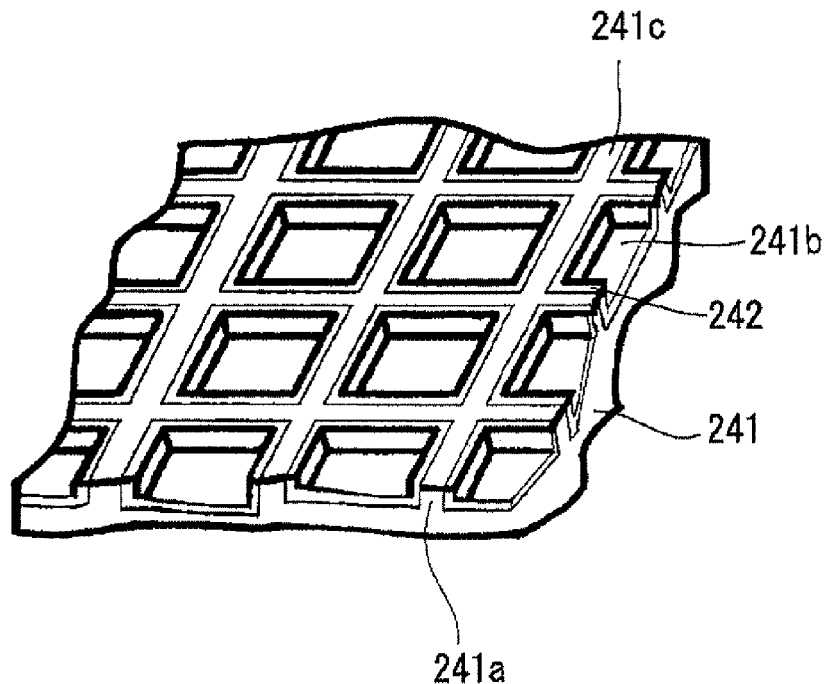
FIG. 30 is a pivotal enlarged perspective view showing the display plate for a solar cell device of FIG. 29 being viewed from the bottom side.
Figure 31:
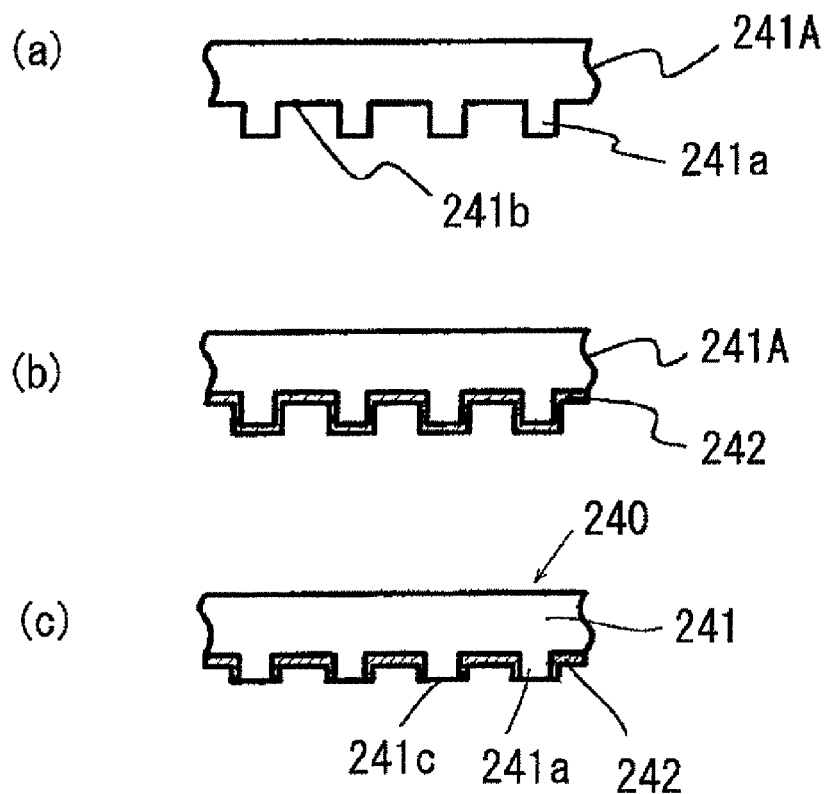
FIGS. 31(a)-(c) represent a flow sheet for illustrating a manufacturing method of the display plate for a solar cell device of the invention shown in FIG. 29.
Figure 32:
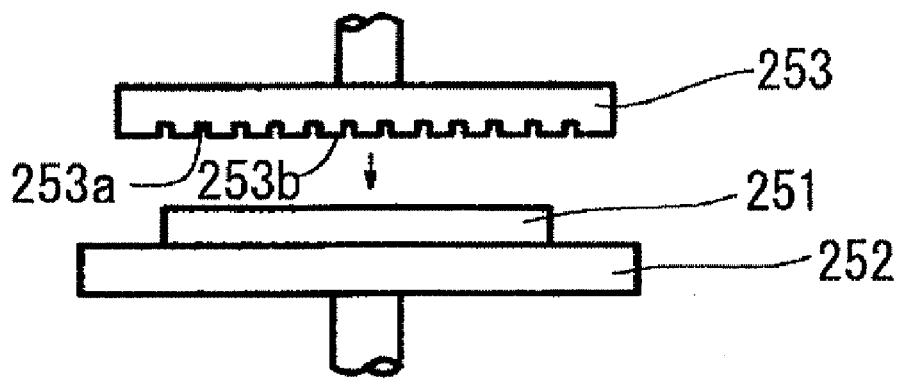
FIG. 32 is a flow sheet for illustrating another manufacturing method of the present invention.

FIG. 29 is a pivotal partially cross-sectional view of a twenty-second embodiment of the display plate for a solar cell device in accordance with the present invention. FIG. 30 is a pivotal enlarged perspective view showing the display plate for a solar cell device of FIG. 29 being viewed from the bottom side. FIG. 31 is a flow sheet for illustrating a manufacturing method of the display plate for a solar cell device shown in FIG. 29. FIG. 32 is a flow sheet for illustrating another manufacturing method.

As shown in FIG. 29, a display plate 240 for a watch in accordance with this embodiment is provided with a light transmission substrate 241 that has a light transmission property and that is provided with a convex portion 241a and a concave portion 241b on the bottom surface thereof.

The surface (a bottom face and a side face) of the concave portion 241b of the light transmission substrate 241 is covered by a covering layer 242 made of a metal or the like. The covering layer 242 is not formed on the bottom surface of the convex portion 241a of the light transmission substrate 241, and a light can be transmitted to the bottom surface.

A light transmission reflecting plate 243 is disposed on the bottom surface of the light transmission substrate 241. A solar cell is disposed under the light transmission reflecting plate 243 although this is not shown in the figure. The display plate 240 for a watch is used as a display plate for a solar watch.

For the display plate 240 for a watch, an index such as a time character and a mark is formed on the light transmission substrate 241 although this is not shown in the figure.

The top surface 241c (corresponding to the bottom surface in FIG. 29) of the convex portion 241a of the light transmission substrate 241 is polished. The polished portion of the light transmission substrate 241 is exposed and is made to be a smooth surface.

It is preferable that a height h of the convex portion 241a of the light transmission substrate 241 is at least 10 μm, and a width t of the top surface 241c of the light transmission substrate 241 is 70 μm or less.

As shown in FIG. 30, the convex portion 241a and the concave portion 241b of the light transmission substrate 241 are arranged at a constant pitch in a lattice pattern, thereby forming a lattice pattern as a whole. As shown in FIG. 30, the top surface 241c of the convex portion 241a is polished to be a smooth surface.

The total area of the polished top surface 241c is in the range of 20% to 50% of the area of the top surface of the light transmission substrate 241.

The above covering layer 242 made of a metal is a metal evaporated film formed by a metal evaporation method and is formed to have a thickness in which a light is not transmitted.

The above covering layer 242 is not restricted to a metal in particular, and can also be a printing film or a coating film formed by a printing method or a coating method to have a thickness in which a light is not transmitted.

In this embodiment, the light transmission substrate 241 is formed by using a transparent polycarbonate resin material. However, the light transmission substrate 241 is not restricted to a polycarbonate resin, and can also be formed by using a material such as a polyethylene resin, a polypropylene resin, a polystyrene resin, a polyethylene terephthalate resin, and an acrylic resin. In addition, the light transmission substrate 241 can also be formed by using a transparent glass or a sapphire glass.

The light transmission substrate 241 can be colored by mixing a dye or a pigment, and can have a light diffusing function in such a manner that the light transmission substrate 241 contains a light diffusing material such as silicic acid powder, calcium carbonate powder, and calcium phosphate powder.

Moreover, the concave and convex pattern can be formed on the top surface of the light transmission substrate 241. As the concave and convex pattern, various patterns can be selected such as a satin pattern having a concave and a convex, a lattice pattern, a stripe pattern, a pyramid form cut pattern, a stitch pattern, and a radial pattern.

As the light transmission reflecting plate 243, in addition to a reflection polarizing plate as described in the first and second embodiments, a light semi-permeable reflecting plate in which a metal evaporated film, a printing film, or a coating film has been formed on the surface of a substrate can be used.

For the display plate 240 for a watch configured as described above, a light is not transmitted to the concave portion 241b of the light transmission substrate 241 due to the covering layer 242. At the section of the concave portion 241b, a reflecting action appears, and a color tone of the covering layer 242 is visible.

A light is transmitted to the convex portion 241a of the light transmission substrate 241, and irradiated to the solar cell (not shown) disposed on the bottom surface thereof. Since the top surface 241c of the convex portion 241a of the light transmission substrate 241 is a smooth surface, the light is not scattered before the irradiation to the solar cell, thereby improving an irradiation efficiency.

Moreover, a light is transmitted through the convex portion 241a of the light transmission substrate 241. However, since a width of the top surface 241c is extremely small, a deep violet color of the solar cell is hardly visible.

In the case in which the light transmission substrate 241 to be used is slightly colored as described above, and a width of the top surface 241c of the convex portion 241a of the light transmission substrate 241 is 70 μm or less, a deep violet color of the solar cell is hardly visible. In particular, in the case in which a width of the top surface 241c of the convex portion 241a of the light transmission substrate 241 is 30 μm or less, even if the light transmission substrate 241 is a transparent substrate, a deep violet color of the solar cell disposed below is invisible.

Since the convex portion 241a and the concave portion 241b of the light transmission substrate 241 are arranged at a constant pitch on the bottom surface thereof, and the total area of the top surface 241c of the convex portion 241a is in the range of 20% to 50% of the area of the top surface of the display plate 240 for a watch, a sufficient amount of lights can be obtained for an electric power generation of the solar cell.

Some recent solar cells can obtain a sufficient amount of a generated electric power by a transmittance of at least 20%. Consequently, in the case in which the total area of the top surface 241c which is a transmission section is 20% of the area of the top surface, a transmittance of 20% can be obtained and a sufficient amount of lights can be obtained for an electric power generation.

Moreover, in the case in which the total area of the top surface 241c which is a transmission section of the light transmission substrate 241 is more than 50% of the area of the top surface, the covering layer 242 is not conspicuous and a deep violet color of the solar cell is clearly visible.

Consequently, in the case in which the total area of the top surface 241c which is a transmission section of the light transmission substrate 241 is in the range of 20% to 50% of the area of the top surface, a sufficient amount of lights can be obtained for an electric power generation of the solar cell. In addition, the covering layer 242 is extremely conspicuous, and the transmission section of the convex portion 241a of the light transmission substrate 241 is never conspicuous.

In this embodiment, the concave and convex pattern composed of the convex portion 241a and the concave portion 241b of the light transmission substrate 241 is formed in a lattice pattern. However, various patterns such as a stripe pattern, a circle pattern, a radial pattern, and a geometric pattern can also be selected similarly.

A manufacturing method of the display plate 240 for a watch having such a configuration will be described below with reference to FIGS. 31 and 32.

As shown in FIG. 31(a), a blank 241A of the light transmission substrate 241 provided with the convex portion 241a and the concave portion 241b that are formed on the bottom surface thereof is fabricated by an injection molding method. The blank 241A is molded by injecting a transmission resin in a metal mold using an injection molding apparatus under the heating and pressing conditions. The concave and convex portion formed on the bottom surface is formed by a transcription from the concave and convex portion formed in the metal mold.

As shown in FIG. 31(b), the covering layer 242 made of a metal evaporated film is formed on the entire bottom surface of the concave and convex portion of the blank 241A of the light transmission substrate 241. More specifically, a metal evaporation is carried out by an evaporation apparatus to the entire bottom surface of the blank 241A of the light transmission substrate 241 formed by an injection molding method to form the covering layer 242 made of a metal evaporated film. The metal evaporated film is formed to have a thickness (approximately 1000 Å or more) in which a light cannot be transmitted. The covering layer 242 can also be either of a coating film and a printing film that are formed by a coating method or a printing method to have a thickness in which a light cannot be transmitted.

As shown in FIG. 31(c), by polishing the top surface of the convex portion 241a of the light transmission substrate 241, the covering layer 242 is removed and the smooth top surface 241c is finished. More specifically, the top surface of the convex portion 241a on which the convex portion 241a has been formed is polished by a polishing apparatus to a degree in which the light transmission substrate 241 is exposed, thereby removing the covering layer 242 and finishing the smooth top surface 241c.

In this embodiment, the smooth surface is finished by a polishing method. However, it is also possible to finish the smooth surface by a cutting method using a diamond turning tool.

The display plate 240 for a watch can be obtained by the above manufacturing method.

In the above embodiment, the light transmission substrate 241 provided with the concave and convex portion on one surface is obtained by an injection molding method using a metal mold. As another method, a method illustrated in FIG. 32 can also be adopted.

As shown in FIG. 32, a transmission plastic plate 251 is disposed on a flat stage 252, and is pressed from the upper side under the heated condition by a compressing tool 253 provided with a concave portion 253a and a convex portion 253b, thereby obtaining an object in a shape equivalent to that of the blank 241A of the light transmission substrate 241 as shown in FIG. 31(a).

By the above manufacturing methods the concave and convex portion in a pattern shape of the light transmission substrate 241 is formed by a transcription from the concave and convex shape in a pattern shape formed in the metal mold or the compressing tool. Consequently, the concave and convex portion can be formed with an extremely stable precision and with a less dispersion of dimensions and shapes.

Moreover, the metal mold or the compressing tool provided with the concave and convex shape can be used for an extended periods of time. In addition, the metal mold and the compressing tool can shorten a manufacturing processing time. Consequently, a mass production property is excellent, and a processing cost can be extremely reduced.

Furthermore, a simple processing method such as an evaporation processing, a printing processing, a coating processing, and a polishing processing can be adopted as a post processing. Consequently, the total processing time and a cost can be extremely reduced. In addition, a separating solution and an etchant that have been conventionally used are not used, thereby enabling a salubrious working without a harmful influence to a human body.

In this embodiment, the concave and convex portion in a pattern shape formed on the light transmission substrate 241 (the convex portion 241*a* and the concave portion 241*b* of the light transmission substrate 241) is formed on the bottom surface to form the display plate 240 for a watch. However, the concave and convex portion in a pattern shape can also be formed on the top surface or both the top and bottom surfaces to form the display plate 240 for a watch. The same results can also be obtained by such configurations.

In this embodiment, the index such as a time character and a mark that are formed on the light transmission substrate 241 functions as a decorative member in accordance with the present invention.

In this case, the concave and convex pattern that is composed of the convex portion 241*a* and the concave portion 241*b* of the light transmission substrate 241 and that is formed on the bottom surface of the light transmission substrate 241, and the covering layer 242 and so on also have a decorative function.

Embodiment 23

Figure 33:
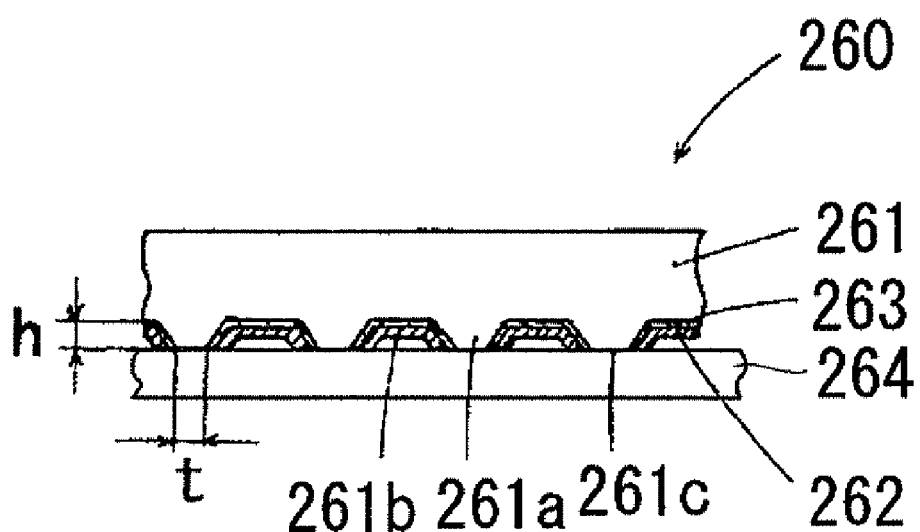
FIG. 33 is a pivotal partially cross-sectional view of a twenty-third embodiment of the display plate for a solar cell device in accordance with the present invention.
Figure 34:
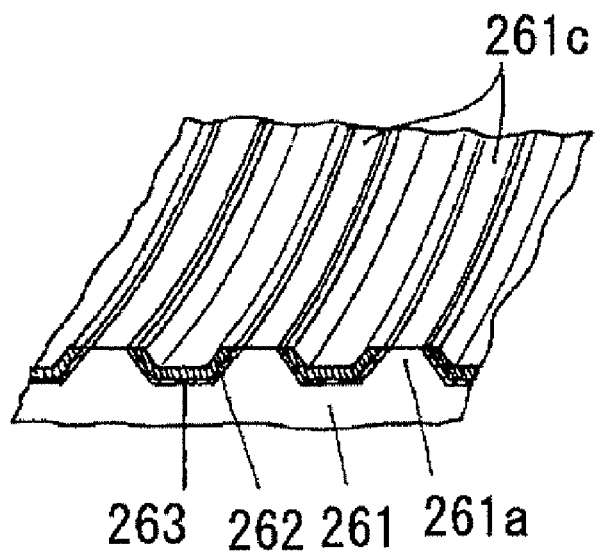
FIG. 34 is a pivotal enlarged perspective cross-sectional view showing the display plate for a solar cell device of FIG. 33 being viewed from the bottom side.
Figure 35:
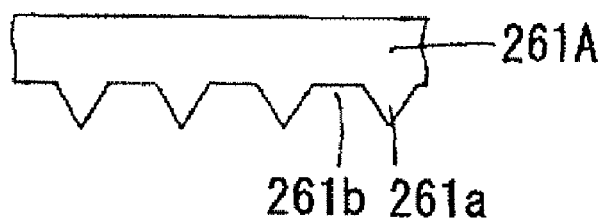
FIGS. 35(a)-(d) represent a flow sheet for illustrating a manufacturing method of the display plate for a solar cell device of the invention shown in FIG. 33.
Figure 35:
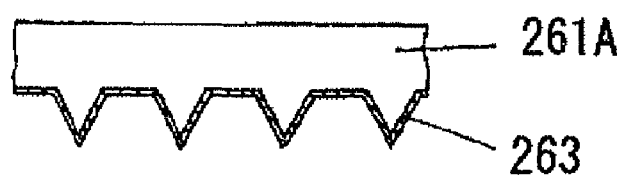
Figure 35:
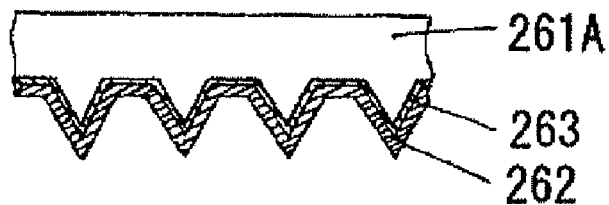
Figure 35:
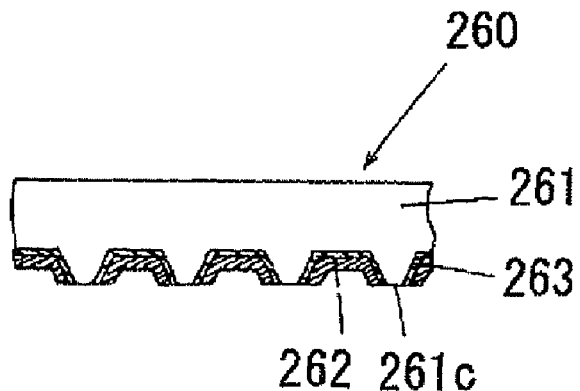
Figure 36:
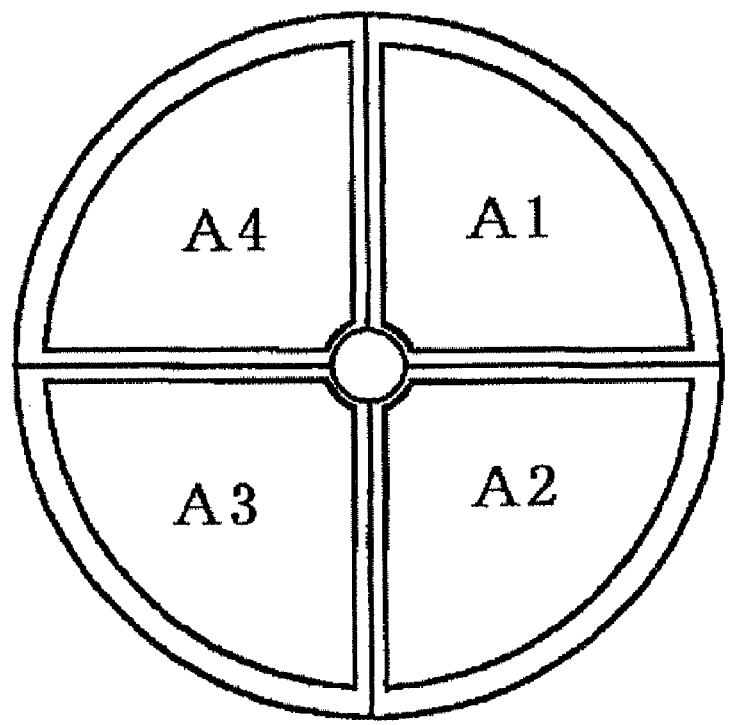
FIG. 36 is a plan view showing a solar cell.
Figure 37:
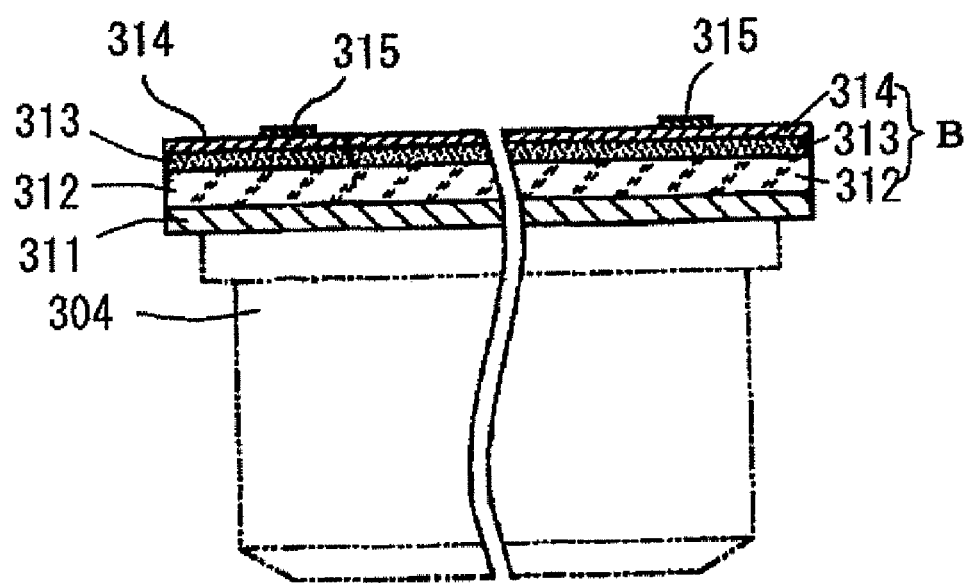
FIG. 37 is a partially enlarged cross-sectional view showing the structure of a conventional display plate for a watch provided with a solar cell.
Figure 38:
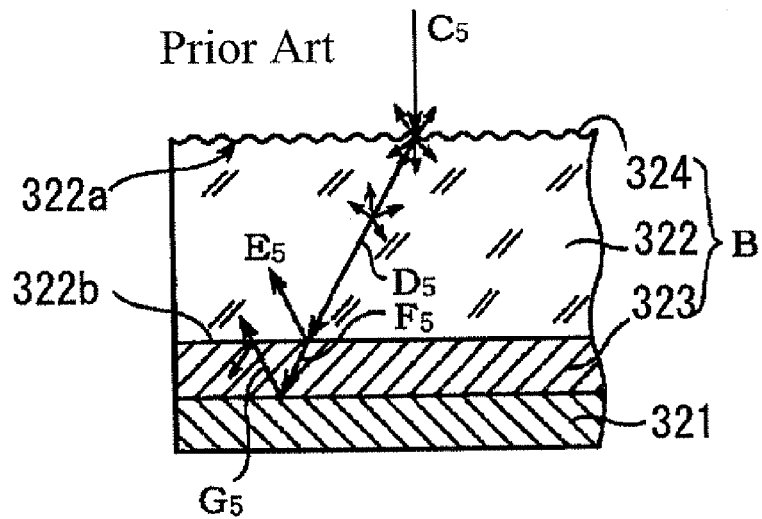
FIG. 38 is a partially enlarged cross-sectional view showing the structure of a conventional display plate for a watch provided with a solar and FIGS. 39(a)-(d) represent a flow sheet illustrating a conventional process for forming a stereoscopic concave and convex pattern on a conventional decorative member.
Figure 39:
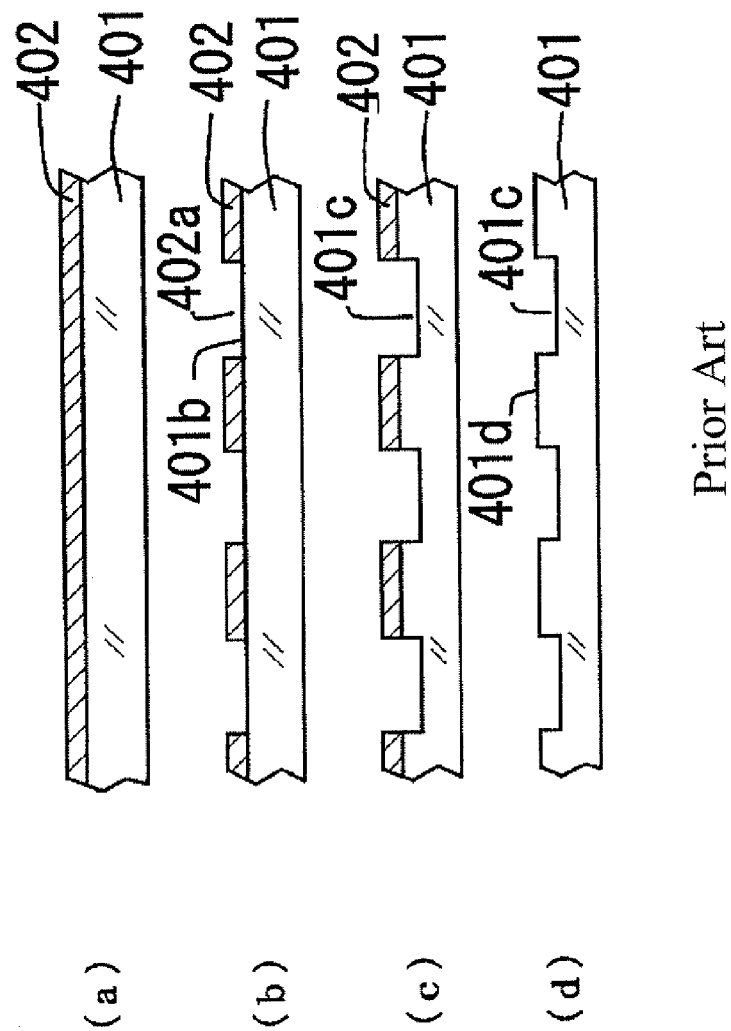

FIG. 33 is a pivotal partially cross-sectional view of a twenty-third embodiment of the display plate for a solar cell device in accordance with the present invention. FIG. 34 is a pivotal enlarged perspective cross-sectional view showing the display plate for a solar cell device of FIG. 33 being viewed from the bottom side. FIG. 35 is a flow sheet for illustrating a manufacturing method of the display plate for a solar cell device shown in FIG. 33.

As shown in FIG. 33, a display plate 260 for a watch in accordance with this embodiment is provided with a light transmission substrate 261 that has a light transmission property and that is provided with a convex portion 261*a* and a concave portion 261*b* on the bottom surface thereof.

The surface (a bottom face and a side face) of the concave portion 261*b* of the light transmission substrate 261 is covered by a light transmission color decorative film 263. The top surface of the light transmission color decorative film 263 is covered by a covering layer 262 made of a metal or the like.

A light transmission reflecting plate 264 is disposed on the bottom surface of the light transmission substrate 261. A solar cell is disposed under the light transmission reflecting plate 264 although this is not shown in the figure. The display plate 260 for a watch is used as a display plate for a solar watch.

An index such as a time character and a mark is formed on the light transmission substrate 261 although this is not shown in the figure.

The convex portion 261*a* of the light transmission substrate 261 is in an angle shape. The top surface 261*c* (corresponding to the bottom surface in FIG. 33) is polished. The polished portion of the light transmission substrate 261 is exposed and is made to be a smooth surface.

The smooth surface of the top surface 261*c* of the convex portion 261*a* of the light transmission substrate 261 can be formed by a cutting method using a diamond turning tool. Similarly to the twenty-second embodiment, it is preferable that a height h of the convex portion 261*a* of the light transmission substrate 261 is at least 10 μm, and a width t of the top surface 261*c* is 70 μm or less.

As shown in FIG. 34, the convex portion 261*a* and the concave portion 261*b* of the light transmission substrate 261 are arranged at a constant pitch in a circle pattern, thereby forming a circle pattern. It is preferable that the total area of the smooth top surface 261*c* of the convex portion 261*a* of the light transmission substrate 261 is in the range of 20% to 50% of the area of the top surface of the light transmission substrate 261.

The light transmission color decorative film 263 is a film for carrying out a color decoration, and has a light transmission property. In this embodiment, the light transmission color decorative film 263 is made of an extremely thin metal evaporated film. However, the light transmission color decorative film 263 can also be a color coating film or a color printing film having a light transmission property. Moreover, it is preferable to select a metal film, a coating film, or a printing film having a color tone by which a decoration is to be carried out.

In this embodiment, the covering layer 262 is formed by using a white coating film. However, the covering layer 262 can also be formed by using a metal evaporated film, and is formed to have a thickness in which a light is not transmitted. In this embodiment, a metal evaporated film is used as the light transmission color decorative film 263, and a white coating material is used as the covering layer 262 since such a combination can display more metal sense.

A metal sense can be displayed and a decorative effect can be improved by a combination of the light transmission color decorative film 263 made of a metal thin film and the covering layer 262 made of a white coating material, or a combination of the light transmission color decorative film 263 made of a coating material and the covering layer 262 made of a metal.

In this embodiment, the light transmission substrate 261 is formed by using a transparent polycarbonate resin material. However, the light transmission substrate 261 is not restricted to a polycarbonate resin, and can also be formed by using a material such as a polyethylene resin, a polypropylene resin, a polystyrene resin, a polyethylene terephthalate resin, and an acrylic resin. In addition, the light transmission substrate 261 can also be formed by using a transparent glass or a sapphire glass.

The light transmission substrate 261 can be colored by mixing a dye or a pigment, and can have a light diffusing function in such a manner that the light transmission substrate 261 contains a light diffusing material such as silicic acid powder, calcium carbonate powder, and calcium phosphate powder.

Moreover, the concave and convex pattern can be formed on the top surface of the light transmission substrate 261. As the concave and convex pattern, various patterns can be selected such as a satin pattern having a concave and a convex, a lattice pattern, a stripe pattern, a pyramid form cut pattern, a stitch pattern, and a radial pattern.

As the light transmission reflecting plate 264, in addition to a reflection polarizing plate as described in the first and second embodiments, a light semi-permeable reflecting plate in which a metal evaporated film, a printing film, or a coating film has been formed on the surface of a substrate can be used.

A manufacturing method of the display plate 260 for a watch having such a configuration will be described below with reference to FIG. 35.

As shown in FIG. 35(*a*), a blank 261A of the light transmission substrate 261 made of a plastic is fabricated by an injection molding apparatus using a metal mold.

The convex portion 261a in a triangle shape and the concave portion 261b are formed on the bottom surface of the blank 261A and are formed by a transcription from the metal mold.

As described in the twenty-second embodiment with reference to FIG. 32, a plastic plate can be pressed from the upper side under the heated condition by a compressing tool provided with a concave and a convex, thereby obtaining a concave portion and a convex portion. The convex portion 261a and the concave portion 261b are formed in a circle pattern as illustrated in FIG. 34.

As shown in FIG. 35(b), an extremely thin metal evaporation is carried out to the concave and convex surface of the blank 261A to form the light transmission color decorative film 263. As described above, the light transmission color decorative film 263 can also be a color coating film or a color printing film having a light transmission property.

As shown in FIG. 35(c), a white color coating is carried out to the light transmission color decorative film 263 formed in FIG. 35(b) to form the covering layer 262. In this case, the covering layer 262 is formed to have a thickness in which a light is not transmitted. In this embodiment, a white coating material is used as the covering layer 262. However, the covering layer 262 is not restricted in particular, and can be another coating material or a metal evaporated film as described above.

As shown in FIG. 31(d), by polishing using a polishing apparatus, a part of the angle convex portion 261a of the light transmission substrate 261 is cut to expose the blank 261A, and the top surface 261c of the convex portion 261a is finished to be a smooth surface.

A width of the top surface 261c of the convex portion 261a of the light transmission substrate 261 is suppressed to be 70 μm or less, and is formed in a circle shape.

The total area of the top surface 261c of the convex portion 261a of the light transmission substrate 261 is in the range of 20% to 50% of the area of the top surface of the light transmission substrate 261.

In this embodiment, by a polishing method, a part of the angle convex portion 261a is cut, and the top surface 261c of the convex portion 261a is finished to be a smooth surface. However, it is also possible to finish the smooth surface by a cutting method using a diamond turning tool.

The display plate 260 for a watch as shown in FIG. 33 can be obtained by the above operation process.

For the display plate 260 for a watch, the top surface 261c of the convex portion 261a of the light transmission substrate 261 is a portion in which a light is transmitted, and a width of the top surface 261c of the convex portion 261a of the light transmission substrate 261 is extremely small to be 70 μm or less.

Consequently, a deep violet color of the solar cell that is disposed under the light transmission substrate 261 is not visible as a deep violet color.

In the case in which a width of the top surface 261c of the convex portion 261a of the light transmission substrate 261 being a portion in which a light is transmitted is 30 μm or less, the transmitted portion is invisible and a color tone of the solar cell is never visible.

Moreover, the top surface 261c of the convex portion 261a of the light transmission substrate 261 being a portion in which a light is transmitted is formed in a circle pattern at a constant pitch, and the total area of the light transmitted portion is in the range of 20% to 50% of the area of the top surface of the light transmission substrate. Consequently, a sufficient amount of a generated electric power can be obtained. In addition, the color tones of the light transmission color decorative film 263 and the covering layer 262 are greatly conspicuous visually, and the transmitted portion is hardly conspicuous.

In the case in which the convex portion 261a of the light transmission substrate 261 is in an angle shape with an inclination as shown in this embodiment, a size of a portion in which a light is transmitted can be freely set by polishing. Consequently, a width of 30 μm or less which is invisible can be easily formed.

In this embodiment, the concave and convex portion in a pattern shape formed on the light transmission substrate 261 (the convex portion 261a and the concave portion 261b of the light transmission substrate 261) is formed on the bottom surface to form the display plate 260 for a watch. However, the concave and convex portion in a pattern shape can also be formed on the top surface or both the top and bottom surfaces to form the display plate 260 for a watch. The same results can also be obtained by such configurations.

In this embodiment, the index such as a time character and a mark that are formed on the light transmission substrate 261 functions as a decorative member in accordance with the present invention.

In this case, the concave and convex pattern that is composed of the convex portion 261a and the concave portion 261b of the light transmission substrate 261 and that is formed on the bottom surface of the light transmission substrate 261, the light transmission color decorative film 263 formed on the concave portion 261b, and the covering layer 262 and so on also have a decorative function.

In the above embodiment, a gap can be disposed between the light transmission substrate and the reflection polarizing plate. In the case in which an interference fringe of a light does not appear even if the light transmission substrate and the reflection polarizing plate are bonded to each other, the light transmission substrate and the reflection polarizing plate can be integrated with each other to be used.

INDUSTRIAL APPLICABILITY

The display plate for a solar cell device in accordance with the present invention has been described above by applying the present invention to a display plate for a solar watch. However, the present invention can also be applied to other display plates for a solar cell device such as an electronic desk calculator provided with a solar cell.

Moreover, the present invention can commonly be applied to a decorative display plate that is used for a part of a normal decorative name plate, a decorative panel, and an electronic display apparatus, etc. in addition to a solar cell device. Various changes and modifications can be thus made without departing from the scope of the present invention.

The invention claimed is:

1. A display plate for a solar cell device provided with a solar cell on a bottom surface side thereof, comprising:
   a light transmission substrate;
   a light transmission reflecting plate that is disposed on a bottom surface side of the light transmission substrate;
   a decorative member that is disposed on a top surface side of the display plate; and
   a reflecting surface with a concave and convex shape provided on the bottom surface of the light transmission substrate,
   wherein the light transmission reflecting plate and the light transmission substrate are separately provided.

2. The display plate for a solar cell device as defined in claim 1, wherein a decorative member is disposed on the bottom surface side of the light transmission substrate.

3. The display plate for a solar cell device as defined in claim 1, wherein the reflecting surface of the light transmission substrate is made of a prism reflecting surface.

4. The display plate for a solar cell device as defined in claim 3, wherein the prism reflecting surface of the light transmission substrate is composed of at least one prism reflecting surface having a shape selected from a circle shape, a spiral shape, a linear shape, an intersecting shape, and a geometric shape.

5. The display plate for a solar cell device as defined in claim 1, wherein the reflecting surface of the light transmission substrate is made of a pattern in a concave and convex shape.

6. The display plate for a solar cell device as defined in claim 1, wherein a pattern member provided with a convex portion and a concave portion that are composed of a convex portion and a concave portion formed by digging is disposed on the top surface of the light transmission substrate.

7. The display plate for a solar cell device as defined in claim 6, wherein a convex portion forming layer is disposed on the surface of the convex portion of the pattern member.

8. The display plate for a solar cell device as defined in claim 7, wherein the convex portion forming layer is made of at least one convex portion forming layer that is selected from a transparent film and a colored film.

9. The display plate for a solar cell device as defined in claim 7, wherein the convex portion forming layer has a thickness of at least 8 μm.

10. The display plate for a solar cell device as defined in claim 6, wherein the pattern member is a pattern member provided with a convex and a concave shape that are composed of a convex portion and a concave portion formed by digging a seashell, a glass, or a ceramic.

11. The display plate for a solar cell device as defined in claim 6, wherein the concave and convex portions of the pattern member form a pattern.

12. The display plate for a solar cell device as defined in claim 6, wherein the concave portion of the pattern member is formed by penetrating through the pattern member.

13. The display plate for a solar cell device as defined in claim 6, wherein the pattern of the concave and convex portions of the pattern member is a concave and convex pattern containing at least two kinds of concave portions having a different depth.

14. The display plate for a solar cell device as defined in claim 6, wherein the pattern member has a light transmission property.

15. The display plate for a solar cell device as defined in claim 6, wherein the pattern member is provided with a convex and a concave shape that are composed of a convex portion and a concave portion formed by digging on the bottom surface side.

16. The display plate for a solar cell device as defined in claim 15, wherein the concave and convex portions on the bottom surface side of the pattern member form a pattern.

17. The display plate for a solar cell device as defined in claim 6, wherein the pattern member is disposed in a concave portion formed on a part of the surface of the light transmission substrate.

18. The display plate for a solar cell device as defined in claim 17, wherein a reflecting film is disposed in the concave portion formed on a part of the surface of the light transmission substrate.

19. The display plate for a solar cell device as defined in claim 1, wherein a metal plate that is provided with an opening portion is disposed on the top or bottom surface of the light transmission substrate.

20. The display plate for a solar cell device as defined in claim 19, wherein the opening portion of the metal plate is composed of at least one kind of an opening portion made of one selected from a pattern, a numeral, a character, and a mark.

21. The display plate for a solar cell device as defined in claim 19, wherein at least one kind of a decoration made of one selected from a pattern, a numeral, a character, and a mark is formed on the surface of the metal plate.

22. The display plate for a solar cell device as defined in claim 19, wherein a light diffusing layer is disposed on the top or bottom surface side or both the top and bottom surface sides of the metal plate.

23. The display plate for a solar cell device as defined in claim 19, wherein at least one kind of a processing layer made of one selected from a printing film, a coating film, and a metal film is disposed on the top or bottom surface side or both the top and bottom surface sides of the metal plate.

24. The display plate for a solar cell device as defined in claim 1, wherein
a concave portion and a convex portion are formed on one of the top or bottom surface or both the top and bottom surfaces of the light transmission substrate,
a covering layer is formed on the surface of the concave portion of the concave and convex portions, and
the convex portion is formed to be substantially flat.

25. The display plate for a solar cell device as defined in claim 24, wherein the covering layer is made of at least one kind of a covering layer selected from a printing film, a coating film, and a metal film.

26. The display plate for a solar cell device as defined in claim 24, wherein the concave and convex of the light transmission substrate form a pattern.

27. The display plate for a solar cell device as defined in claim 24, wherein the covering layer is a covering layer that remains only on the surface of the concave portion by removing a covering layer formed on the surface of the convex portion from the surface of the convex portion of the concave and convex of the light transmission substrate after forming at least one kind of a covering layer selected from a printing film, a coating film, and a metal film on the concave and convex surface of the light transmission substrate.

28. The display plate for a solar cell device as defined in claim 1, wherein the decorative member is made of at least one kind of a decorative member selected from a colored film, an index, a name print, a luminous paint layer, a pattern, and a concave and a convex.

29. The display plate for a solar cell device as defined in claim 1, wherein at least one kind of a decoration made of one selected from a pattern, a numeral, a character, and a mark is formed on the top surface of the light transmission substrate.

30. The display plate for a solar cell device as defined in claim 1, wherein the light transmission substrate is a light transmission substrate that has been colored.

31. The display plate for a solar cell device as defined in claim 30, wherein the colored light transmission substrate is a light transmission substrate that has been colored by containing a dye or a pigment in the light transmission substrate.

32. The display plate for a solar cell device as defined in claim 30, wherein the colored light transmission substrate is a light transmission substrate that has been colored by forming a colored layer on the top or bottom surface or both the top and bottom surfaces of the light transmission substrate.

33. The display plate for a solar cell device as defined in claim 32, wherein the colored layer of the light transmission substrate that has been colored is made of at least one kind of a colored layer selected from a printing film, a coating film, and a metal film.

34. The display plate for a solar cell device as defined in claim 1, wherein the light transmission substrate is composed of at least one light semi-permeable substrate made of one selected from a resin, a glass, a sapphire glass, and a ceramic.

35. The display plate for a solar cell device as defined in claim 1, wherein the light transmission reflecting plate is a light semi-permeable reflecting plate.

36. The display plate for a solar cell device as defined in claim 35, wherein the light semi-permeable reflecting plate is made by forming a light semi-permeable film on the surface of the substrate.

37. The display plate for a solar cell device as defined in claim 36, wherein the light semi-permeable film of the light semi-permeable reflecting plate is made of at least one kind of a light semi-permeable film selected from a metal evaporated film, a printing film, and a coating film.

38. The display plate for a solar cell device as defined in claim 1, wherein the light transmission reflecting plate is a reflection polarizing plate.

39. The display plate for a solar cell device as defined in claim 38, wherein the reflection polarizing plate is a reflection polarizing plate that has been colored.

40. The display plate for a solar cell device as defined in claim 39, wherein the colored reflection polarizing plate is a light transmission substrate that has been colored by forming a colored layer on the top or bottom surface or both the top and bottom surfaces of the reflection polarizing plate.

41. The display plate for a solar cell device as defined in claim 40, wherein the colored layer of the reflection polarizing plate that has been colored is made of at least one kind of a colored layer selected from a printing film, a coating film, and a metal film.

42. A display plate for a solar watch, wherein the display plate for a solar cell device as defined in claim 1 is a display plate for a solar watch.

43. A solar watch, wherein the display plate for a solar cell device as defined in claim 1 is used for a display plate for a solar watch.

44. A method of manufacturing a display plate for a solar cell device provided with a solar cell on the bottom surface side, comprising the steps of:
preparing a light transmission substrate that has a reflecting surface with a concave and convex shape on a bottom surface thereof;
forming a light transmission reflecting plate separately from the light transmission substrate on the bottom surface side of the light transmission substrate; and
forming a decorative member on the top surface side of the display plate.

45. The method of manufacturing the display plate for a solar cell device as defined in claim 44, further comprising the step of forming a decorative member on the bottom surface side of the light transmission substrate.

46. The method of manufacturing the display plate for a solar cell device as defined in claim 44, wherein the reflecting surface of the light transmission substrate is made of a prism reflecting surface.

47. The method of manufacturing the display plate for a solar cell device as defined in claim 46, wherein the prism reflecting surface of the light transmission substrate is composed of at least one prism reflecting surface having a shape selected from a circle shape, a spiral shape, a linear shape, an intersecting shape, and a geometric shape.

48. The method of manufacturing the display plate for a solar cell device as defined in claim 44 wherein the reflecting surface of the light transmission substrate is made of a pattern in a concave and convex shape.

49. The method of manufacturing the display plate for a solar cell device as defined in claim 44, further comprising the step of disposing a pattern member provided with a convex and a concave that are composed of a convex portion and a concave portion formed by digging on the top surface of the light transmission substrate.

50. The method of manufacturing the display plate for a solar cell device as defined in claim 49, wherein the step of disposing the pattern member includes the step of bonding the light transmission substrate and the pattern member to each other and the step of forming a transparent film or a colored film on the top surface of the pattern member.

51. The method of manufacturing the display plate for a solar cell device as defined in claim 50, further comprising the step of digging and removing a section of a pattern member on which the transparent film or the colored film is not formed.

52. The method of manufacturing the display plate for a solar cell device as defined in claim 50, wherein the step of bonding the light transmission substrate and the pattern member to each other is carried out after the step of forming the transparent film or the colored film on the top surface of the pattern member.

53. The method of manufacturing the display plate for a solar cell device as defined in claim 49, wherein the pattern member is a pattern member provided with a convex and a concave that are composed of a convex portion and a concave portion formed by digging a seashell, a glass, or a ceramic.

54. The method of manufacturing the display plate for a solar cell device as defined in claim 44, further comprising the step of disposing a metal plate, provided with an opening portion, on the top or bottom surface of the light transmission substrate.

55. The method of manufacturing the display plate for a solar cell device as defined in claim 44, further comprising the steps of:
forming a concave and a convex on the top or bottom surface or both the top and bottom surfaces of the light transmission substrate,
forming a covering layer on the surface of the concave portion and the convex portion of the concave and convex, and
polishing the convex portion to remove the covering layer formed on the surface of the convex portion, to make the covering layer to remain on the surface of the concave portion, and to form the convex portion to be almost flat.

56. The method of manufacturing the display plate for a solar cell device as defined in claim 55, wherein the covering layer is made of at least one kind of a covering layer selected from a printing film, a coating film, and a metal film.

* * * * *

UNITED STATES PATENT AND TRADEMARK OFFICE
CERTIFICATE OF CORRECTION

PATENT NO.          : 8,243,556 B2
APPLICATION NO.     : 11/815801
DATED               : August 14, 2012
INVENTOR(S)         : Katsuyuki Yamaguchi et al.

It is certified that error appears in the above-identified patent and that said Letters Patent is hereby corrected as shown below:

Face of the Patent, Column 1, Item (75) Inventors, Line 3, delete "Yamanishi" and insert -- Yamanashi --

Column 74, Line 8, Claim 48, delete "claim 44" and insert -- claim 44, --

Signed and Sealed this
Eighteenth Day of December, 2012

David J. Kappos
*Director of the United States Patent and Trademark Office*